United States Patent
Shealy et al.

(10) Patent No.: US 10,979,023 B2
(45) Date of Patent: *Apr. 13, 2021

(54) 5.9 GHZ C-V2X AND DSRC ACOUSTIC WAVE RESONATOR RF FILTER CIRCUIT

(71) Applicant: Akoustis, Inc., Huntersville, NC (US)

(72) Inventors: Jeffrey B. Shealy, Cornelius, NC (US); Rohan W. Houlden, Oak Ridge, NC (US); Shawn R. Gibb, Huntersville, NC (US); Mary Winters, Webster, NY (US); Ramakrishna Vetury, Charlotte, NC (US)

(73) Assignee: AKOUSTIS, INC., Huntersville, NC (US)

( * ) Notice: Subject to any disclaimer, the term of this patent is extended or adjusted under 35 U.S.C. 154(b) by 55 days.

This patent is subject to a terminal disclaimer.

(21) Appl. No.: 16/110,950

(22) Filed: Aug. 23, 2018

(65) Prior Publication Data

US 2018/0367113 A1    Dec. 20, 2018

Related U.S. Application Data

(63) Continuation-in-part of application No. 16/020,635, filed on Jun. 27, 2018, which is a continuation-in-part
(Continued)

(51) Int. Cl.
*H03H 9/60* (2006.01)
*H01L 41/047* (2006.01)
(Continued)

(52) U.S. Cl.
CPC ......... *H03H 9/605* (2013.01); *H01L 41/0475* (2013.01); *H01L 41/081* (2013.01);
(Continued)

(58) Field of Classification Search
CPC ............ H03H 9/0095; H03H 9/02015; H03H 9/02031; H03H 9/02118; H03H 9/0523;
(Continued)

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| JP | 2009100197 A | 5/2009 |
| JP | 2010-068109 A | 3/2010 |

(Continued)

OTHER PUBLICATIONS

Q. Yang et al.; "A Wideband Bulk Acoustic Wave Filter with Modified Lattice Configuration"; 2015 IEEE MTT-S International Microwave Symposium; Date of Conference 17022 May 2015, 4 pages and 1 page IEEE Xplore Abstract. (Year: 2015).*

(Continued)

*Primary Examiner* — Barbara Summons
(74) *Attorney, Agent, or Firm* — Richard T. Ogawa; Ogawa P.C.

(57) ABSTRACT

An RF circuit device using modified lattice, lattice, and ladder circuit topologies. The devices can include four resonator devices and four shunt resonator devices. In the ladder topology, the resonator devices are connected in series from an input port to an output port while shunt resonator devices are coupled the nodes between the resonator devices. In the lattice topology, a top and a bottom serial configurations each includes a pair of resonator devices that are coupled to differential input and output ports. A pair of shunt resonators is cross-coupled between each pair of a top serial configuration resonator and a bottom serial configuration resonator. The modified lattice topology
(Continued)

adds baluns or inductor devices between top and bottom nodes of the top and bottom serial configurations of the lattice configuration. These topologies may be applied using single crystal or polycrystalline bulk acoustic wave (BAW) resonators.

29 Claims, 73 Drawing Sheets

Related U.S. Application Data of application No. 16/019,267, filed on Jun. 26, 2018, which is a continuation-in-part of application No. 15/784,919, filed on Oct. 16, 2017, now Pat. No. 10,355,659, which is a continuation-in-part of application No. 15/068,510, filed on Mar. 11, 2016, now Pat. No. 10,217,930.

(51) Int. Cl.

| | | |
|---|---|---|
| H03H 9/54 | (2006.01) | |
| H03H 9/02 | (2006.01) | |
| H01L 41/08 | (2006.01) | |
| H03H 9/58 | (2006.01) | |
| H03H 3/02 | (2006.01) | |
| H03H 3/04 | (2006.01) | |

(52) U.S. Cl.
CPC ............... H03H 3/02 (2013.01); H03H 3/04 (2013.01); H03H 9/02031 (2013.01); H03H 9/02118 (2013.01); H03H 9/542 (2013.01); H03H 9/547 (2013.01); H03H 9/587 (2013.01); H03H 9/589 (2013.01); *H03H 2003/0442* (2013.01)

(58) Field of Classification Search
CPC .... H03H 9/0533; H03H 9/1014; H03H 9/205; H03H 9/54; H03H 9/542; H03H 9/547; H03H 9/587; H03H 9/589; H03H 9/605; H03H 3/02; H03H 3/04; H03H 2003/023; H03H 2003/035; H03H 2003/0442; H01L 41/0475; H01L 41/081
USPC .......................................................... 333/189
See application file for complete search history.

(56) References Cited

U.S. PATENT DOCUMENTS

| | | | |
|---|---|---|---|
| 6,051,907 A | 4/2000 | Yulammi | |
| 6,114,635 A | 9/2000 | Lakin et al. | |
| 6,262,637 B1 | 7/2001 | Bradley et al. | |
| 6,349,454 B1* | 2/2002 | Manfra | H03H 3/02 29/25.35 |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,933,807 B2 | 3/2005 | Markstener et al. | |
| 6,879,224 B2 | 4/2005 | Frank | |
| 6,909,340 B2 | 6/2005 | Aigner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 2003/0128081 A1* | 7/2003 | Ella | H03H 9/0095 333/133 |
| 2005/0218754 A1* | 10/2005 | Yokoyama | H03H 3/04 310/328 |
| 2005/0219012 A1 | 10/2005 | Milsom et al. | |
| 2005/0255234 A1 | 11/2005 | Nanda et al. | |
| 2006/0244553 A1* | 11/2006 | Yokoyama | H03H 3/04 333/191 |
| 2007/0080611 A1 | 4/2007 | Yamada et al. | |
| 2008/0024042 A1 | 1/2008 | Isobe et al. | |
| 2008/0284541 A1 | 11/2008 | Chitinis | |
| 2009/0033177 A1 | 2/2009 | Itaya et al. | |
| 2011/0114968 A1 | 5/2011 | Sheppard et al. | |
| 2011/0298564 A1 | 12/2011 | Iwashita Kazuki et al. | |
| 2012/0182092 A1* | 7/2012 | Yokoyama | H03H 3/04 333/195 |
| 2012/0287575 A1 | 11/2012 | Nelson | |
| 2013/0176086 A1 | 7/2013 | Bradley et al. | |
| 2014/0125432 A1* | 5/2014 | Stephanou | H03H 3/02 333/188 |
| 2014/0132117 A1 | 5/2014 | Larson, III | |
| 2015/0097638 A1 | 4/2015 | Yu et al. | |
| 2015/0357993 A1 | 12/2015 | Shealy | |
| 2016/0028367 A1 | 1/2016 | Shealy | |
| 2016/0036580 A1 | 2/2016 | Shealy | |
| 2017/0264256 A1 | 9/2017 | Gibb et al. | |
| 2018/0013405 A1 | 1/2018 | Takata | |
| 2018/0054176 A1 | 2/2018 | Kim et al. | |
| 2018/0138885 A1 | 5/2018 | Stokes et al. | |
| 2018/0278231 A1* | 9/2018 | Hurwitz | H03H 3/02 |
| 2018/0309422 A1* | 10/2018 | Shealy | H03H 9/605 |
| 2018/0309425 A1* | 10/2018 | Shealy | H03H 9/1014 |
| 2019/0007029 A1* | 1/2019 | Ishida | H03H 9/02015 |
| 2019/0020327 A1* | 1/2019 | Shealy | H03H 9/564 |
| 2019/0068164 A1* | 2/2019 | Houlden | H03H 9/02015 |
| 2019/0081611 A1 | 3/2019 | Vetury et al. | |
| 2019/0199316 A1* | 6/2019 | Houlden | H03H 3/02 |
| 2019/0229705 A1* | 7/2019 | Dasgupta | H01L 27/20 |
| 2019/0326885 A1* | 10/2019 | Houlden | H03H 9/205 |
| 2019/0341906 A1* | 11/2019 | Houlden | H03H 9/13 |
| 2019/0372549 A1* | 12/2019 | Houlden | H03H 9/02015 |

FOREIGN PATENT DOCUMENTS

| | | |
|---|---|---|
| KR | 20120023285 A | 3/2012 |
| WO | 2005034349 A1 | 4/2005 |
| WO | 2016122877 A1 | 8/2016 |
| WO | WO2017171856 A1 | 5/2017 |
| WO | WO2017222990 A1 | 12/2017 |

OTHER PUBLICATIONS

C.-M. Yang et al.; "Highly C-Axis-Oriented Ain Film Using MOCVD for 5 GHz-Band FBAR Filter"; 2003 IEEE Ultrasonics Symposium; 2003, pp. 170-173. (Year: 2003).*
T. Nishihara et al.; "High Performance and Miniature Thin Film Bulk Acoustic Wave Filters for 5 GHz"; 2002 IEEE Ultrasonics Symposium; 2002, pp. 969-972 (Year: 2002).*
Z. Zhang et al.; "A High Performance C-Band Fbar Filter"; IEEE 2013 Asia-Pacific Microwave Conference Proceedings; 2013, pp. 923-926. (Year: 2013).*
Y.-D. Kim et al.; "Highly Miniaturized RF Bandpass Filter Based on Thin-Film bulk Acoustic-Wave Resonator for 5-GHz-Band Application"; IEEE Transactions on Microwave Theory and Techniques, vol. 54, No. 3, Mar. 2006, pp. 1218-1228. (Year: 2006).*
A. Muller et al.; "6.3-GHz Film Bulk Acoustic Resonator Structures Based on a Gallium Nitride/Silicon Thin Membrane"; IEEE Electron Device Letters, vol. 30, No. 8, Aug. 2009, pp. 799-801. (Year: 2009).*
M. Hara et al.; "X-Band Filters Utilizing AlN Thin film Bulk Acoustic Resonators"; 2007 IEEE Ultrasonics Symposium; 2007, pp. 1152-1155. (Year: 2007).*
T. Yokoyama et al.; "K-band Ladder Filters Employing Air-Gap type Thin Film Bulk Acoustic Resonators"; 2008 IEEE International Ultrasonics Symposium Proceedings; 2008, pp. 598-601. (Year: 2008).*

(56) References Cited

OTHER PUBLICATIONS

International Search Report and Written Opinion for PCT/US2018/050521 dated Jan. 28, 2019.
International Search Report and Written Opinion for PCT/US2019/040729, dated Oct. 22, 2019.
International Search Report and Written Opinion for PCT/US2019/048412, dated Nov. 19, 2019.
International Search Report issued in related application No. PCT/US2019/018550 dated May 30, 2019.
International Search Report for PCT/US2015/034560, dated Sep. 18, 2015.
International Search Report for PCT/US2020/023008 dated Dec. 3, 2020.

* cited by examiner

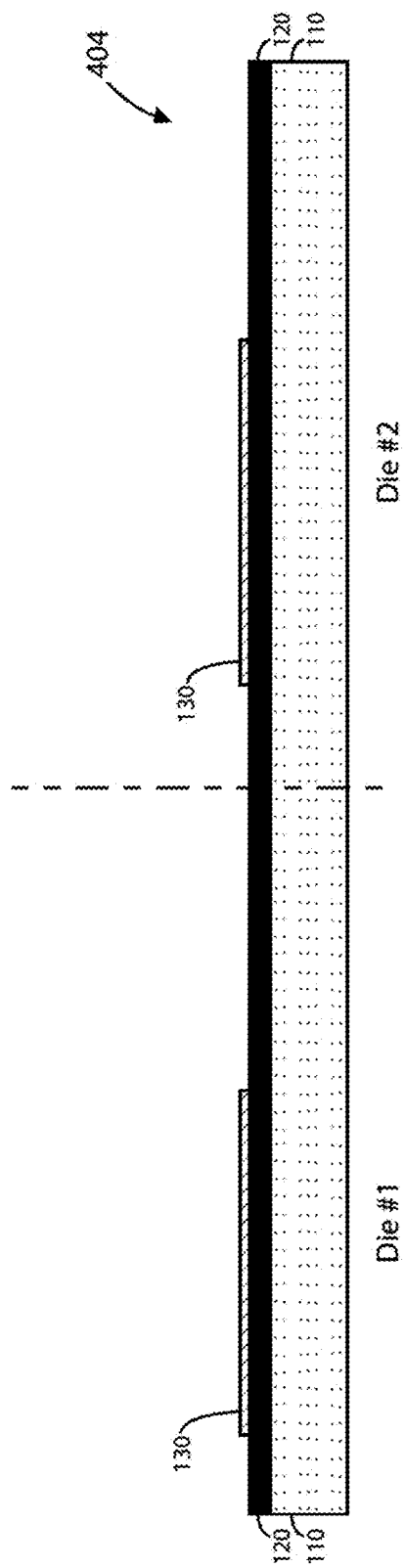
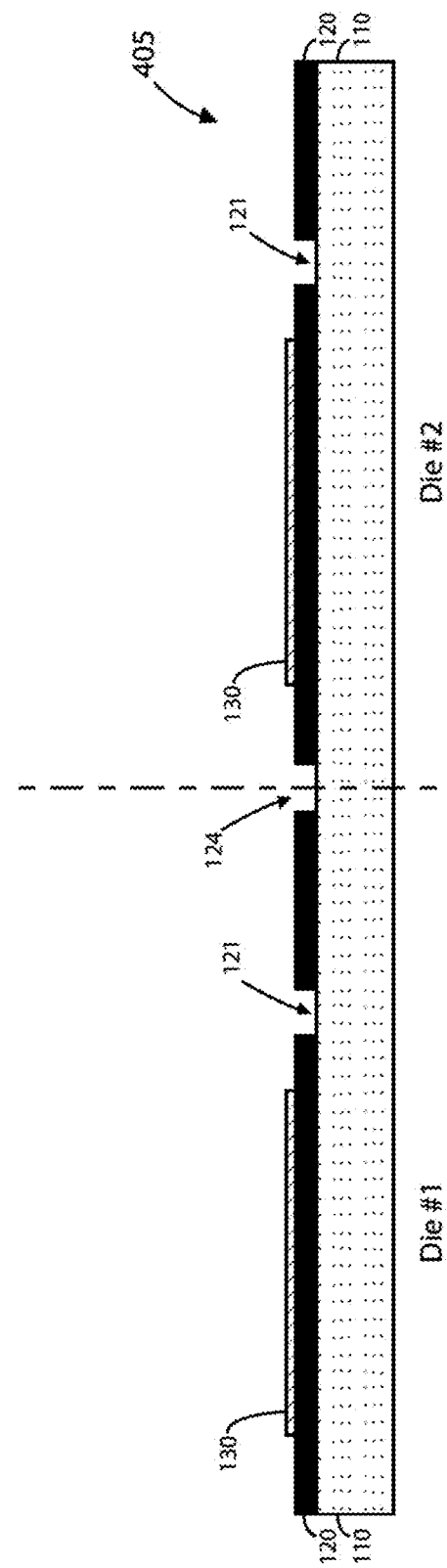

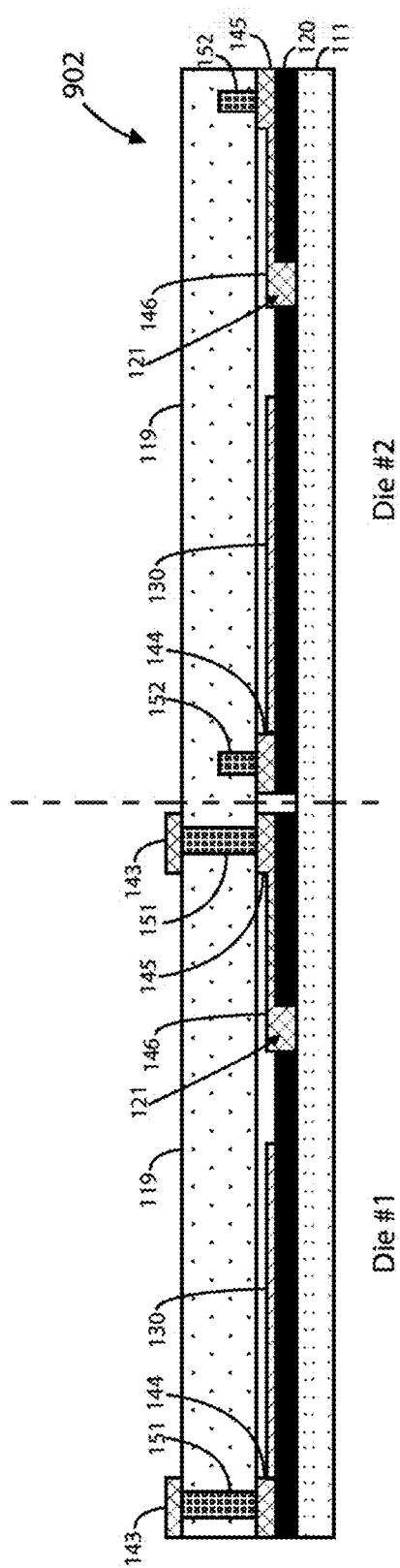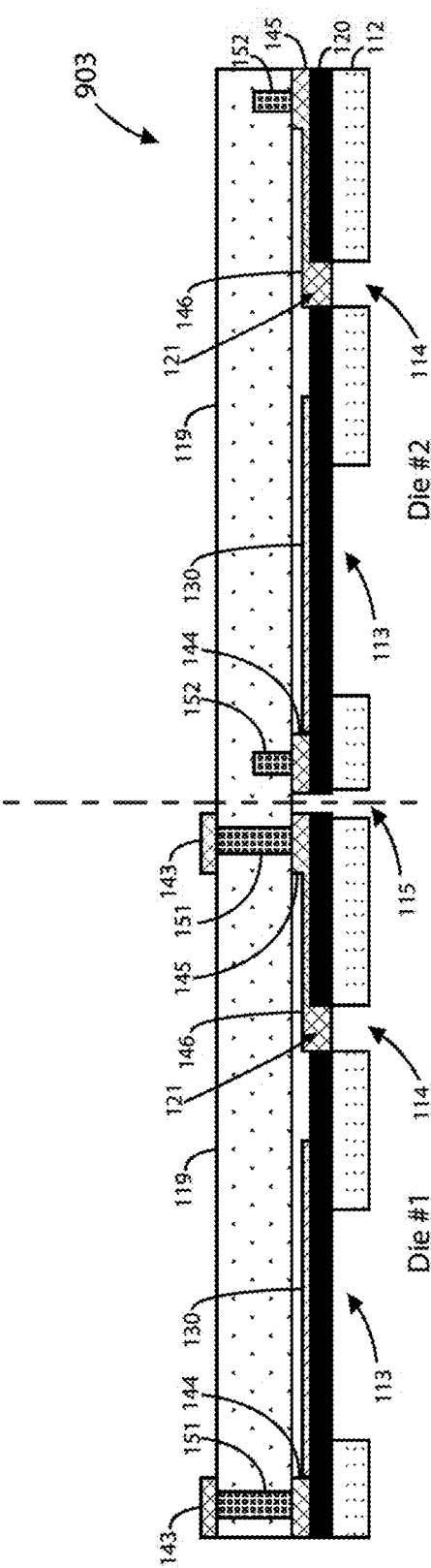
FIG. 9B
FIG. 9C

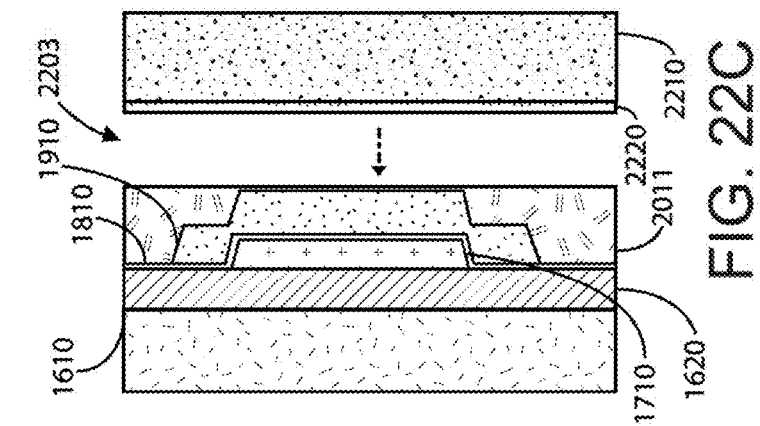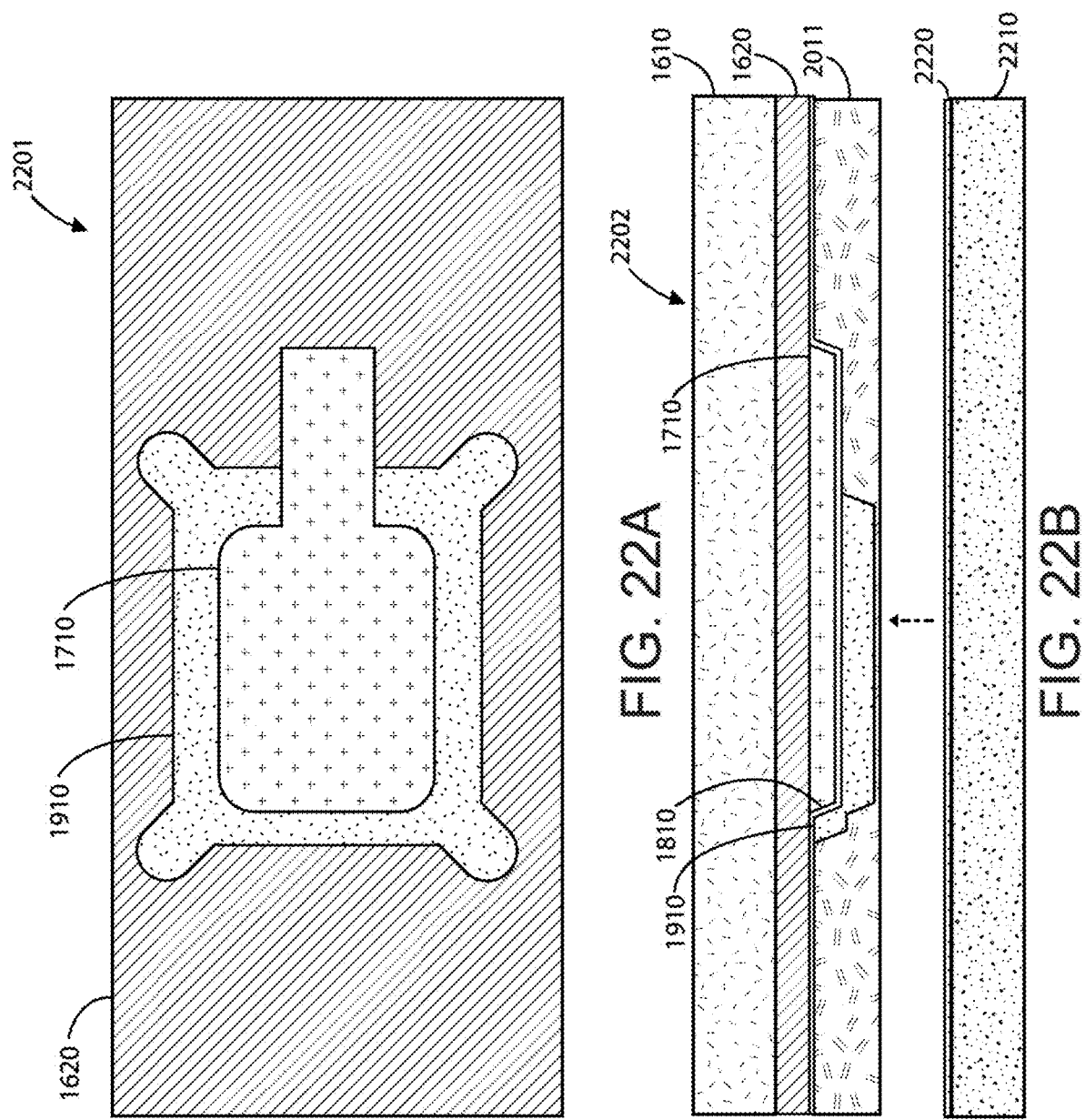

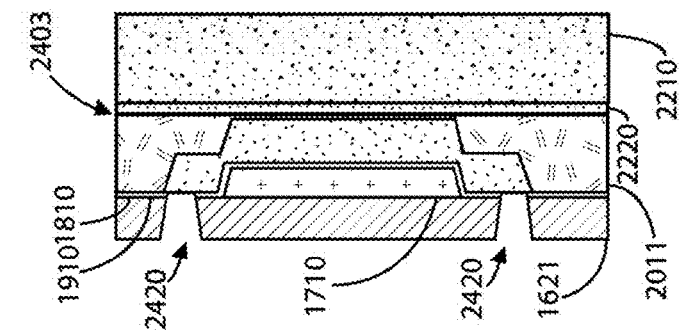
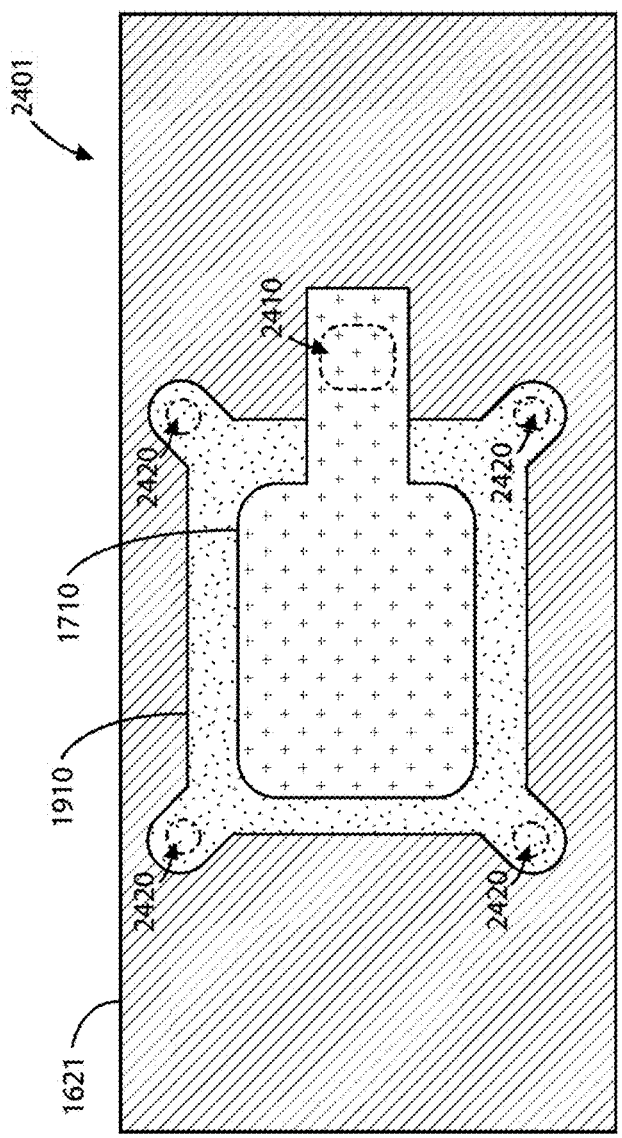
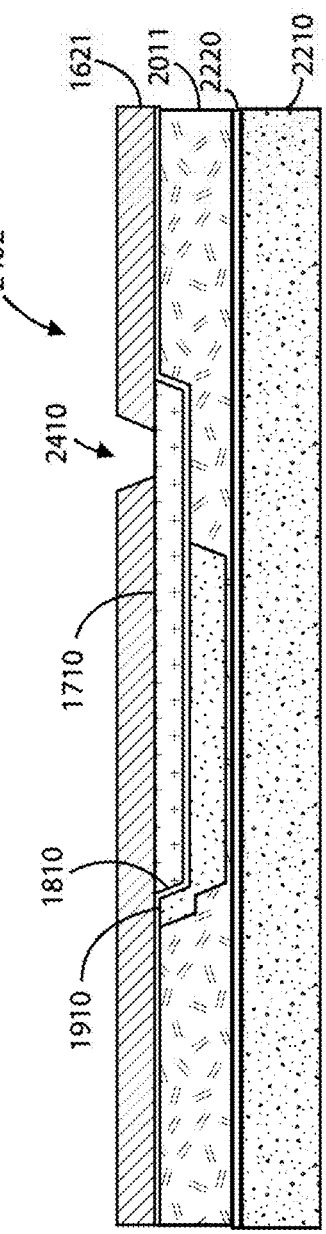
FIG. 24A
FIG. 24B
FIG. 24C

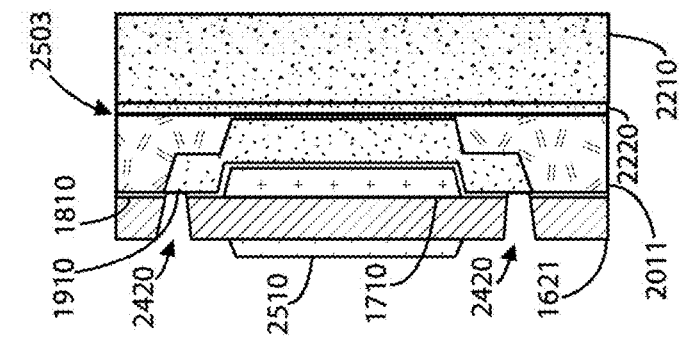
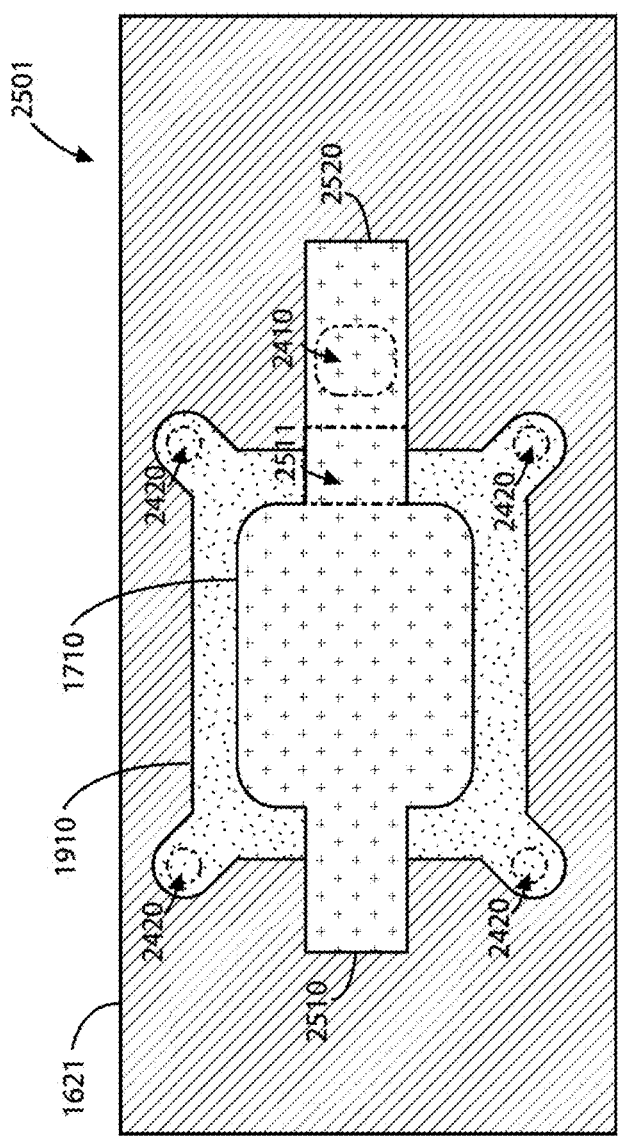
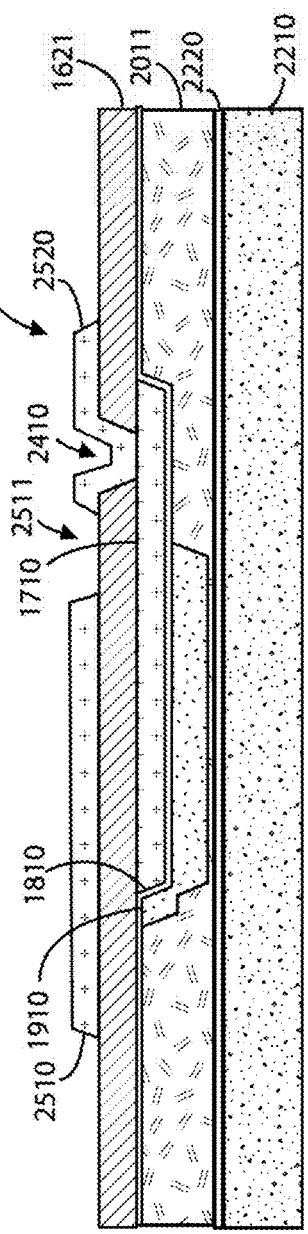
FIG. 25A
FIG. 25B
FIG. 25C

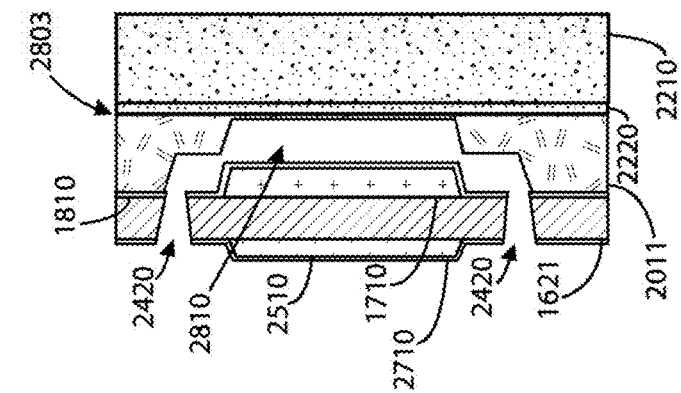
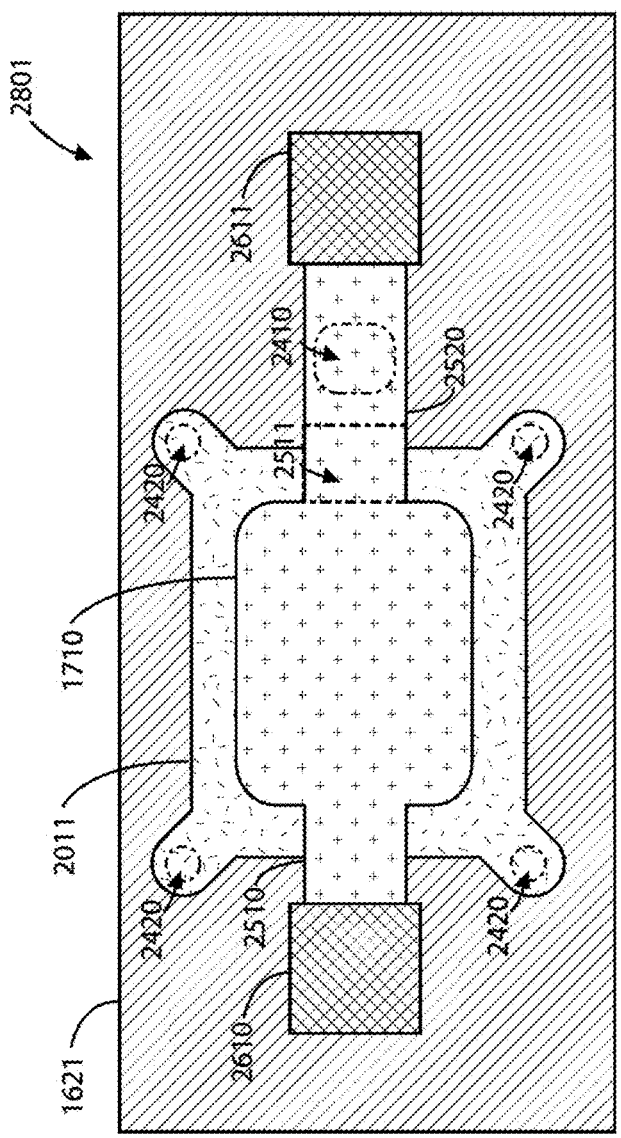
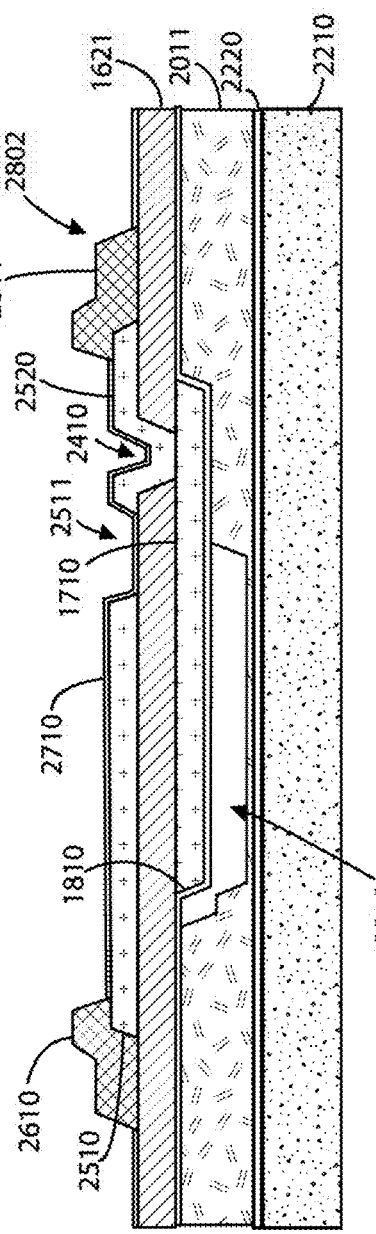
FIG. 28C
FIG. 28A
FIG. 28B

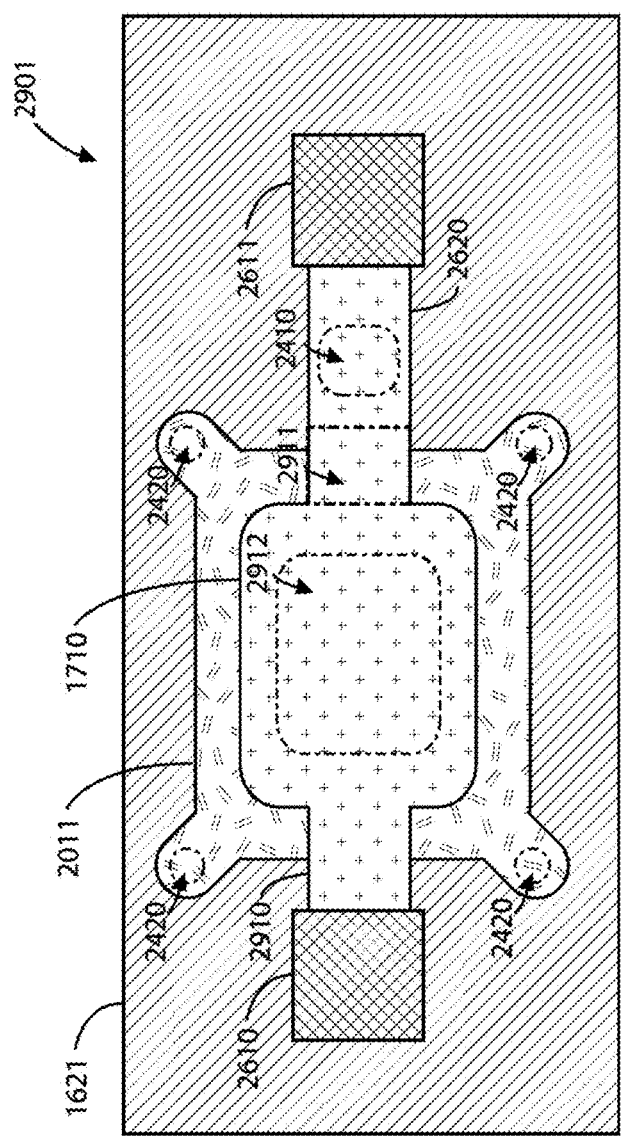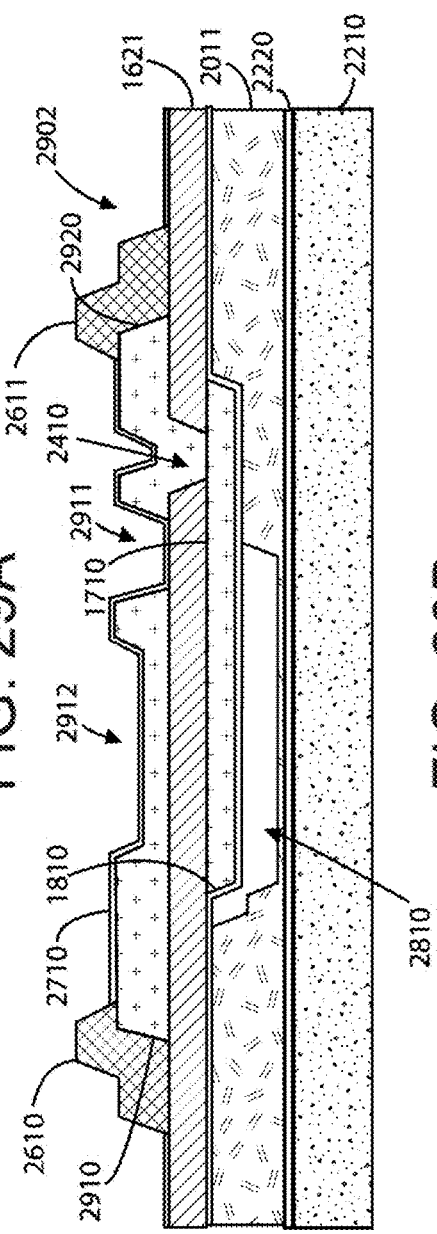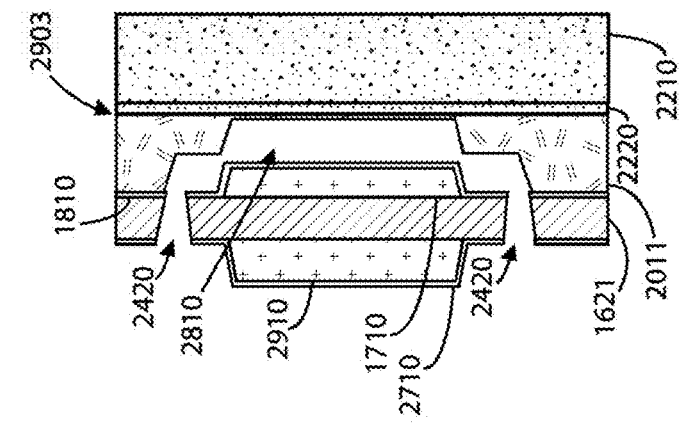

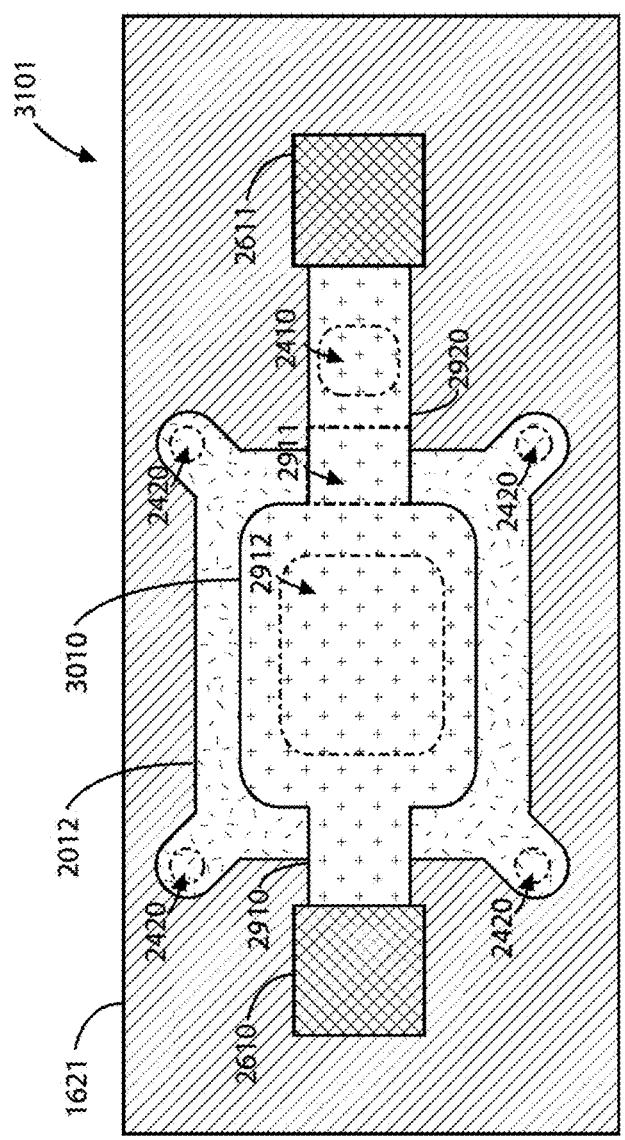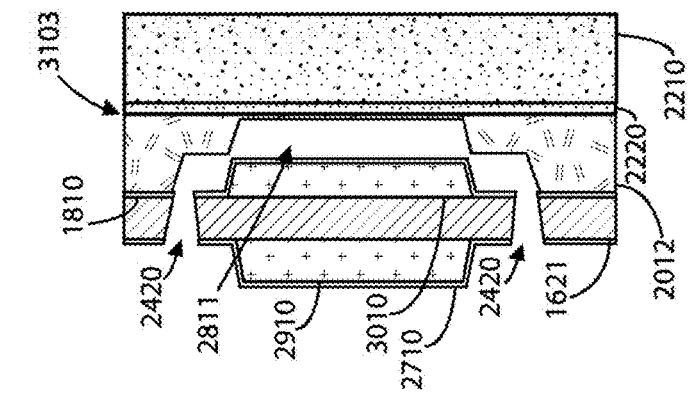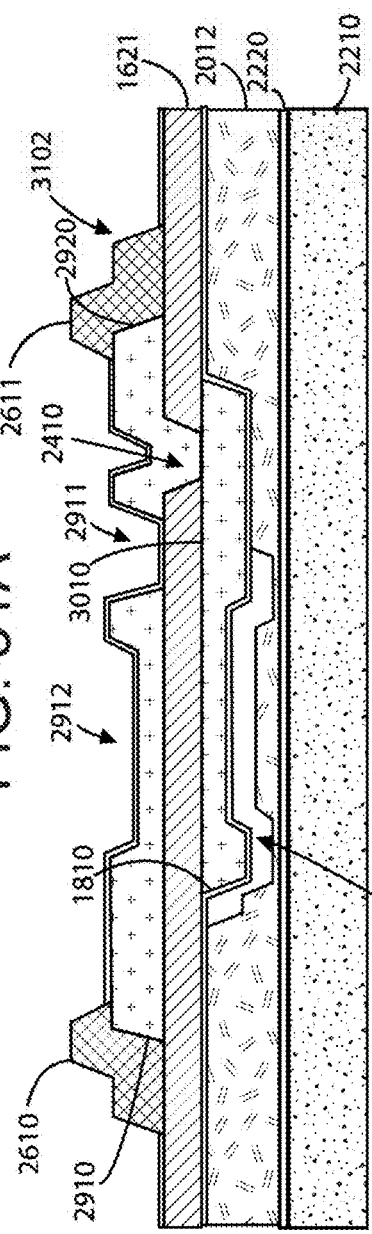
FIG. 31A
FIG. 31B
FIG. 31C

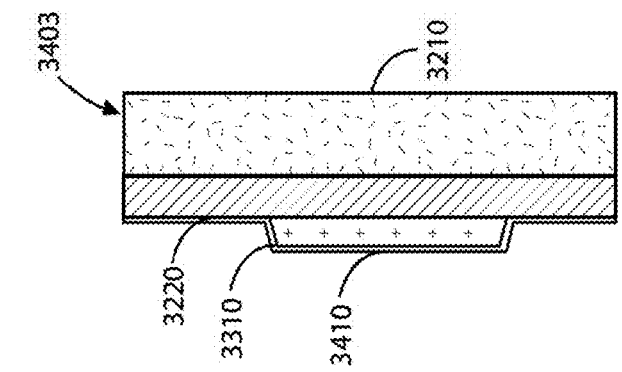
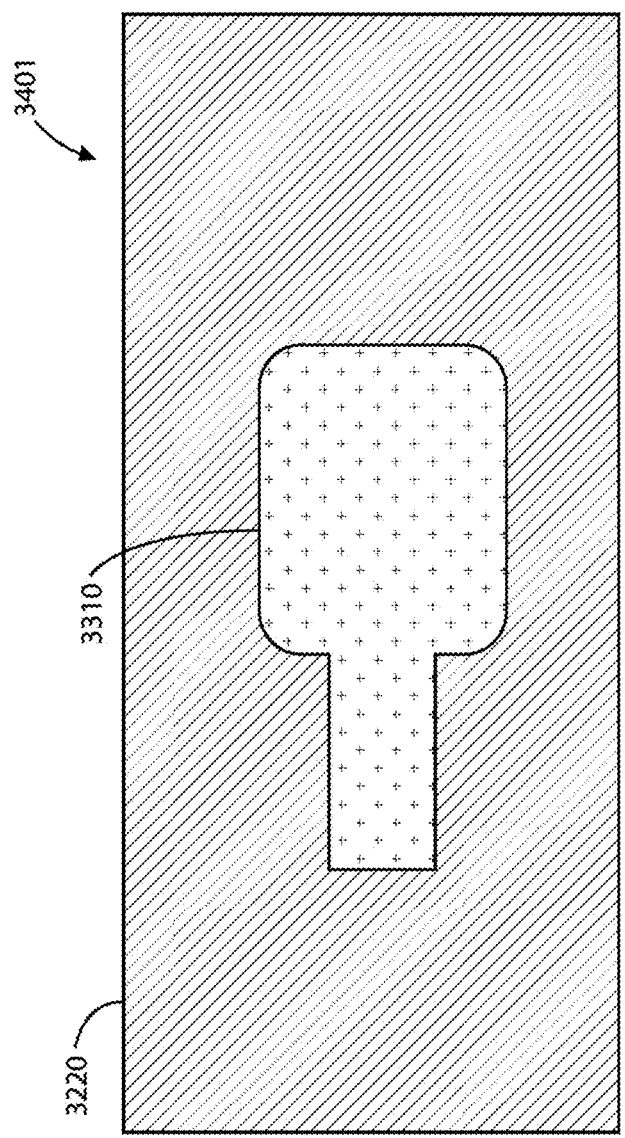
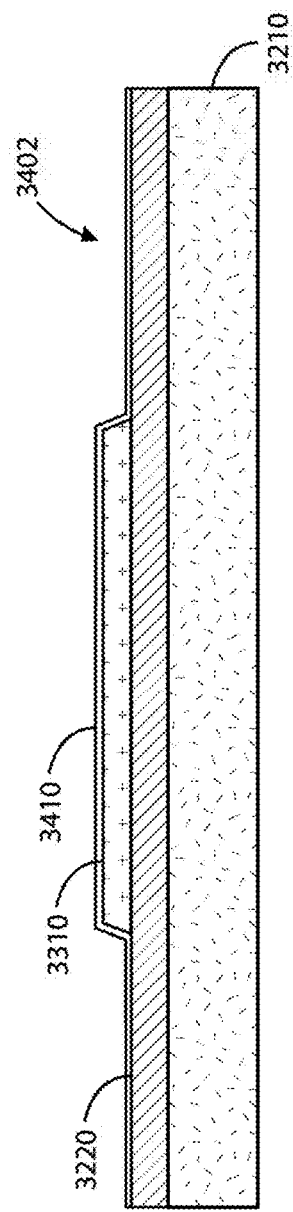
FIG. 34C
FIG. 34A
FIG. 34B

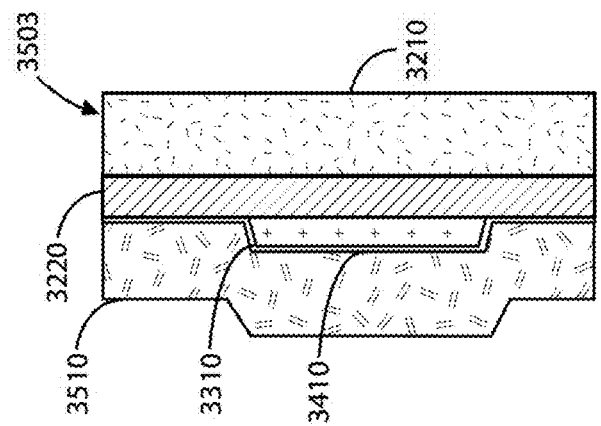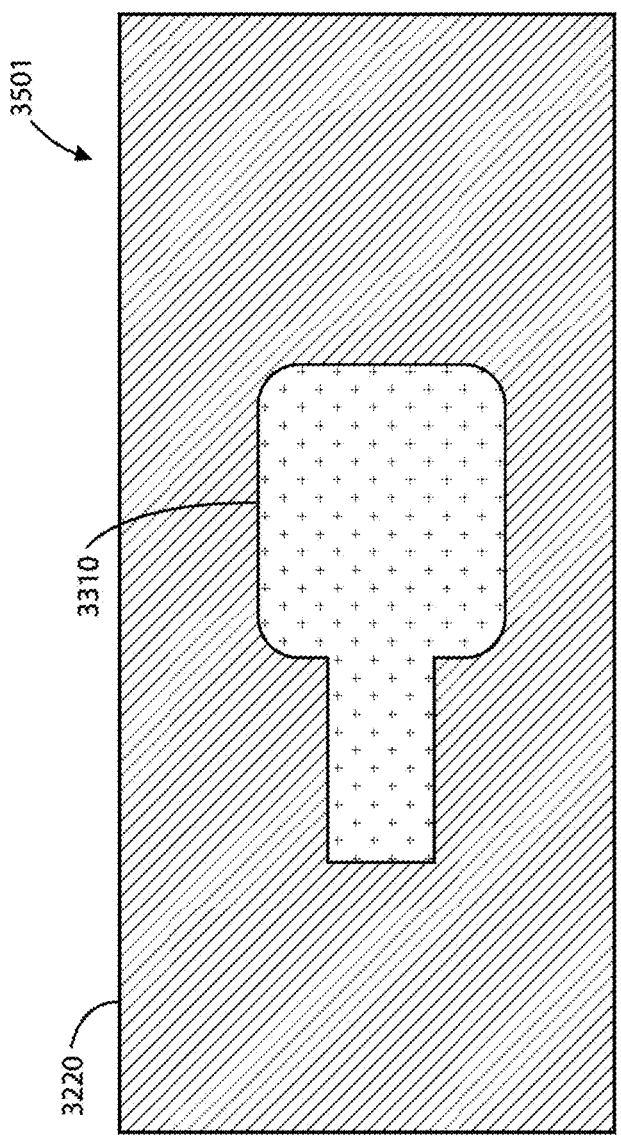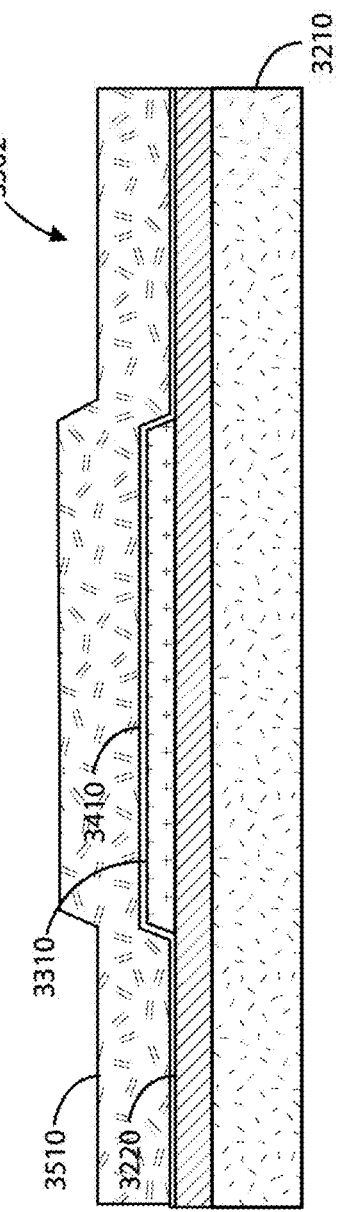

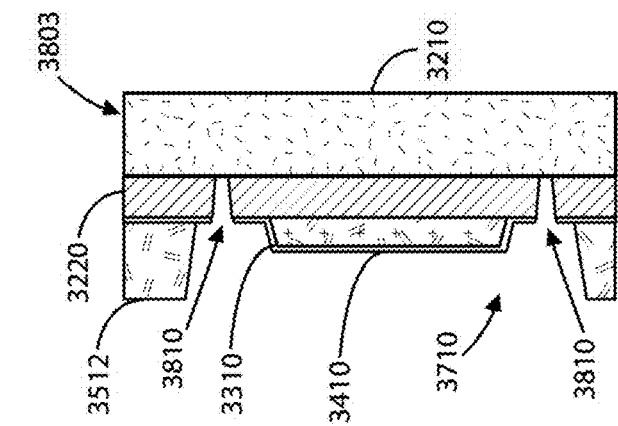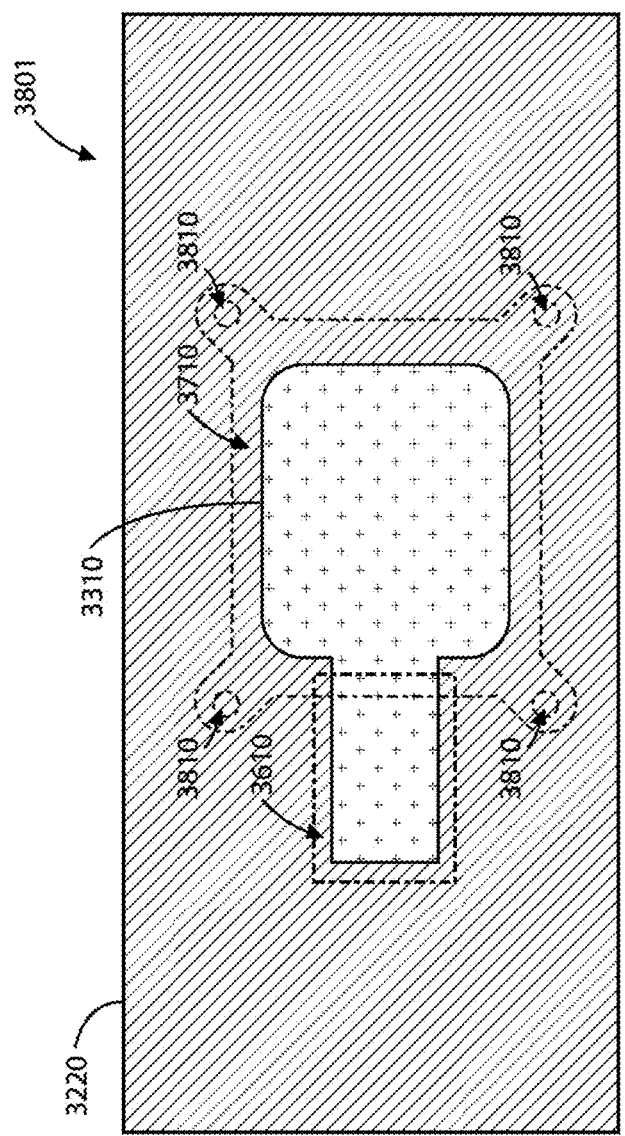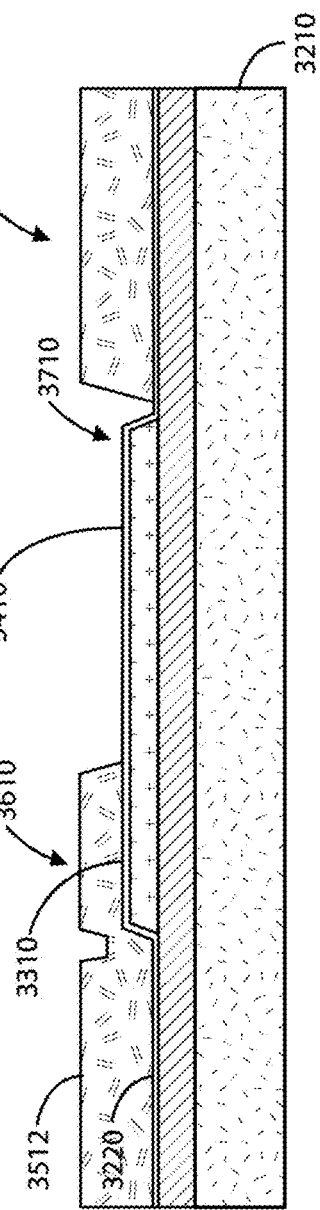
FIG. 38C
FIG. 38A
FIG. 38B

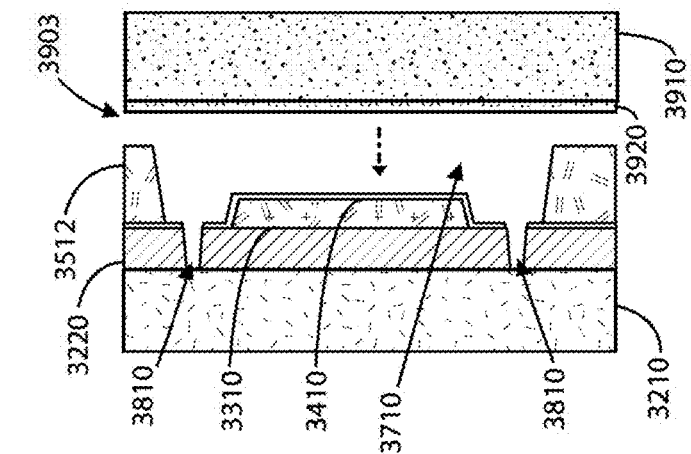
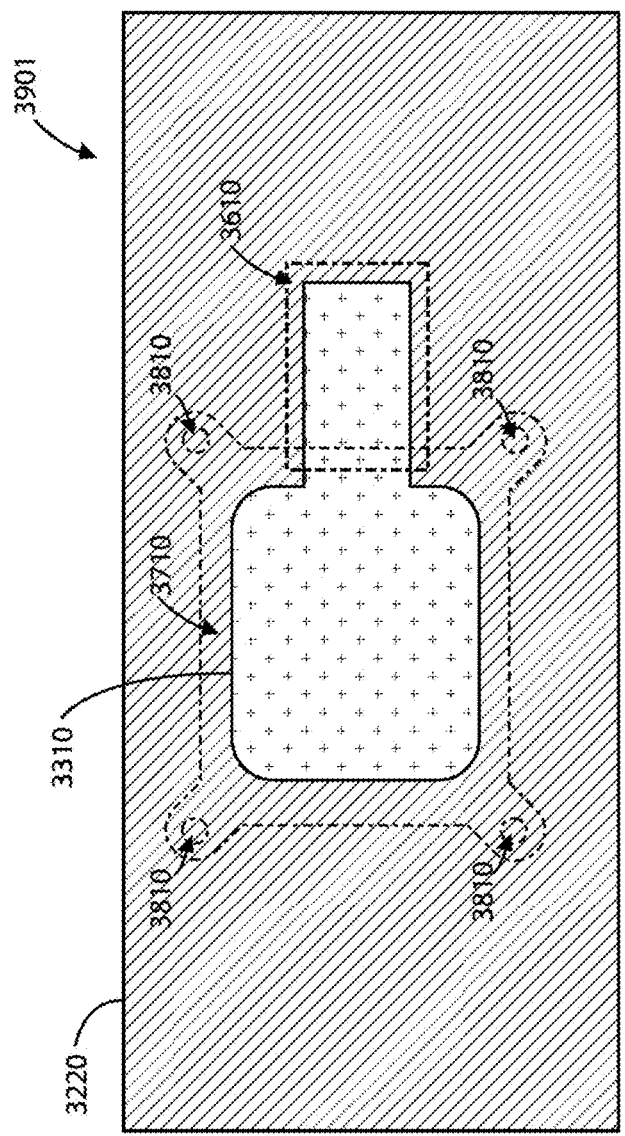
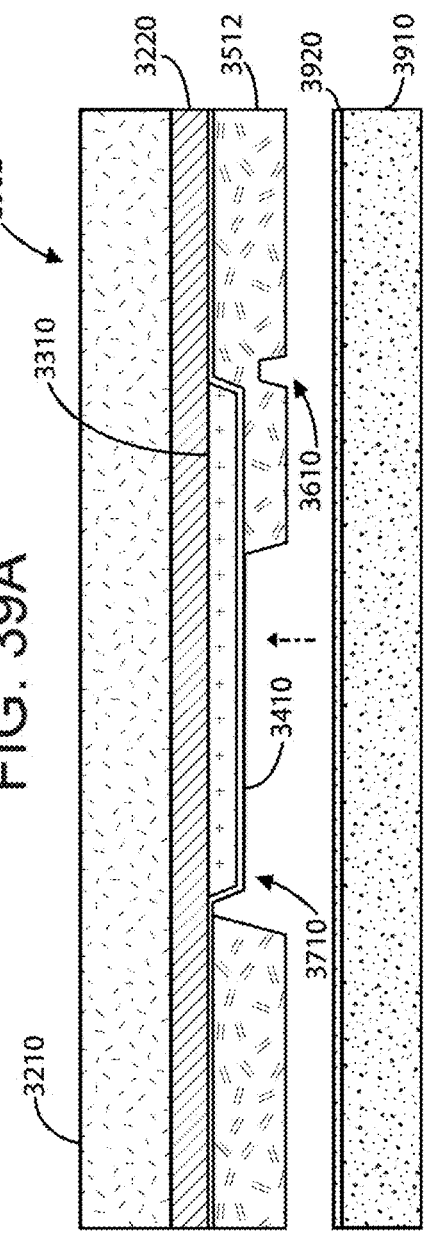
FIG. 39A
FIG. 39B
FIG. 39C

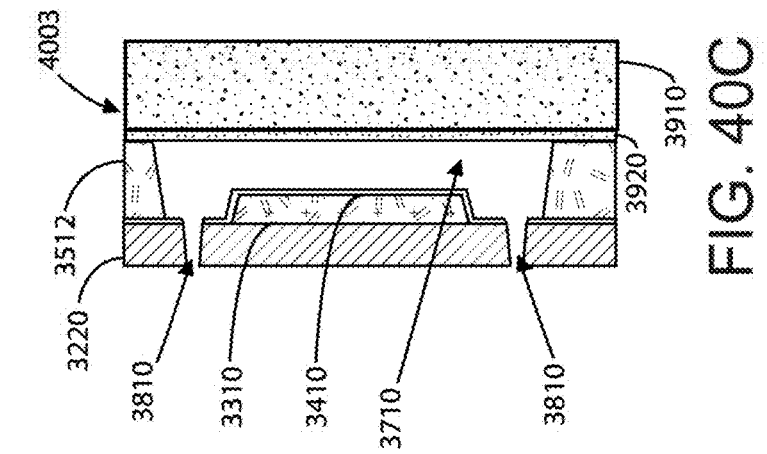
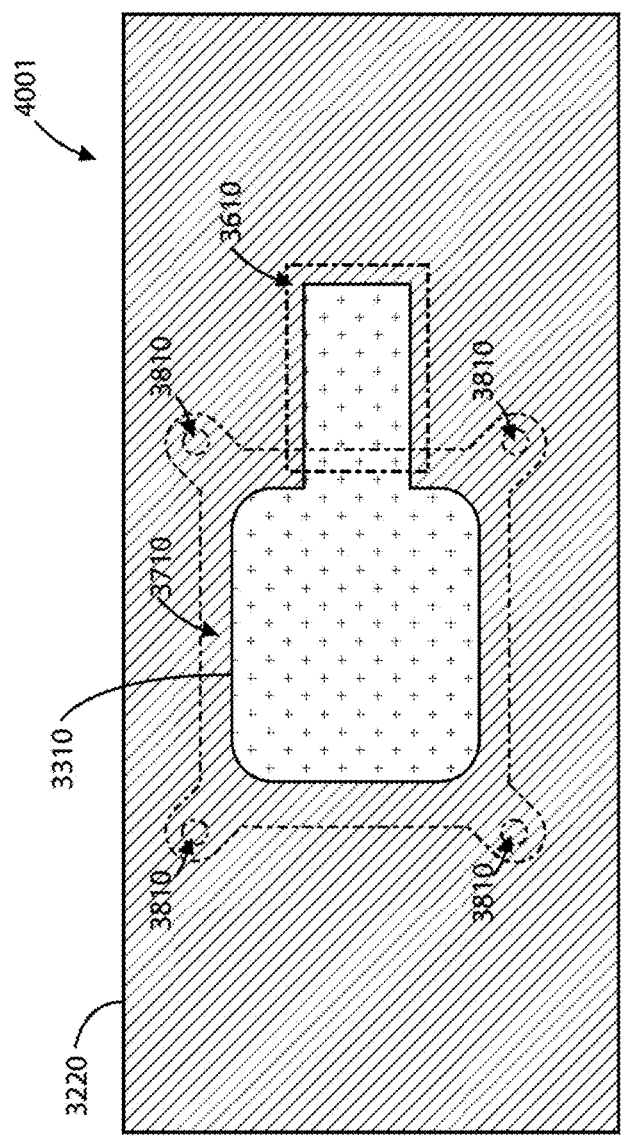
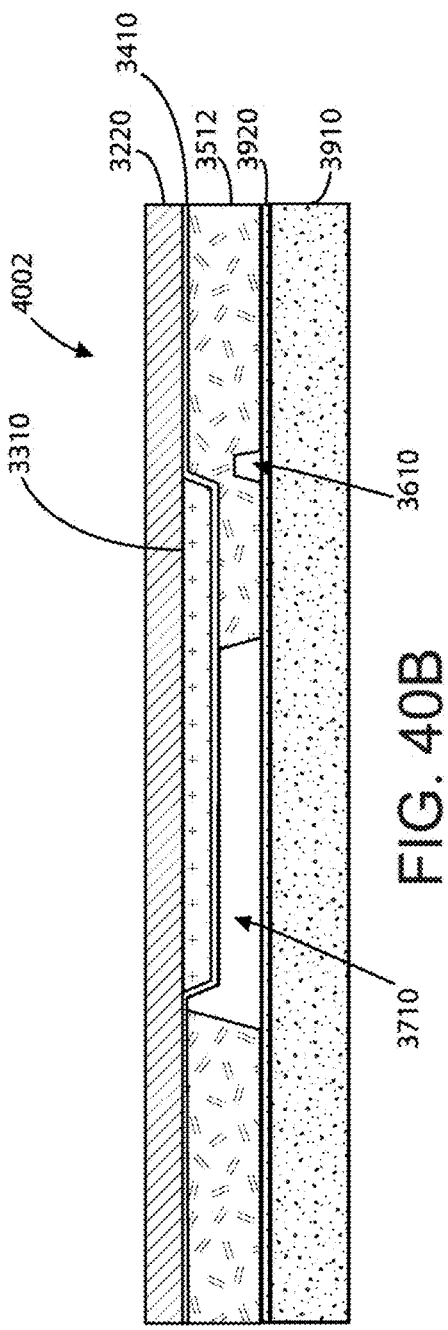

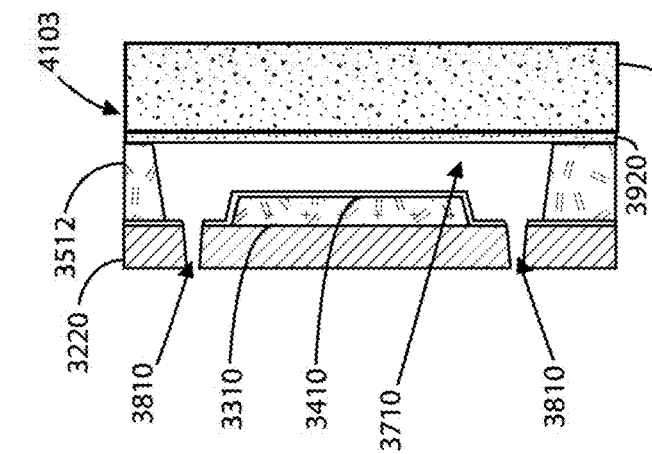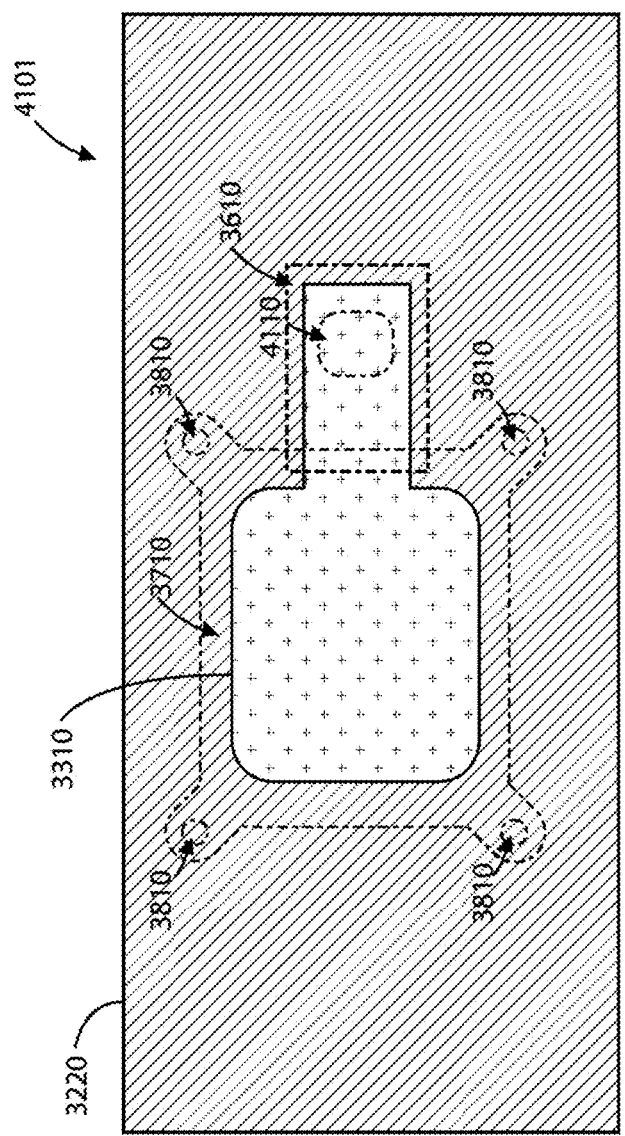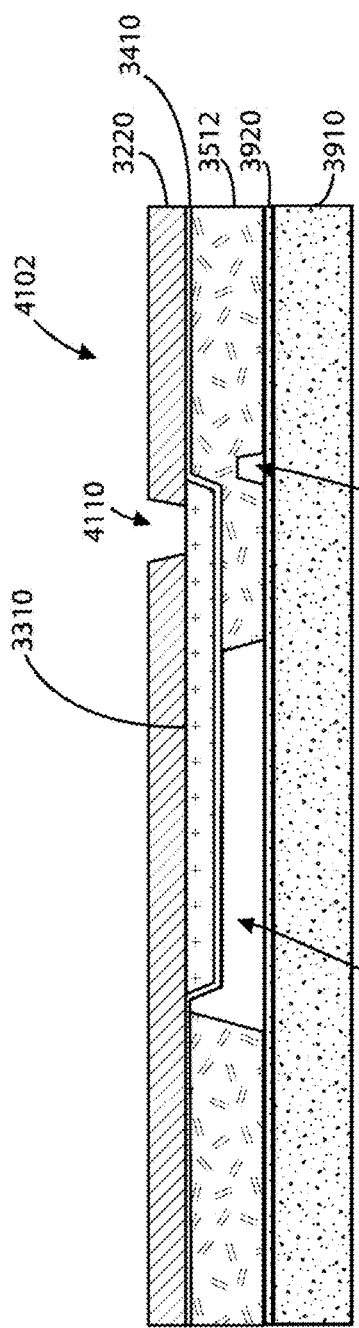

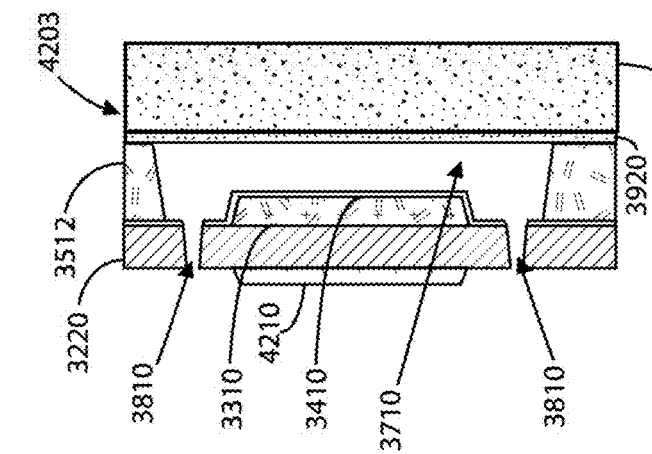
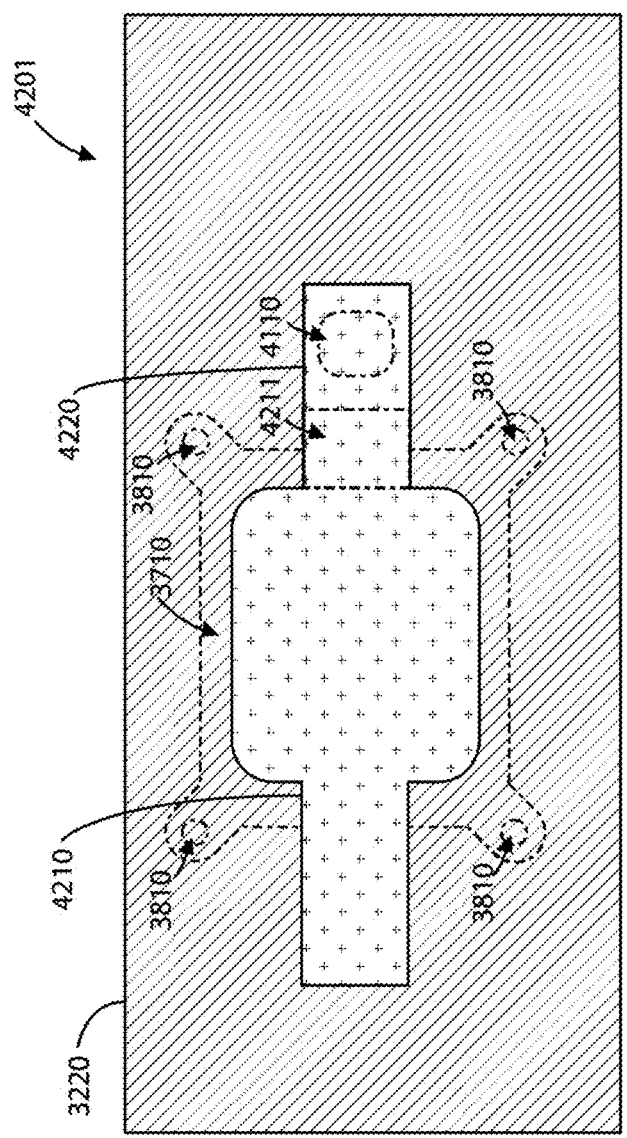
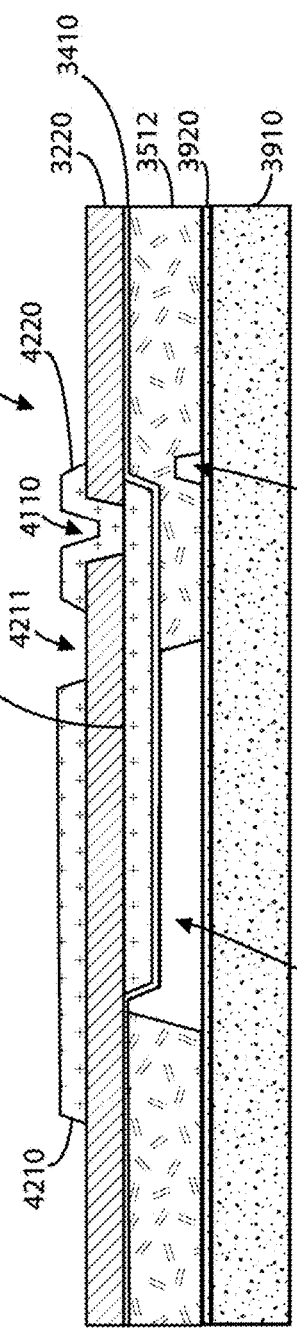
FIG. 42A
FIG. 42B
FIG. 42C

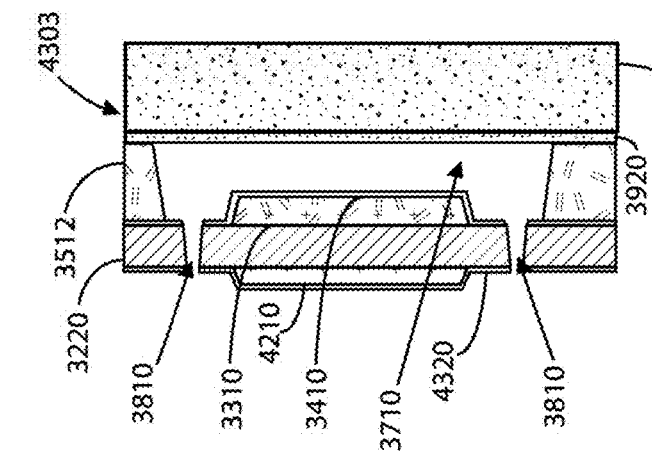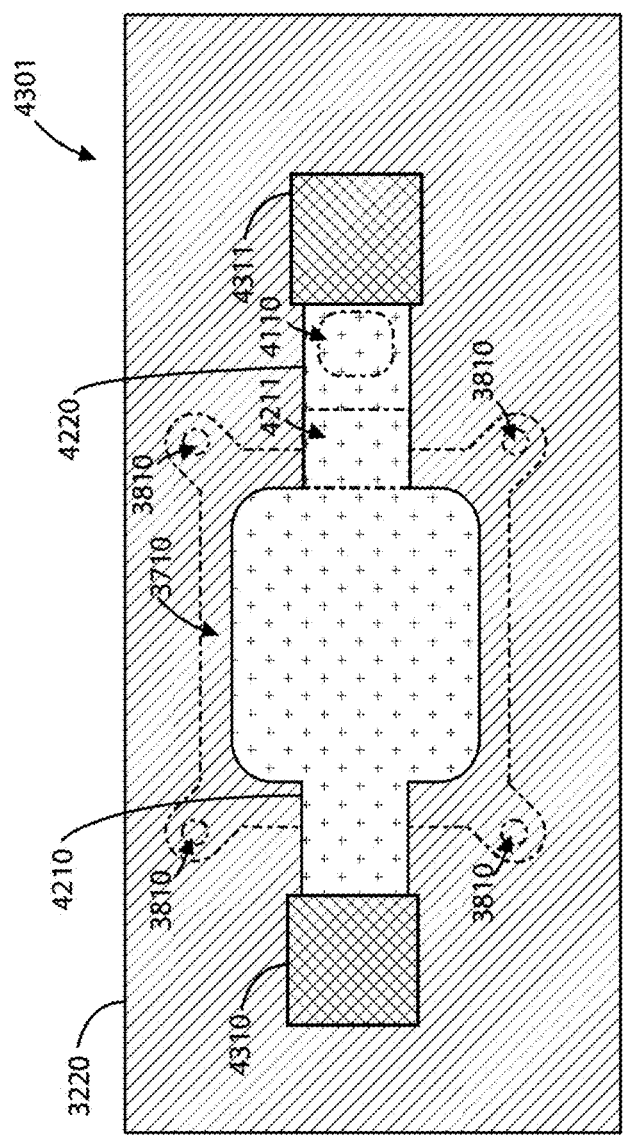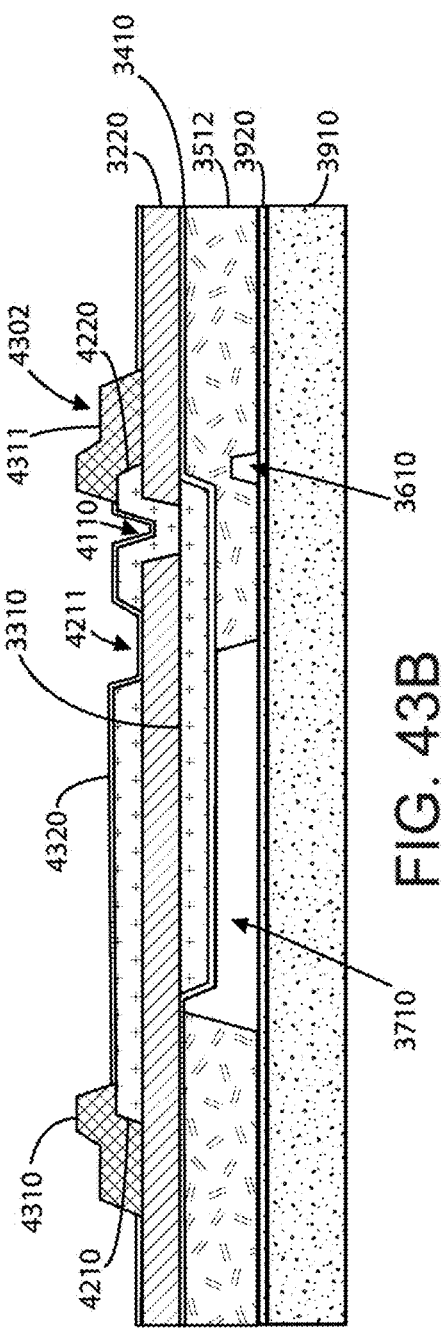

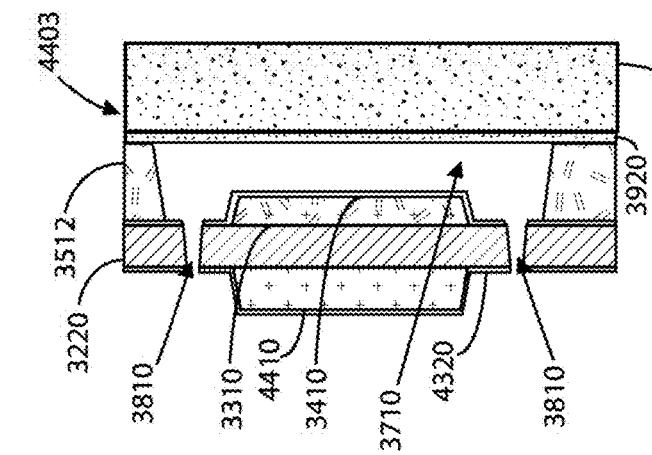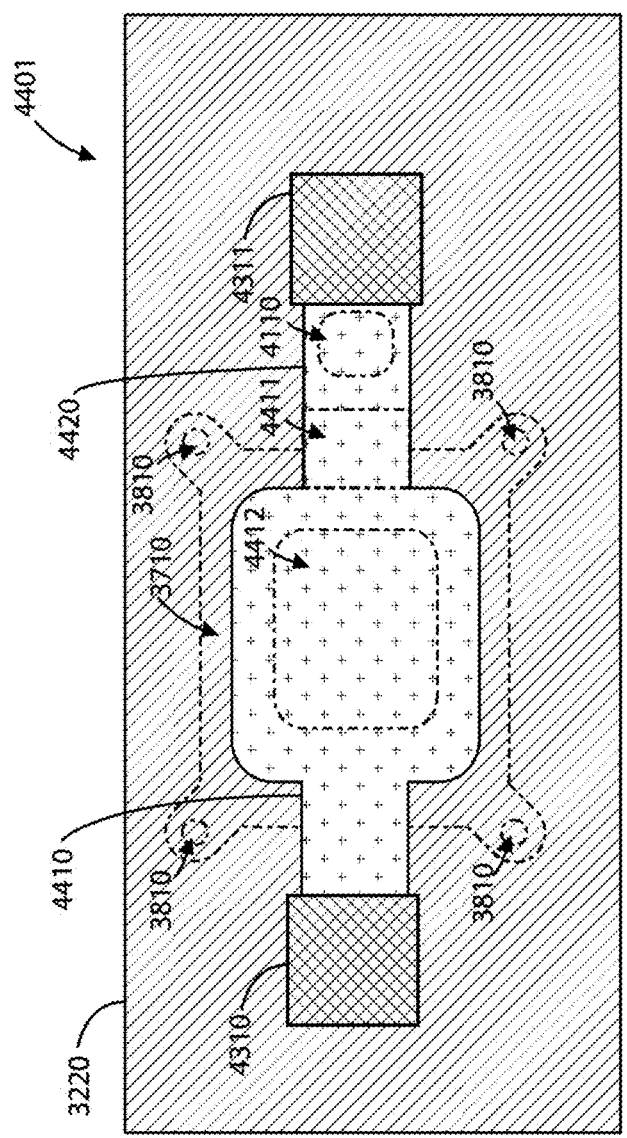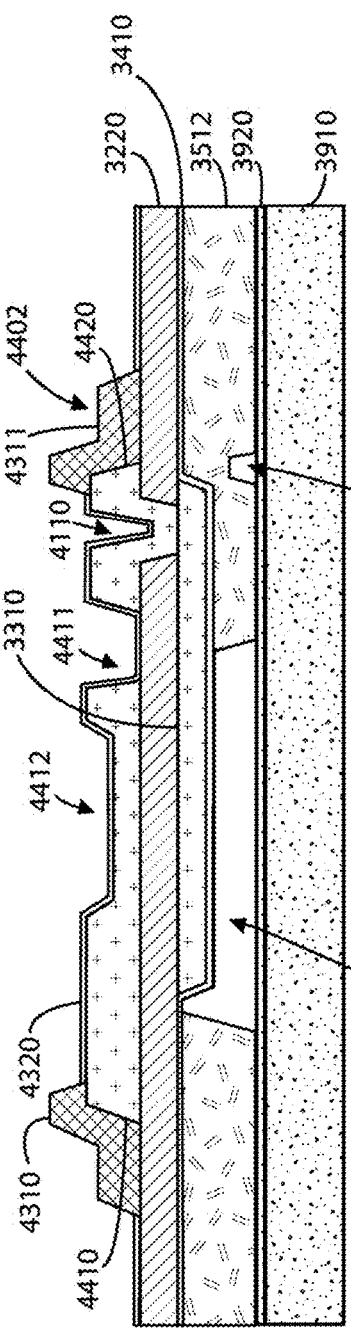
FIG. 44A
FIG. 44B
FIG. 44C

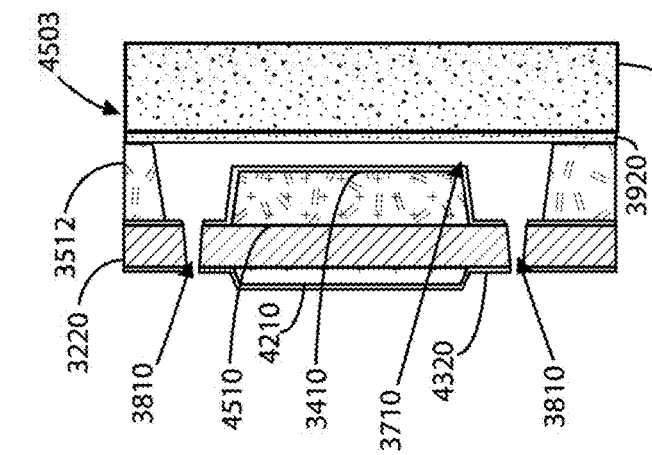
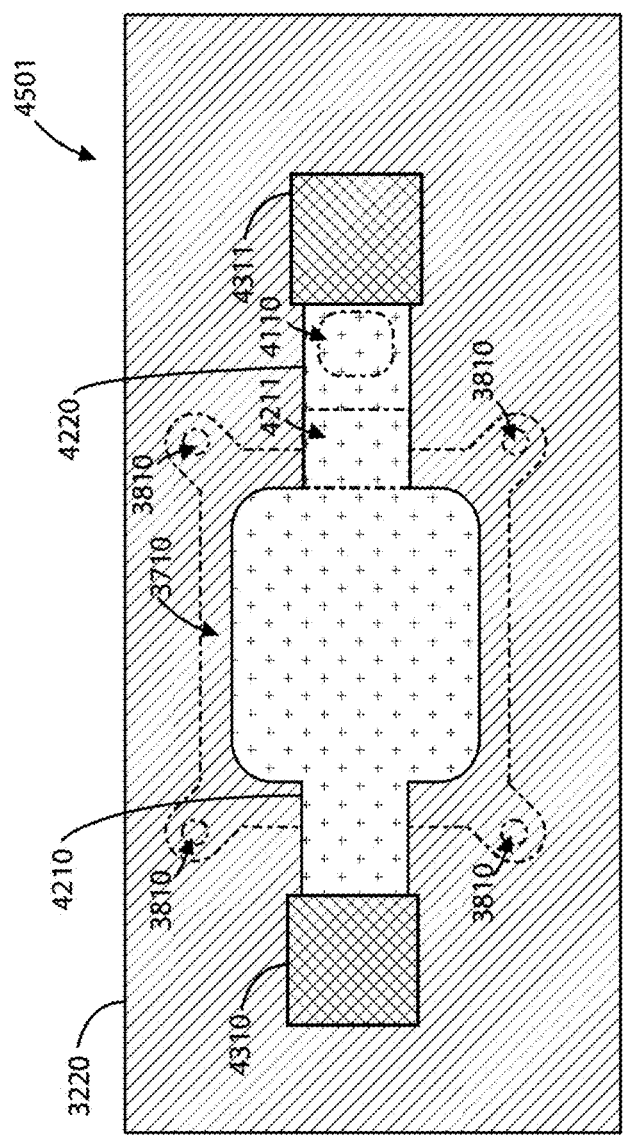
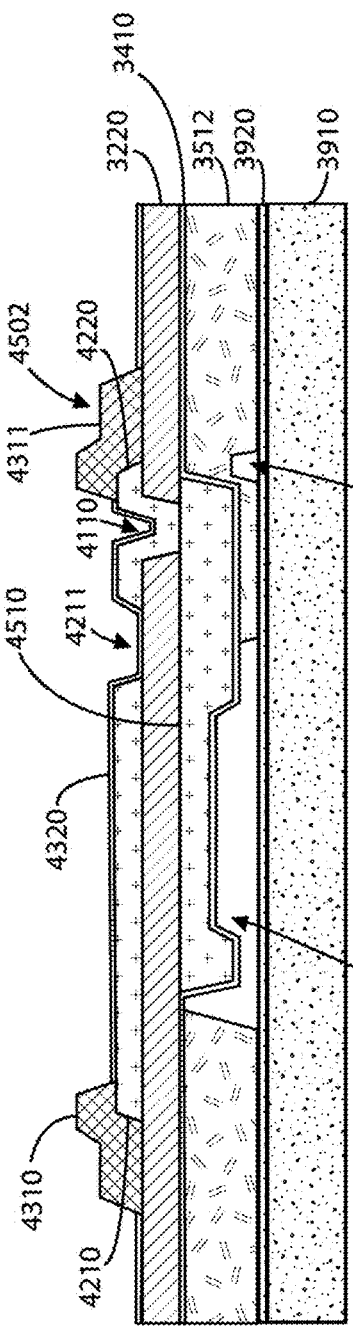
FIG. 45A
FIG. 45B
FIG. 45C

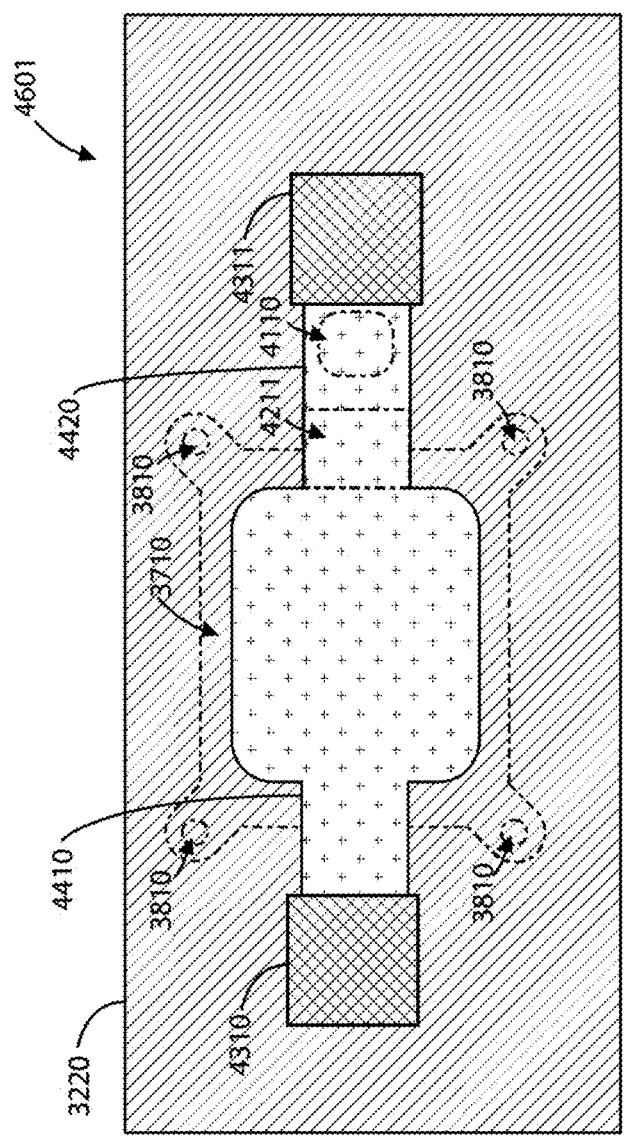
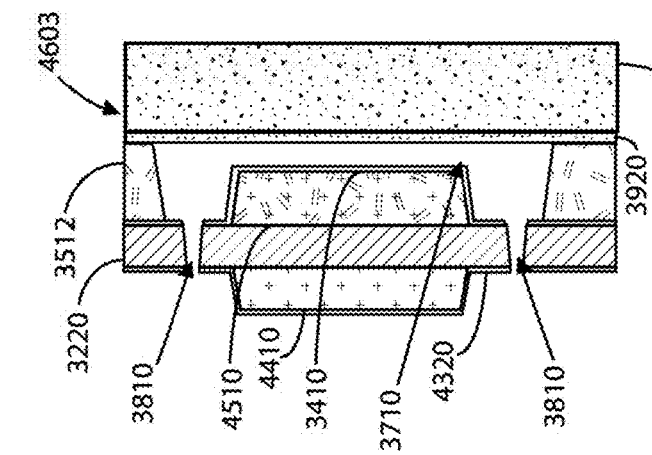
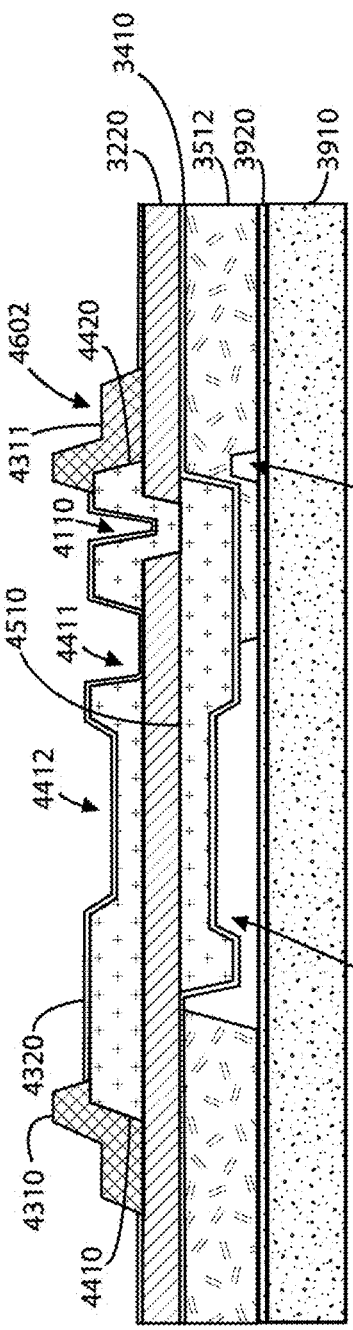
FIG. 46A
FIG. 46B
FIG. 46C

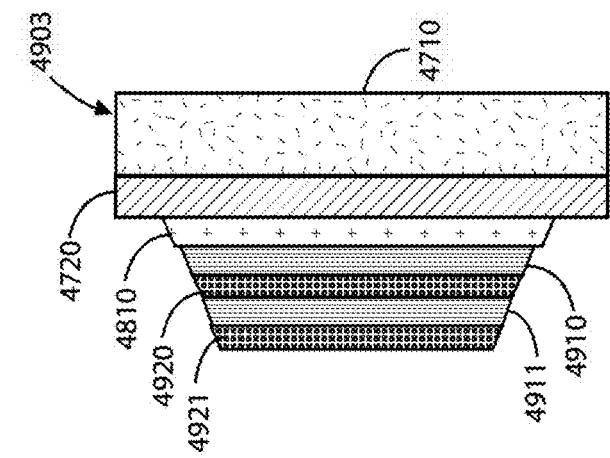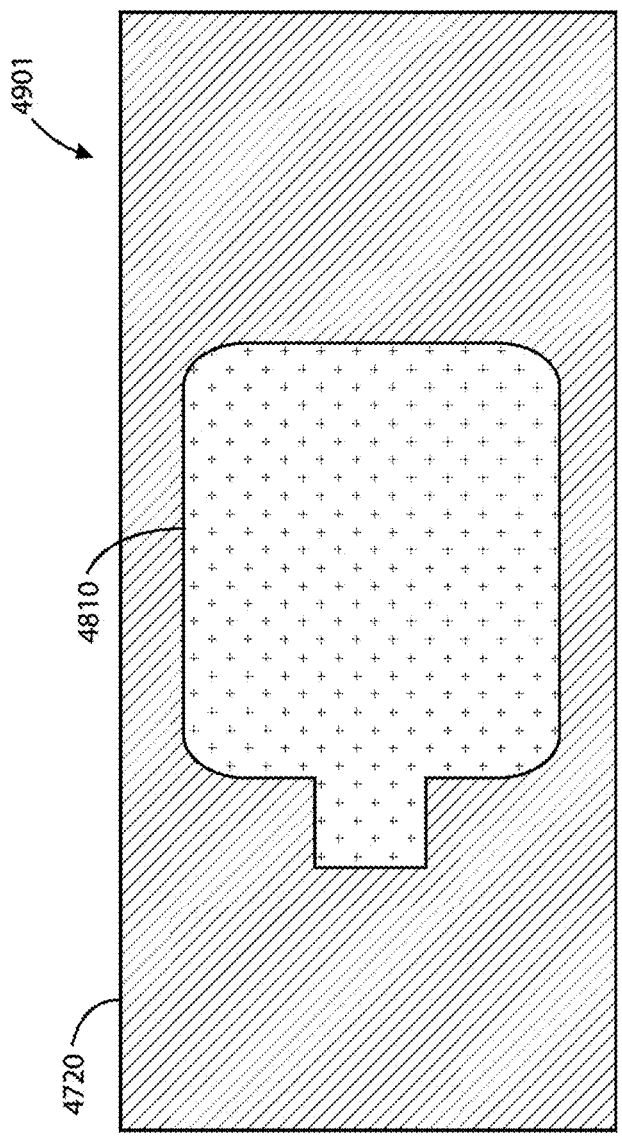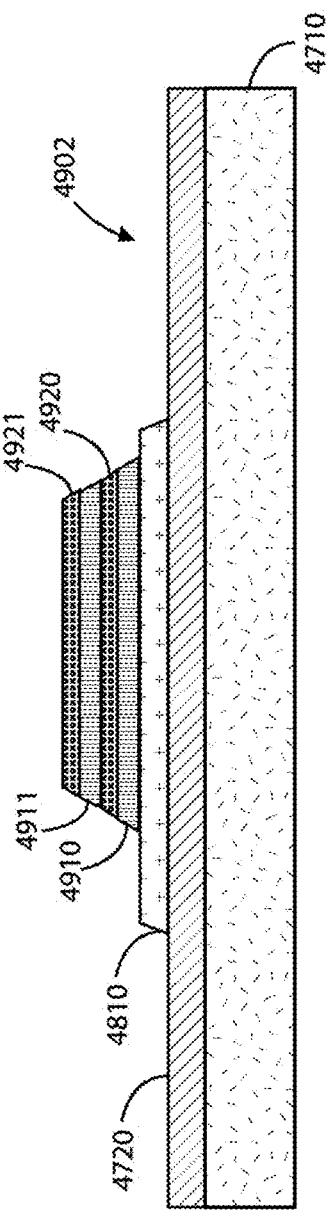
FIG. 49C
FIG. 49A
FIG. 49B

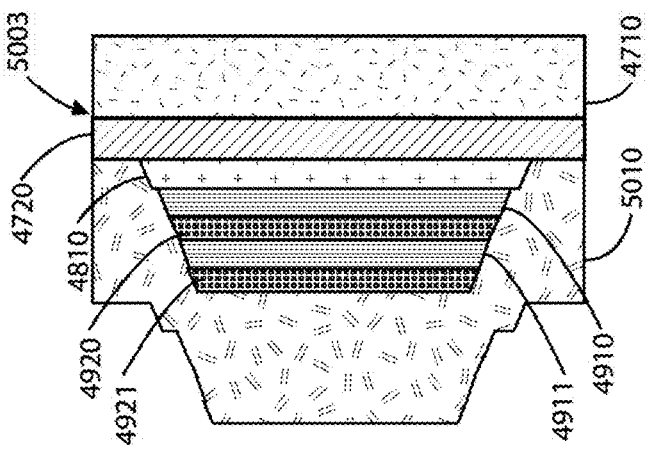
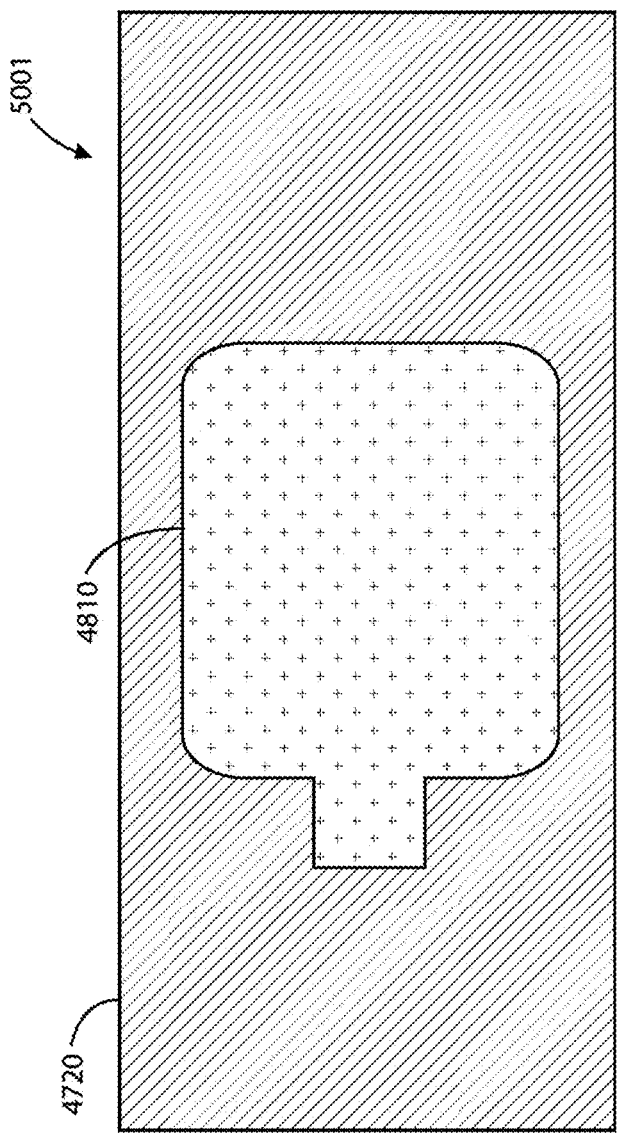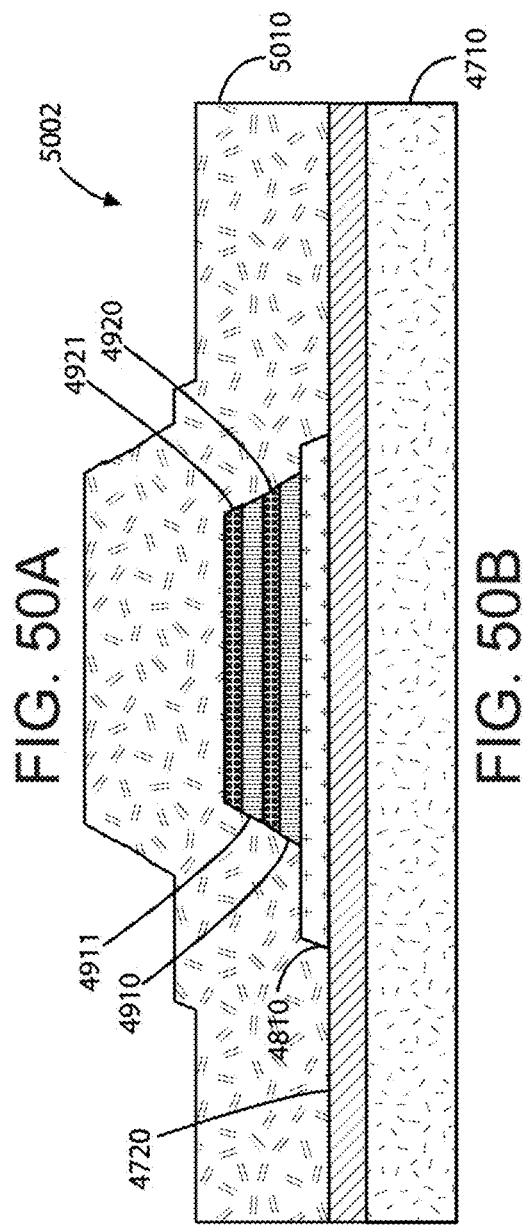

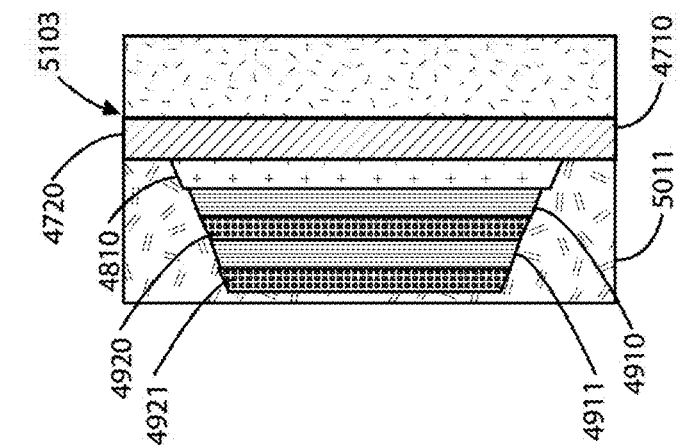
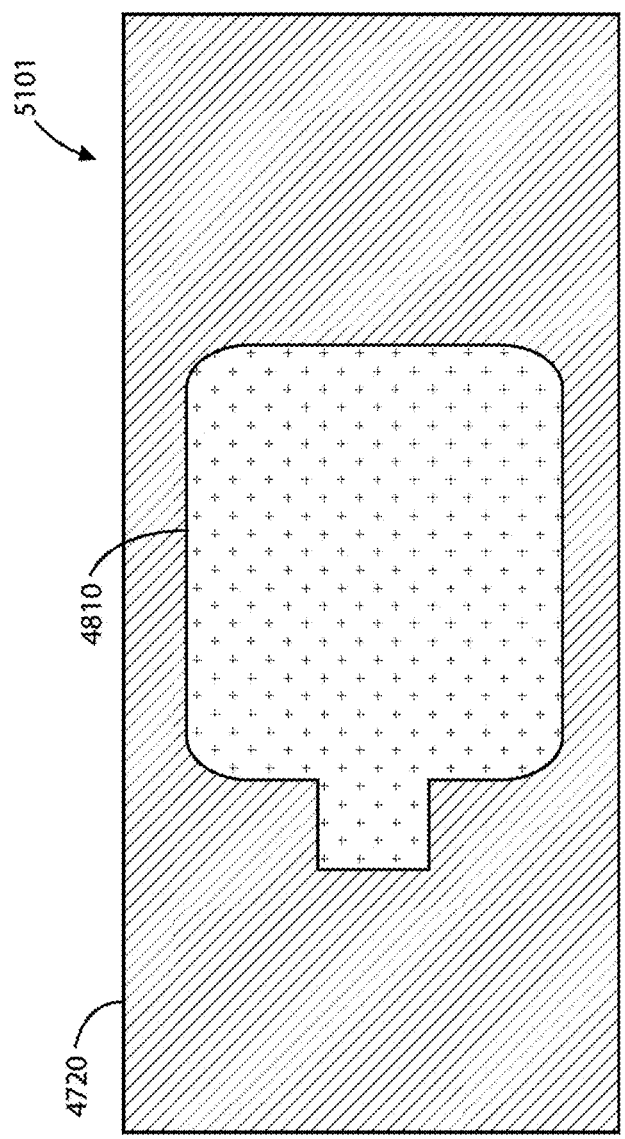
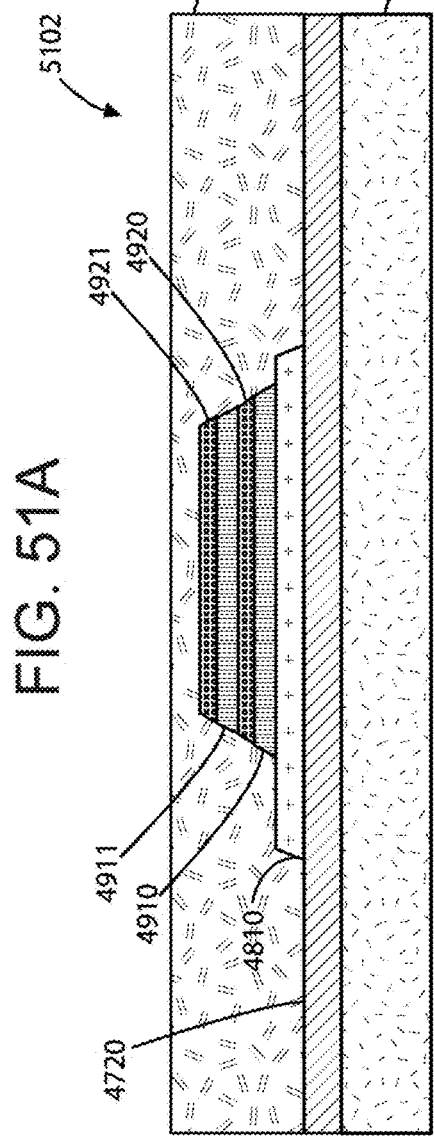
FIG. 51A
FIG. 51B
FIG. 51C

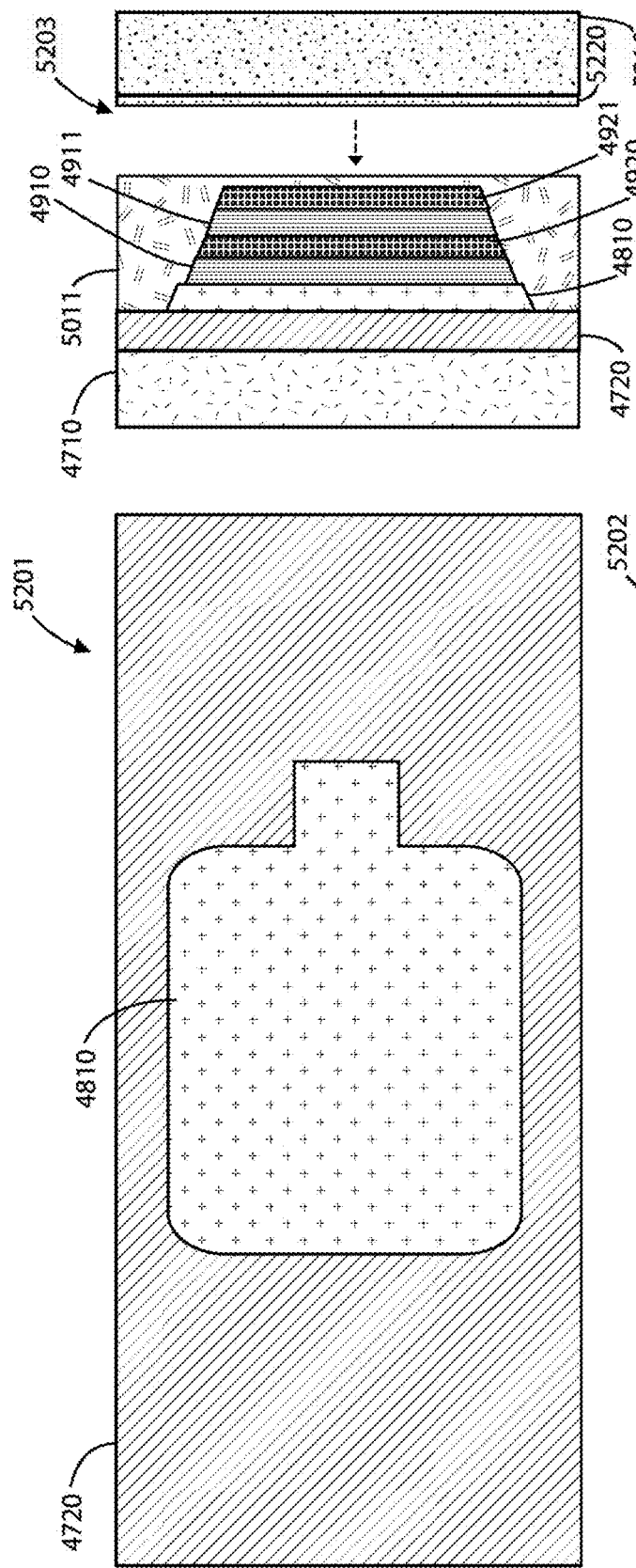

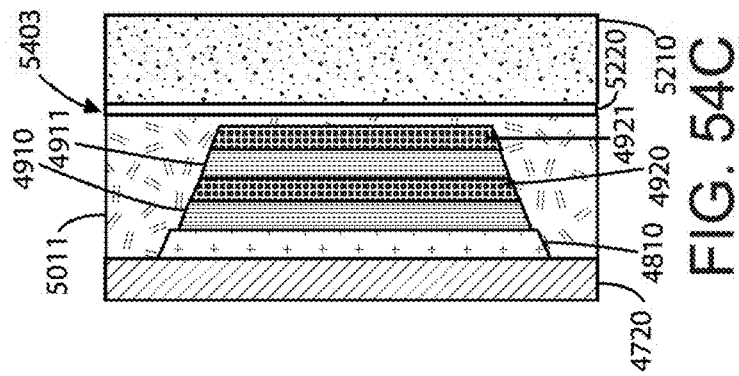
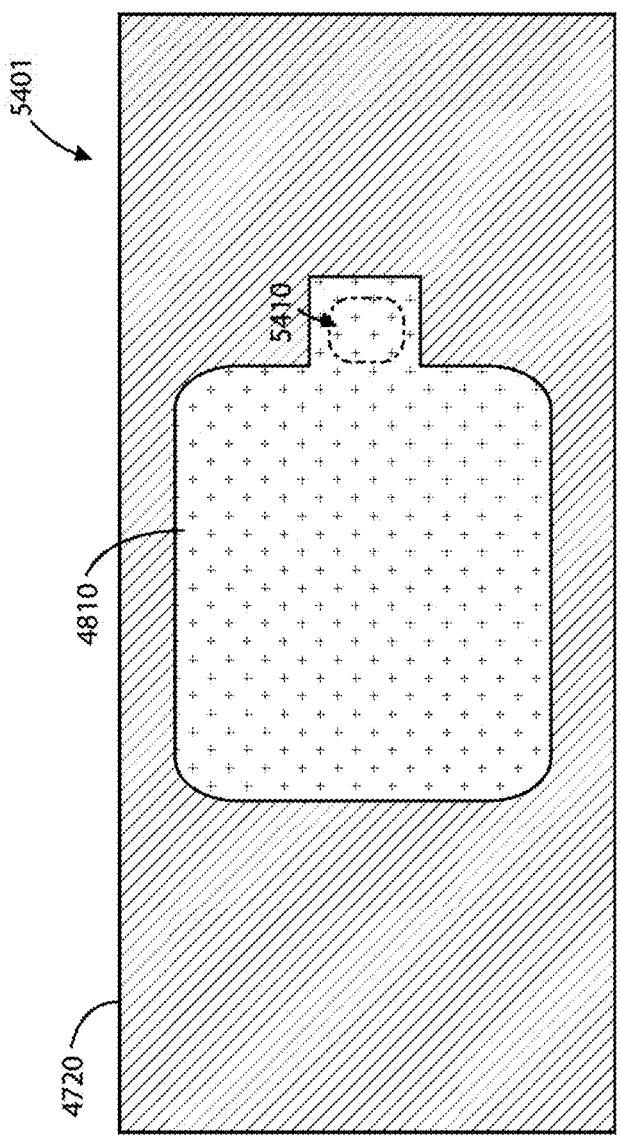
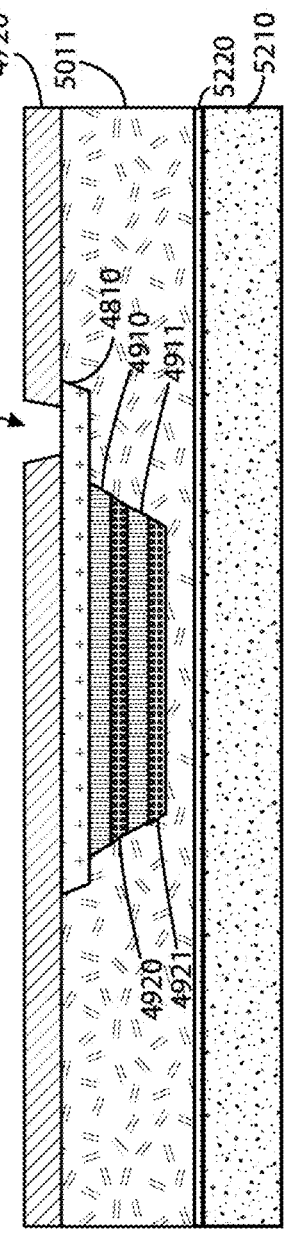
FIG. 54A
FIG. 54B
FIG. 54C

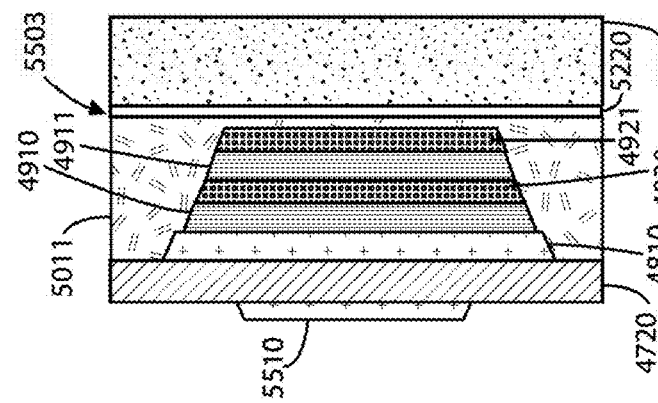
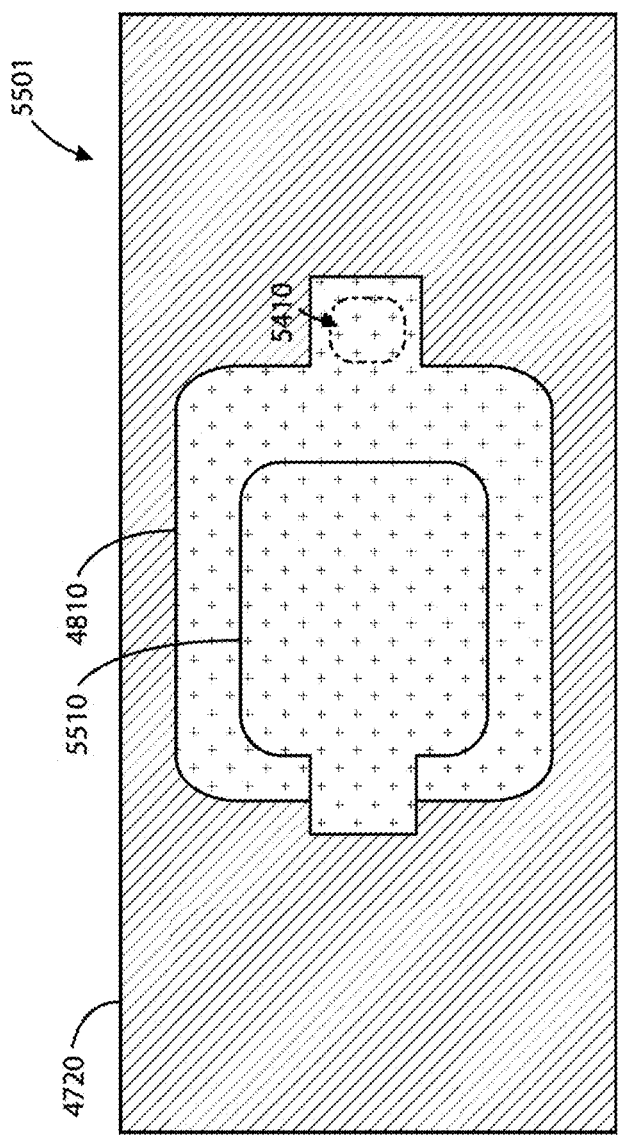
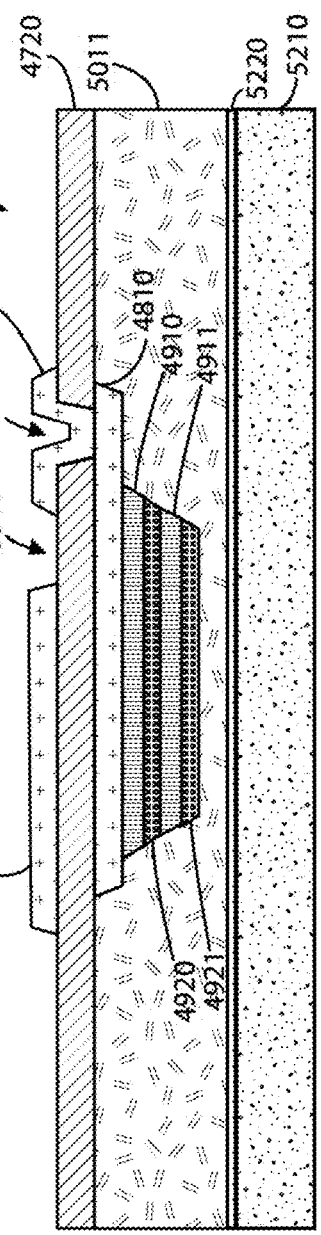
FIG. 55C
FIG. 55A
FIG. 55B

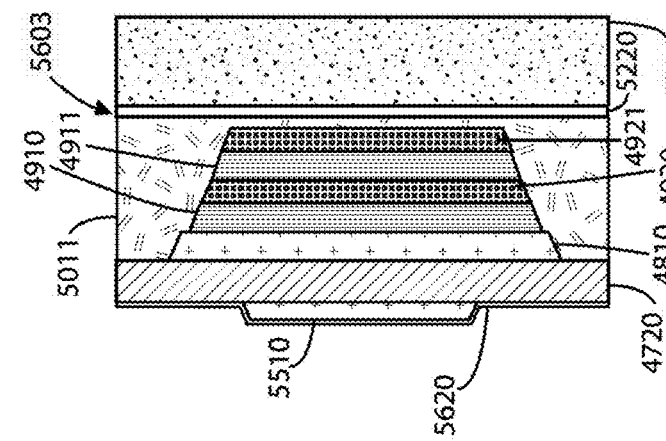
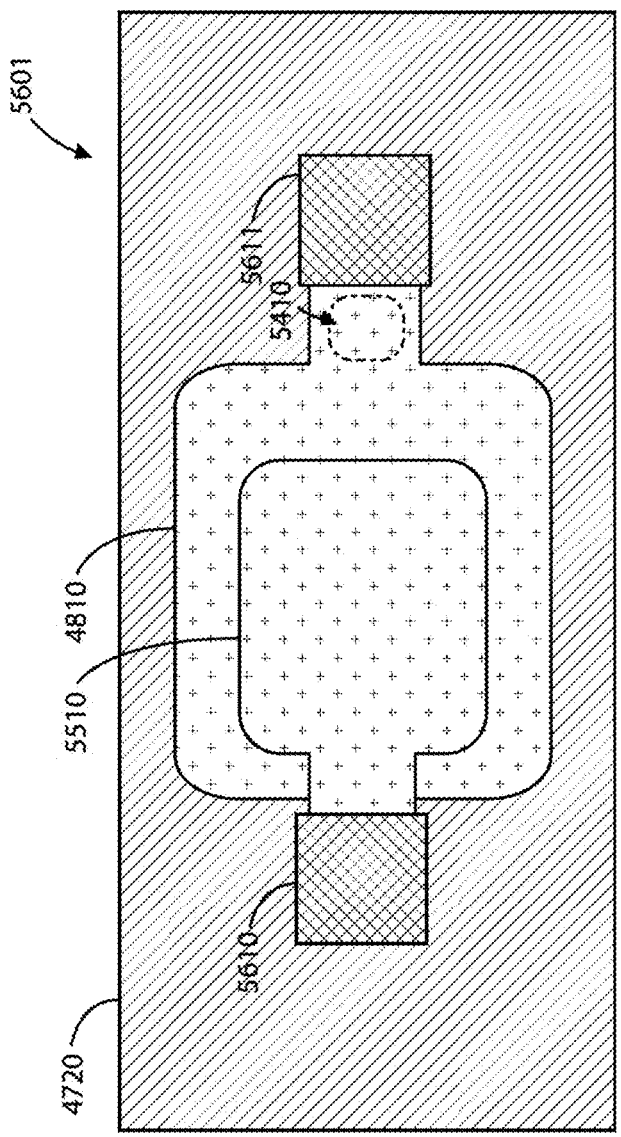
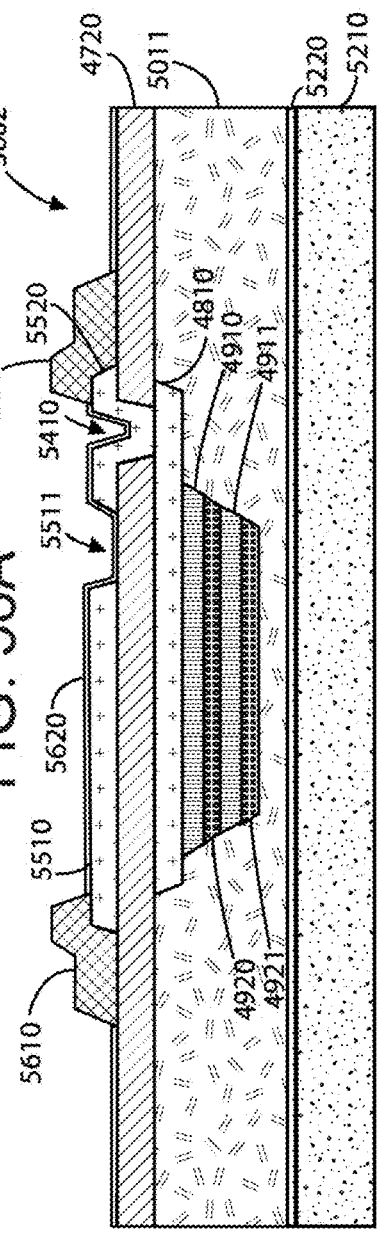
FIG. 56C
FIG. 56A
FIG. 56B

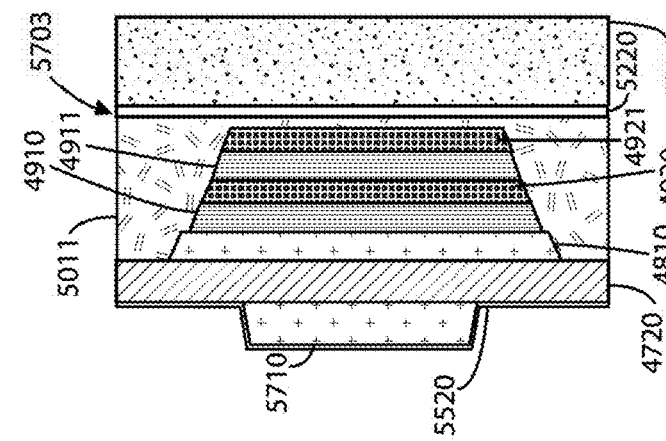
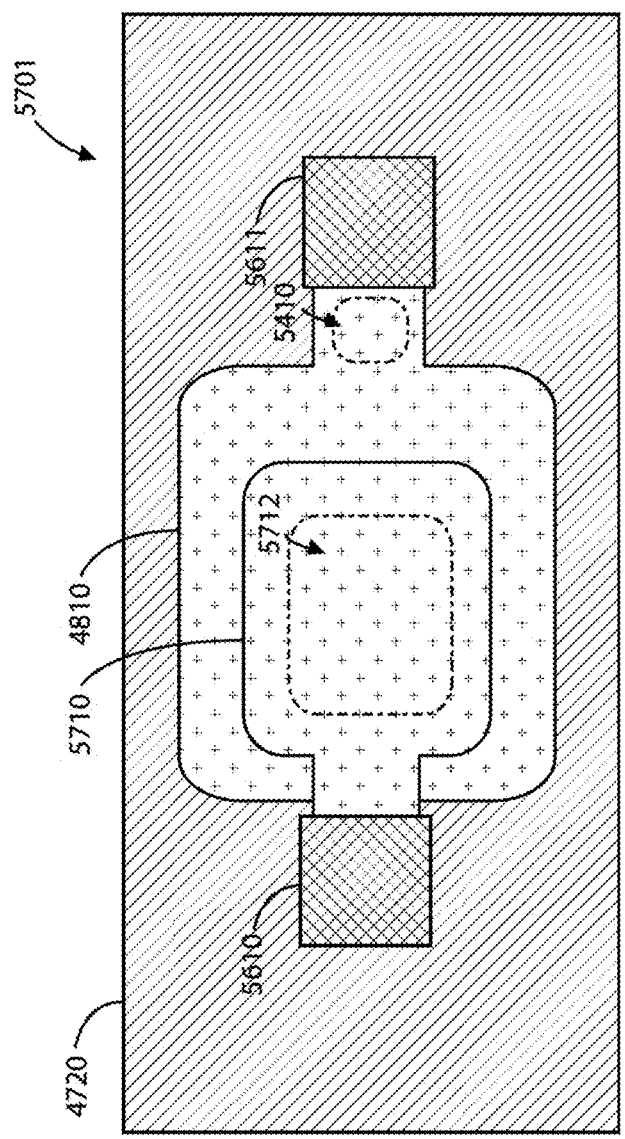
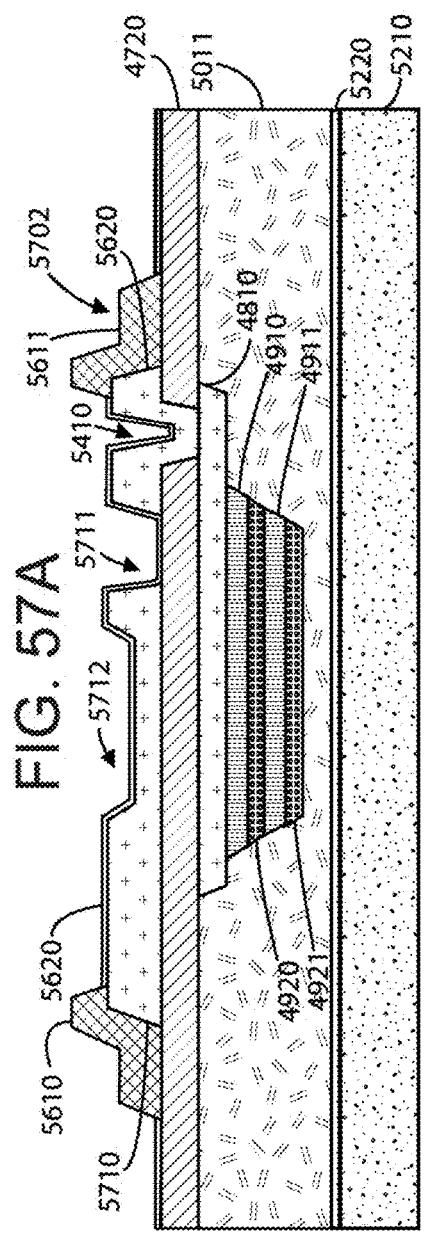
FIG. 57C
FIG. 57A
FIG. 57B

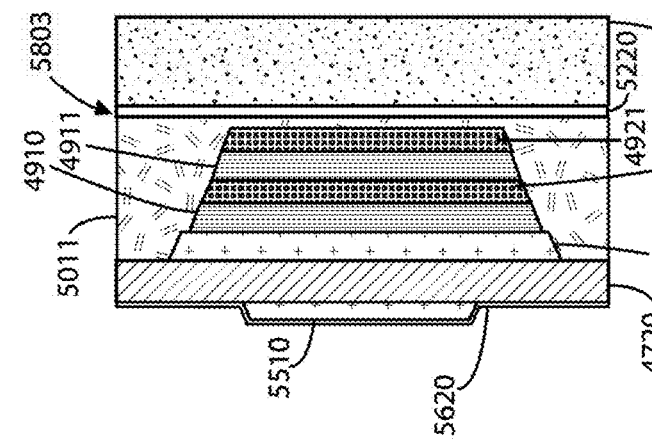
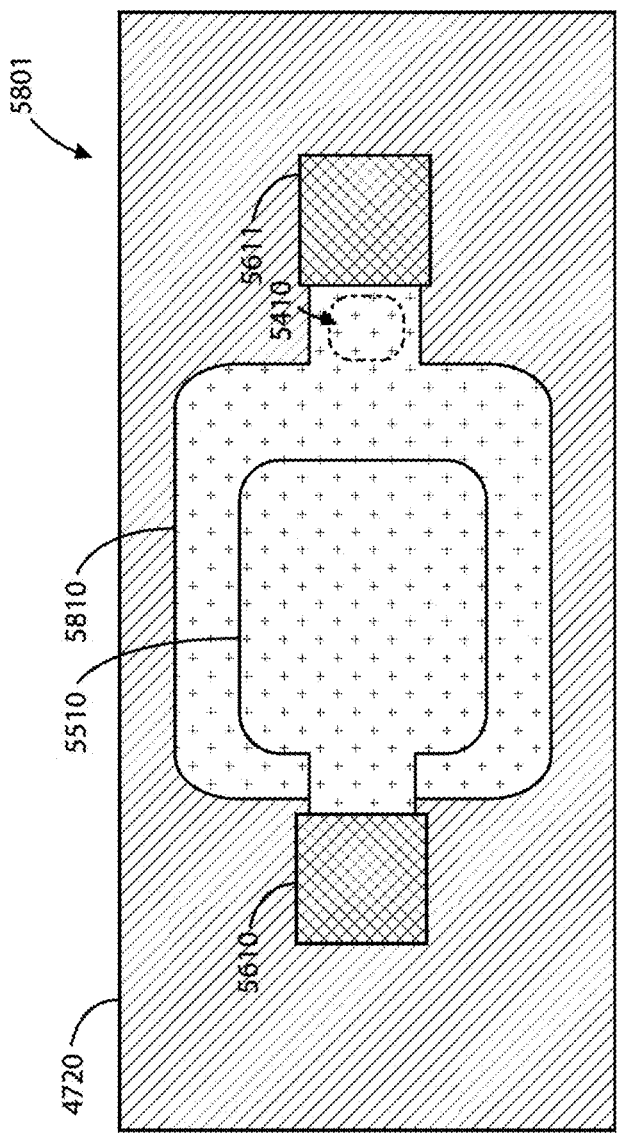
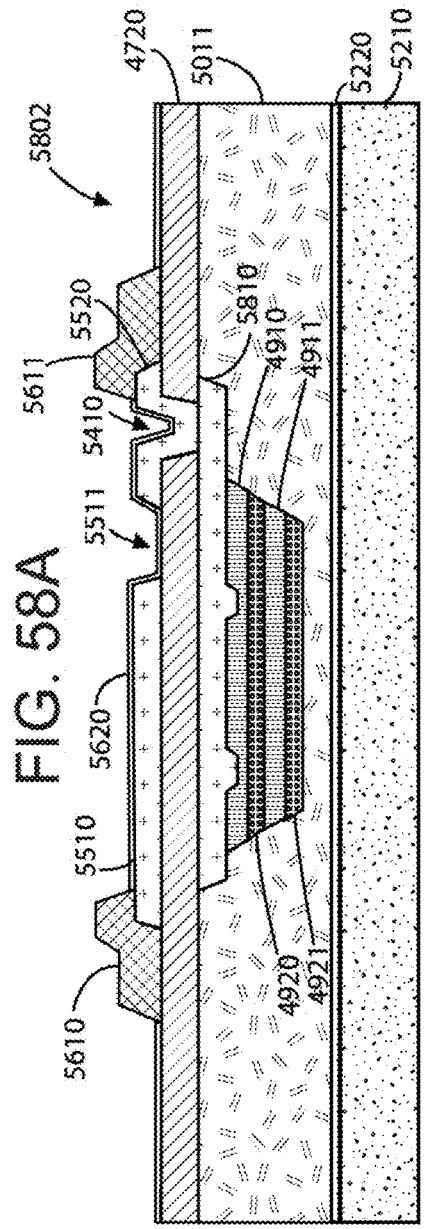
FIG. 58A
FIG. 58B
FIG. 58C

6900

| Parameter | Units | Min. | Typ. | Max. |
|---|---|---|---|---|
| Center Frequency (Fc) | MHz | | 5887.5 | |
| Passband Frequency Band | MHz | | 5850 - 5925 | |
| Insertion Loss (\|s21\|) | | | | |
| 5850 - 5925 MHz | dB | | 2.2 | |
| Amplitude Variation (Δs21) | | | | |
| 5850 - 5925 MHz | dB | | 0.7 | |
| Attenuation (\|s21\|) | | | | |
| 1000 - 5835 MHz | dB | | 40 | |
| 5950 – 7000 MHz | dB | | 40 | |
| Return Loss (\|s11\|) | | | | |
| 5850 - 5925 MHz | dB | | 12 | |
| Operating Temperature | C | -40 | | 85 |
| Load Impedence (Zo) | Ohm | | 50 | |
| Max Power Handling (Pmax) | dBm | | 30 | |

FIG. 69

5.9 GHZ C-V2X AND DSRC ACOUSTIC WAVE RESONATOR RF FILTER CIRCUIT

CROSS-REFERENCES TO RELATED APPLICATIONS

The present application claims priority to and is a continuation-in-part application of U.S. patent application Ser. No. 16/020,635, titled "5.6 GHz Wi-Fi ACOUSTIC WAVE RESONATOR RF FILTER CIRCUIT," filed Jun. 27, 2018, which is a continuation-in-part application of U.S. patent application Ser. No. 16/019,267, titled "5.2 GHz Wi-Fi ACOUSTIC WAVE RESONATOR RF FILTER CIRCUIT," filed Jun. 26, 2018, which claims priority to and is a continuation-in-part application of U.S. patent application Ser. No. 15/784,919, titled "PIEZOELECTRIC ACOUSTIC RESONATOR MANUFACTURED WITH PIEZOELECTRIC THIN FILM TRANSFER PROCESS," filed Oct. 16, 2017 and claims priority to and is a continuation-in-part application of U.S. patent application Ser. No. 15/068,510, titled "METHOD OF MANUFACTURE FOR SINGLE CRYSTAL ACOUSTIC RESONATOR DEVICES USING MICRO-VIAS," filed Mar. 11, 2016. The present application incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 2, 2014; U.S. patent application Ser. No. 14/298,076, titled "METHOD OF MANUFACTURE FOR SINGLE CRYSTAL CAPACITOR DIELECTRIC FOR A RESONANCE CIRCUIT", filed Jun. 2, 2014; U.S. patent application Ser. No. 14/298,100, titled "INTEGRATED CIRCUIT CONFIGURED WITH TWO OR MORE SINGLE CRYSTAL ACOUSTIC RESONATOR DEVICES", filed Jun. 2, 2014; U.S. patent application Ser. No. 14/341,314, titled "WAFER SCALE PACKAGING", filed Jul. 25, 2014; U.S. patent application Ser. No. 14/449,001, titled "MOBILE COMMUNICATION DEVICE CONFIGURED WITH A SINGLE CRYSTAL PIEZO RESONATOR STRUCTURE", filed Jul. 31, 2014; U.S. patent application Ser. No. 14/469,503, titled "MEMBRANE SUBSTRATE STRUCTURE FOR SINGLE CRYSTAL ACOUSTIC RESONATOR DEVICE", filed Aug. 26, 2014; and U.S. patent application Ser. No. 15/068,510, titled "METHOD OF MANUFACTURE FOR SINGLE CRYSTAL ACOUSTIC RESONATOR DEVICES USING MICRO-VIAS," filed Mar. 11, 2016.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and 5G growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring single crystal piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides an RF filter circuit device in a ladder configuration. The device can include an input port, a first node coupled to the input port, a first resonator coupled between the first node and the input port. A second node is coupled to the first node and a second resonator is coupled between the first node and the second node. A third node is coupled to the second node and a third resonator is coupled between the second node and the third node. A fourth node is coupled to the third node and a fourth resonator is coupled between the third node and the output port. Further, an output port is coupled to the fourth node. Those of ordinary skill in the art will recognize other variations, modifications, and alternatives.

Each of the first, second, third, and fourth resonators can include a capacitor device. Each such capacitor device can include a substrate member, which has a cavity region and an upper surface region contiguous with an opening in the first cavity region. Each capacitor device can include a bottom electrode within a portion of the cavity region and a piezoelectric material overlying the upper surface region and the bottom electrode. Also, each capacitor device can include a top electrode overlying the single crystal material and the bottom electrode, as well as an insulating material overlying the top electrode and configured with a thickness to tune the resonator.

The device also includes a serial configuration includes the input port, the first node, the first resonator, the second node, the second resonator, the third node, the third resonator, the fourth resonator, the fourth node, and the output port. A separate shunt configuration resonator is coupled to each of the first, second, third, fourth nodes. A parallel configuration includes the first, second, third, and fourth shunt configuration resonators. Further, a circuit response can be configured between the input port and the output port and configured from the serial configuration and the parallel configuration to achieve a transmission loss from a passband having a characteristic frequency centered around 5.8875 GHz and having a bandwidth from 5.85 GHz to 5.925 GHz such that the characteristic frequency centered around 5.8875 GHz is tuned from a lower frequency ranging from about 5 GHz to 5.7 GHz.

In a specific example, the first, second, third, and fourth piezoelectric materials are each essentially a single crystal aluminum nitride bearing material or aluminum scandium nitride bearing material, a single crystal gallium nitride bearing material or gallium aluminum bearing material, or the like. In another specific embodiment, these piezoelectric materials each comprise a polycrystalline aluminum nitride bearing material or aluminum scandium bearing material, or a polycrystalline gallium nitride bearing material or gallium aluminum bearing material, or the like.

In a specific example, the serial configuration forms a resonance profile and an anti-resonance profile. The parallel configuration also forms a resonance profile and an anti-resonance profile. These profiles are such that the resonance profile from the serial configuration is off-set with the anti-resonance profile of the parallel configuration to form the pass-band.

In a specific example, the pass-band is characterized by a band edge on each side of the pass-band and having an amplitude difference ranging from 10 dB to 60 dB. The pass-band has a pair of band edges; each of which has a transition region from the pass-band to a stop band such that the transition region is no greater than 250 MHz. In another example, pass-band can include a pair of band edges and each of these band edges can have a transition region from the pass-band to a stop band such that the transition region ranges from 5 MHz to 250 MHz.

In a specific example, each of the first, second, third, and fourth insulating materials comprises a silicon nitride bearing material or an oxide bearing material configured with a silicon nitride material an oxide bearing material.

In a specific example, the present device can further include several features. The device can further include a rejection band at a frequency lower than the pass-band. This rejection band can range from 5.49 GHz to 5.835 GHz. The device can further include an insertion loss in the pass-band of 2.2 dB or less and an amplitude variation characterizing the pass-band of 0.7 dB. Also, the device can include an attenuation of up to 40 dB for a frequency range of 1 GHz to 5.835 GHz or an attenuation of up to 40 dB for a frequency range of 5.95 GHz to 7. The device can further include a return loss characterizing the pass-band ranging from about 10 dB to about 25 dB and the device can be operable from −40 Degrees Celsius to 85 Degrees Celsius. The device can further include a maximum power handling capability within the pass-band of 30 dBm or 1 Watt. Further, the pass-band can be configured for a U-NII-4 band and for a C-V2X channel plan in the 5.850 to 5.925 GHz band.

In a specific example, the present device can be configured as a bulk acoustic wave (BAW) filter device and can be configured for an automotive vehicle. Each of the first, second, third, and fourth resonators can be a BAW resonator. Similarly, each of the first, second, third, and fourth shunt resonators can be BAW resonators. The present device can further include one or more additional resonator devices numbered from N to M, where N is four and M is twenty. Similarly, the present device can further include one or more additional shunt resonator devices numbered from N to M, where N is four and M is twenty.

In an example, the present invention provides an RF circuit device in a lattice configuration. The device can include a differential input port, a top serial configuration, a bottom serial configuration, a first lattice configuration, a second lattice configuration, and a differential output port. The top serial configuration can include a first top node, a second top node, and a third top node. A first top resonator can be coupled between the first top node and the second top node, while a second top resonator can be coupled between the second top node and the third top node. Similarly, the bottom serial configuration can include a first bottom node, a second bottom node, and a third bottom node. A first bottom resonator can be coupled between the first bottom node and the second bottom node, while a second bottom resonator can be coupled between the second bottom node and the third bottom node.

In an example, the first lattice configuration includes a first shunt resonator cross-coupled with a second shunt resonator and coupled between the first top resonator of the top serial configuration and the first bottom resonator of the bottom serial configuration. Similarly, the second lattice configuration can include a first shunt resonator cross-coupled with a second shunt resonator and coupled between the second top resonator of the top serial configuration and the second bottom resonator of the bottom serial configuration. The top serial configuration and the bottom serial configuration can each be coupled to both the differential input port and the differential output port. Further, a circuit response between the differential input port and the differential output port and configured from the top serial configuration and the bottom serial configuration to achieve a transmission loss from a pass band having a characteristic frequency centered around 5.8875 GHz and having a bandwidth from 5.85 GHz to 5.925 GHz such that the characteristic frequency centered around 5.8875 GHz is tuned from a lower frequency ranging from about 5 GHz to 5.7 GHz.

In a specific example, the device further includes a first balun coupled to the differential input port and a second balun coupled to the differential output port. The device can further include an inductor device coupled between the differential input and output ports. In a specific example, the device can further include a first inductor device coupled between the first top node of the top serial configuration and the first bottom node of the bottom serial configuration; a second inductor device coupled between the second top node of the top serial configuration and the second bottom node of the bottom serial configuration; and a third inductor device coupled between the third top node of the top serial configuration and the third bottom node of the bottom serial configuration.

One or more benefits are achieved over pre-existing techniques using the invention. In particular, the present device can be manufactured in a relatively simple and cost effective manner while using conventional materials and/or methods according to one of ordinary skill in the art. The present device provides a ultra-small form factor RF resonator filter with high rejection, high power rating, and low insertion loss. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an embodiment of the present invention.

FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.

FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.

FIG. 69 is a simplified table of filter parameters according to an example of the present invention.

DETAILED DESCRIPTION OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1A:
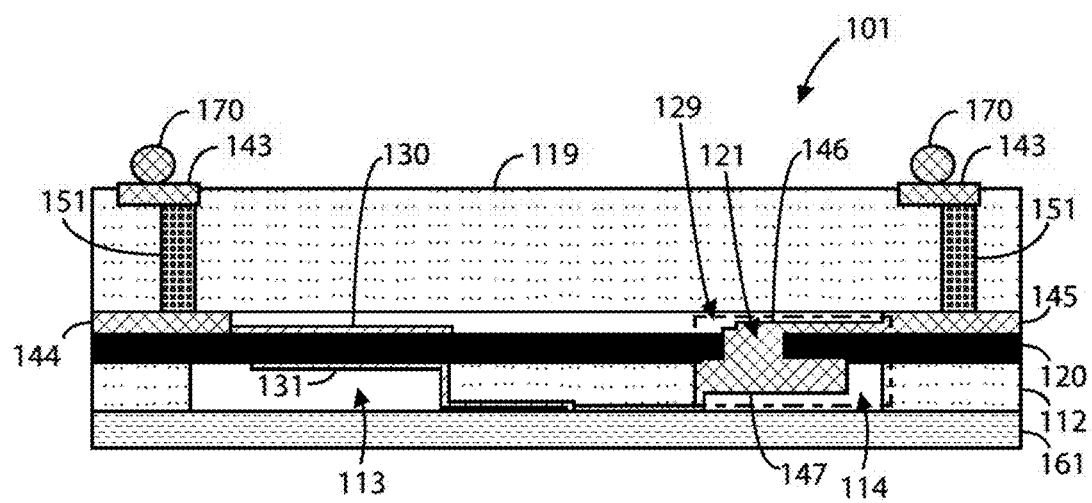
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
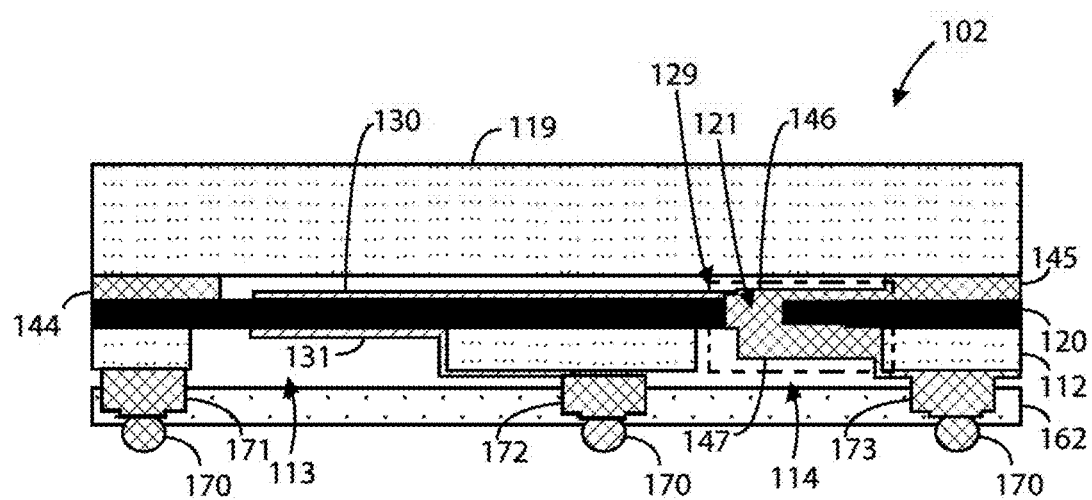
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
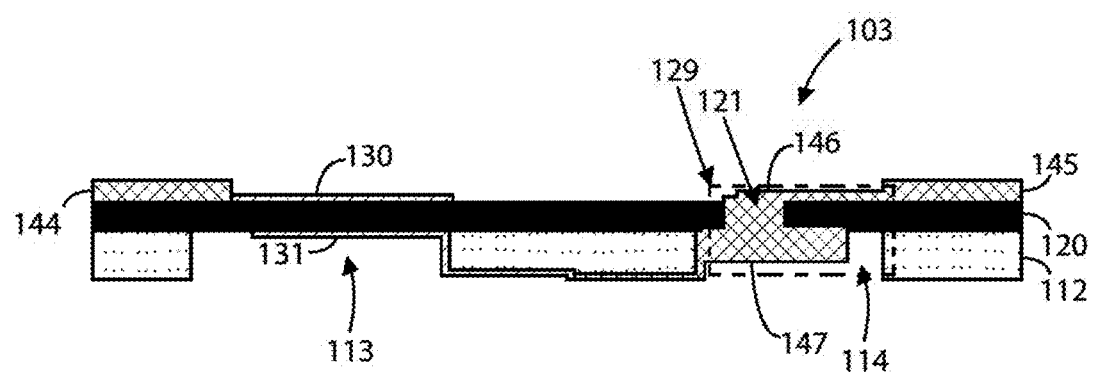
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
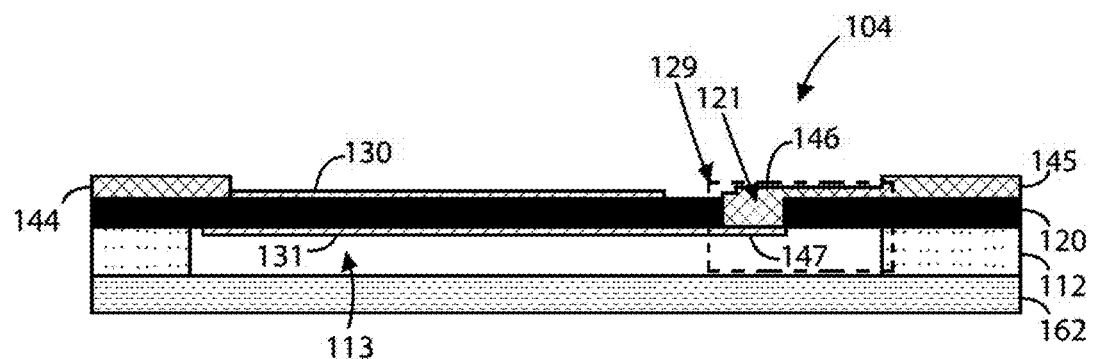
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
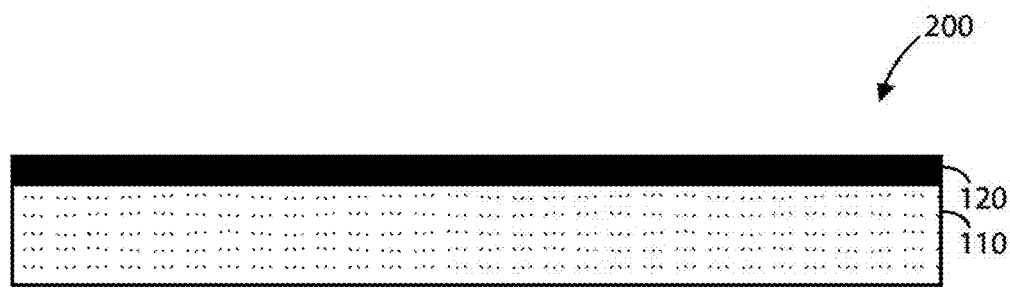
FIGS. 2 and 3 are simplified diagrams illustrating steps for a method of manufacture for an acoustic resonator device according to an example of the present invention.
Figure 3:
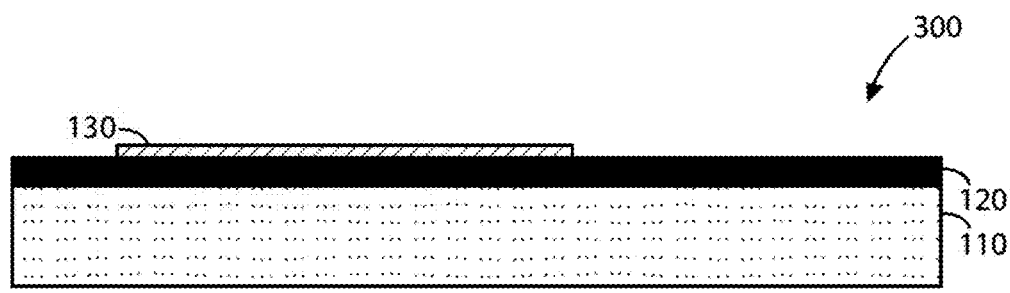

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
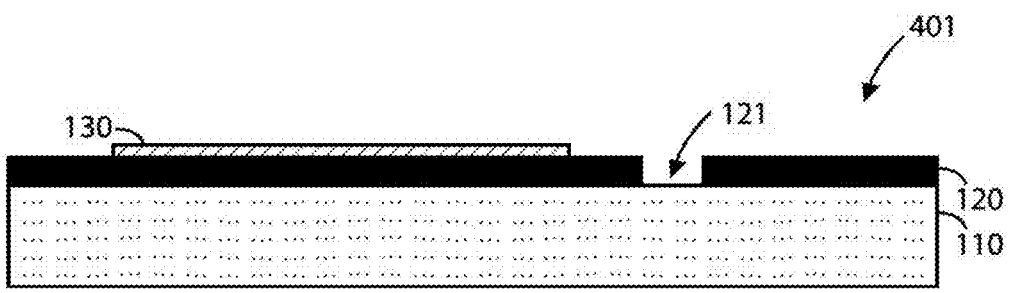
FIG. 4A is a simplified diagram illustrating a step for a method creating a topside micro-trench according to an example of the present invention.
Figure 4B:
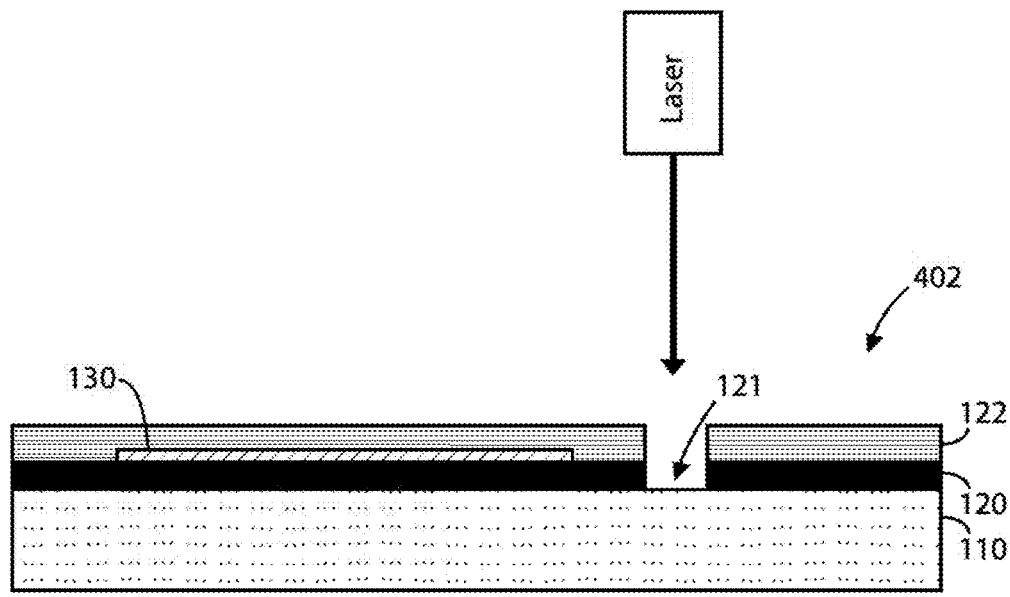
FIGS. 4B and 4C are simplified diagrams illustrating alternative methods for conducting the method step of forming a topside micro-trench as described in FIG. 4A.
Figure 4C:
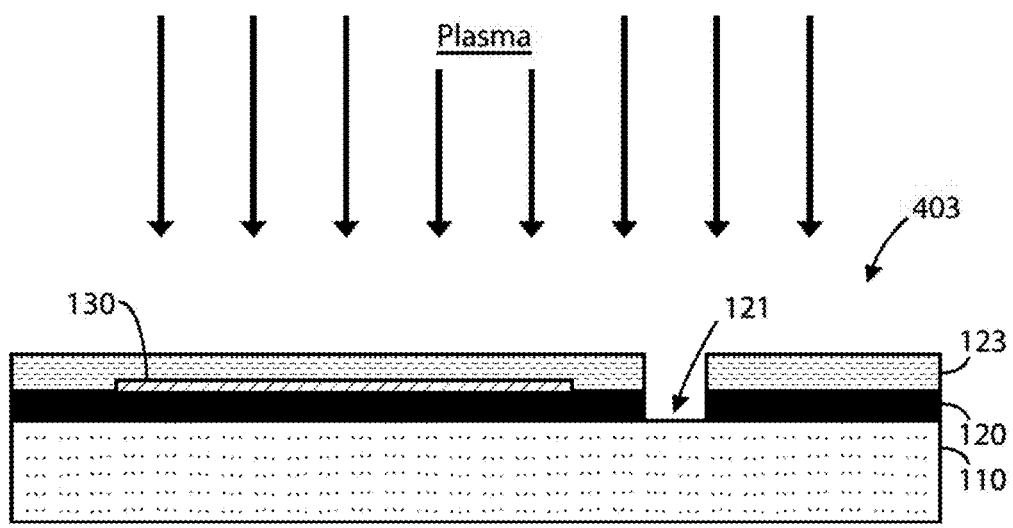

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
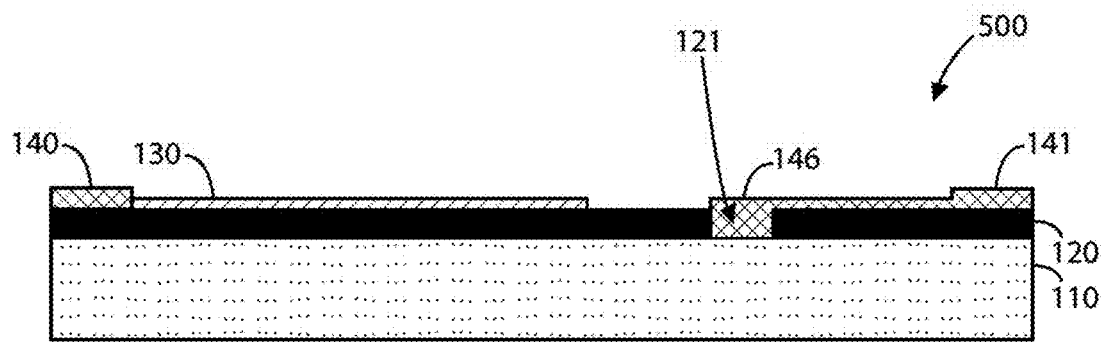
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
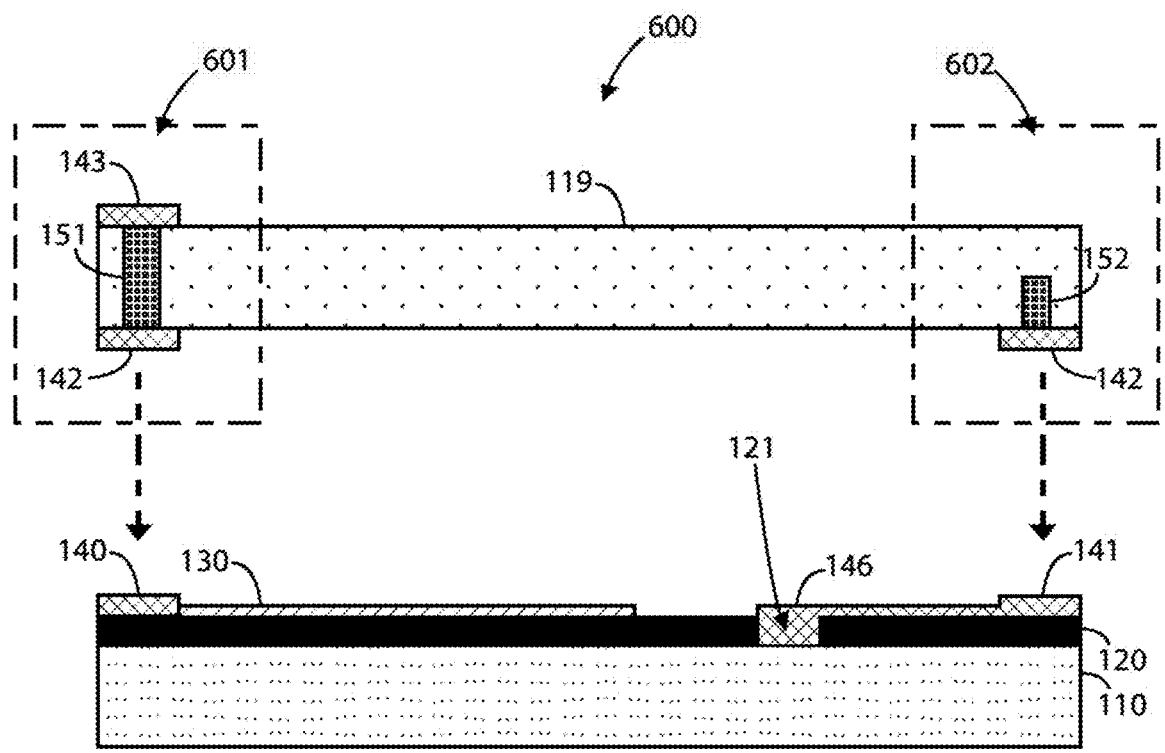

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
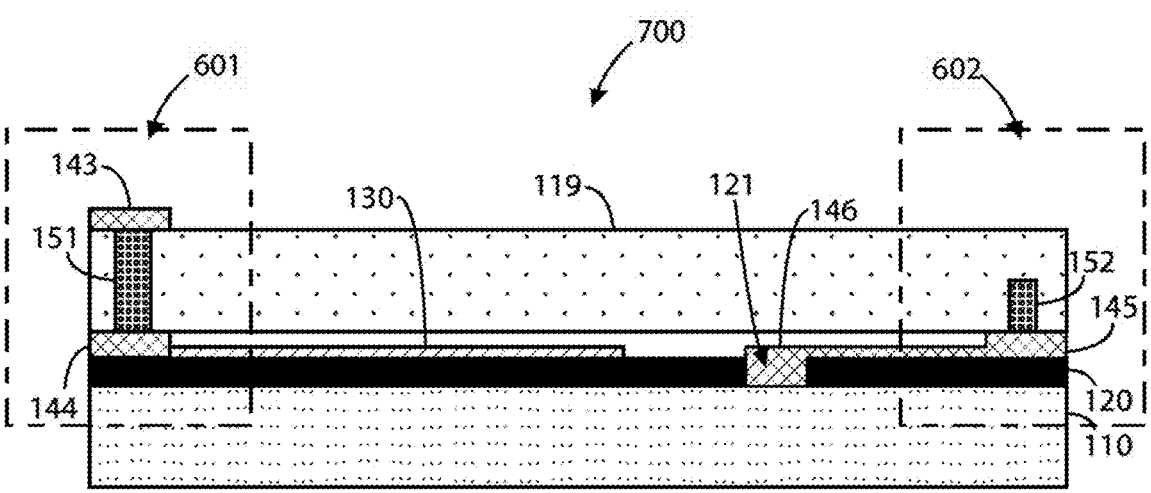
Figure 8:
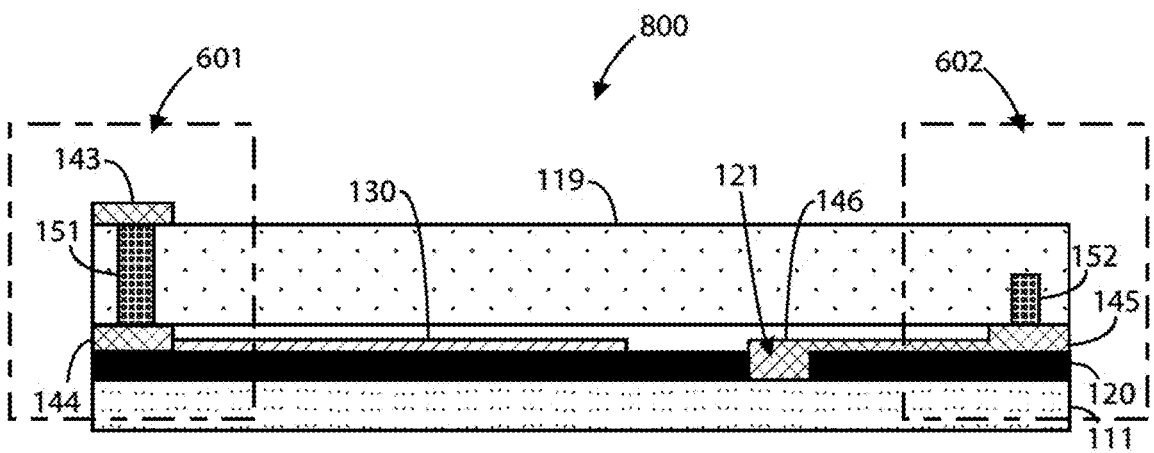

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
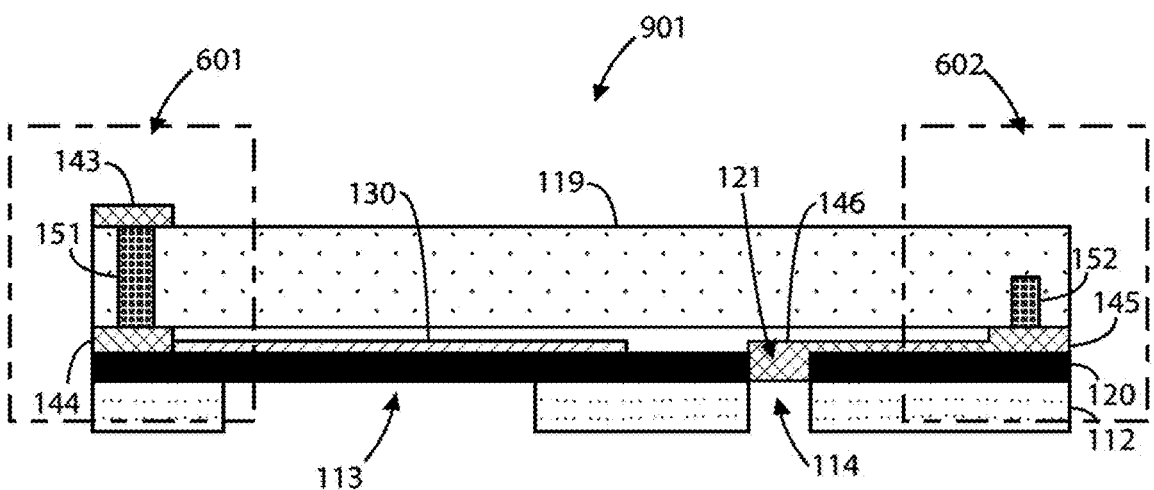
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
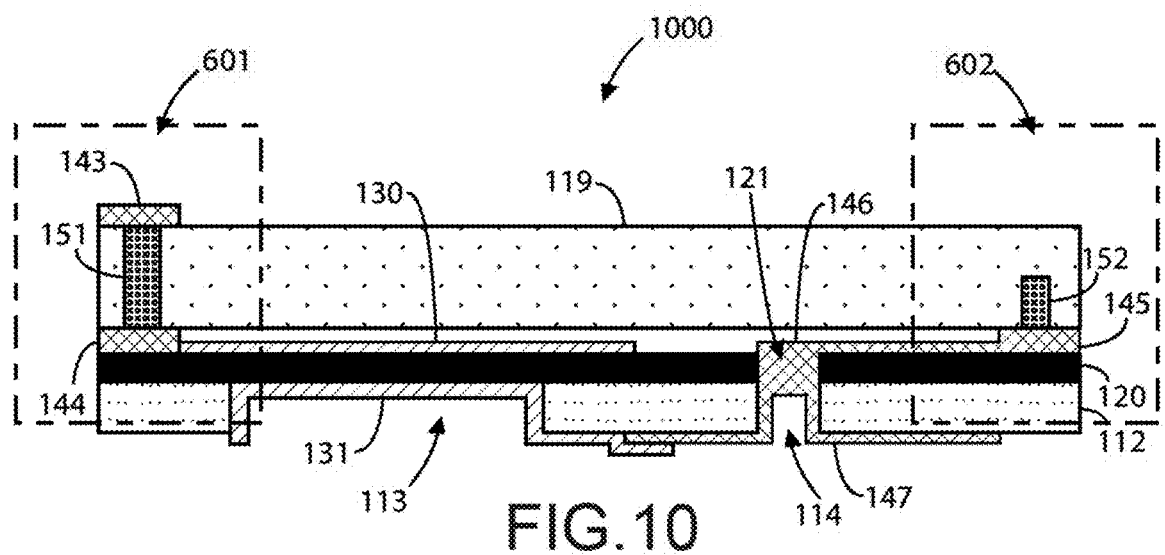
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
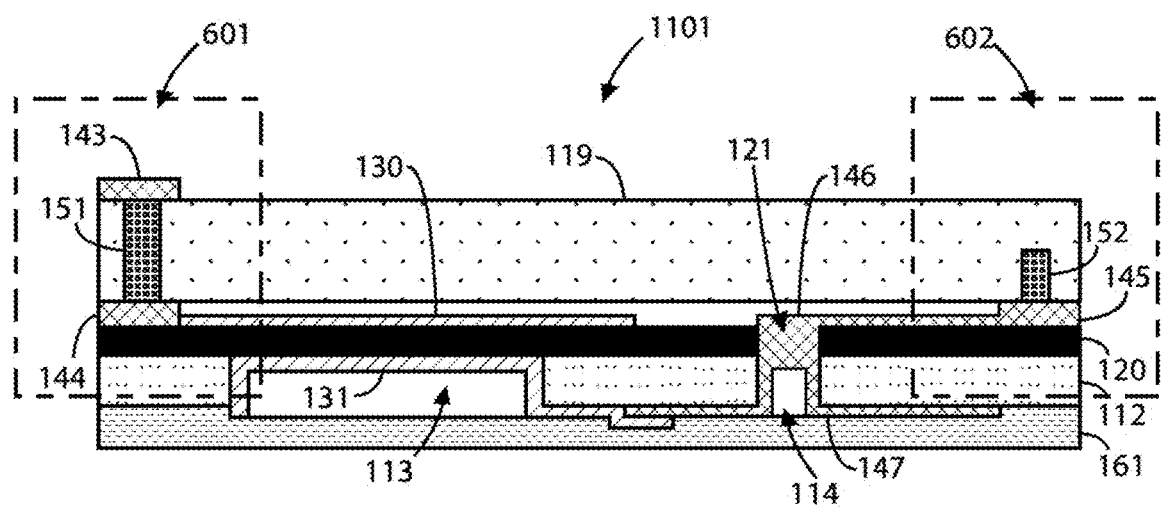
FIGS. 11A and 11B are simplified diagrams illustrating alternative steps for a method of manufacture for an acoustic resonator device according to an example of the present invention.
Figure 11B:
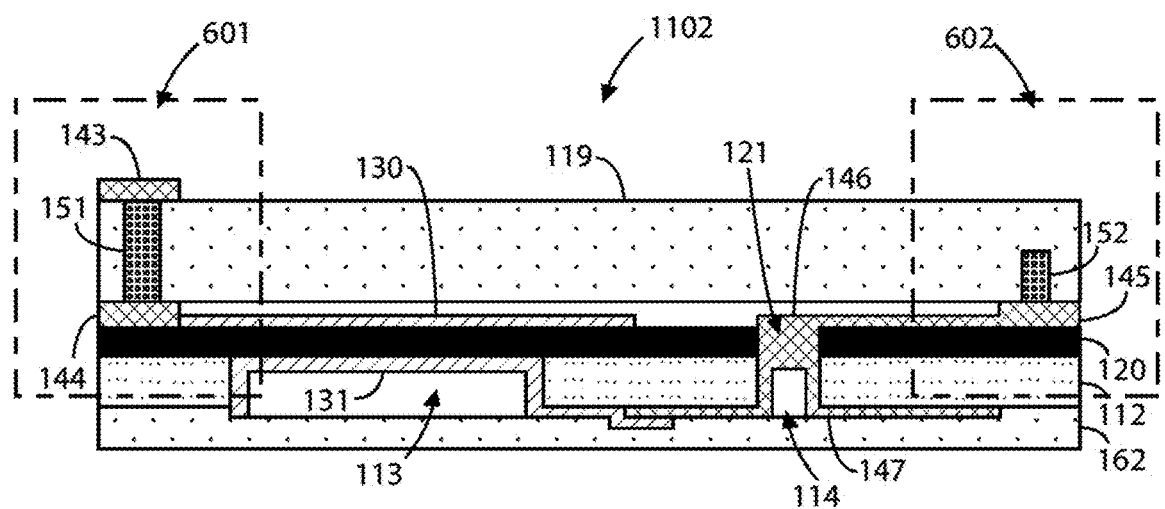

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
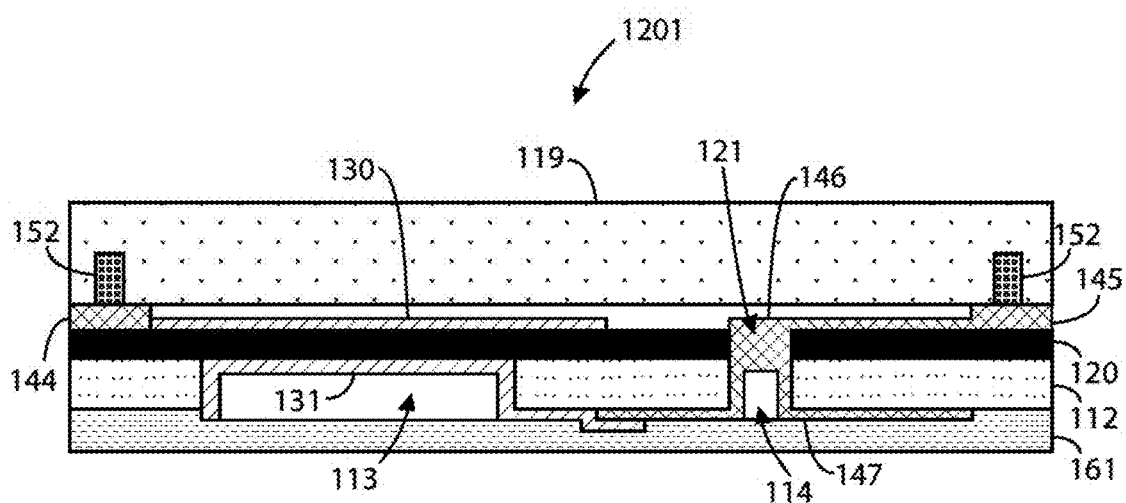
FIGS. 12A to 12E are simplified diagrams illustrating steps for a method of manufacture for an acoustic resonator device using a blind via interposer according to an example of the present invention.
Figure 12B:
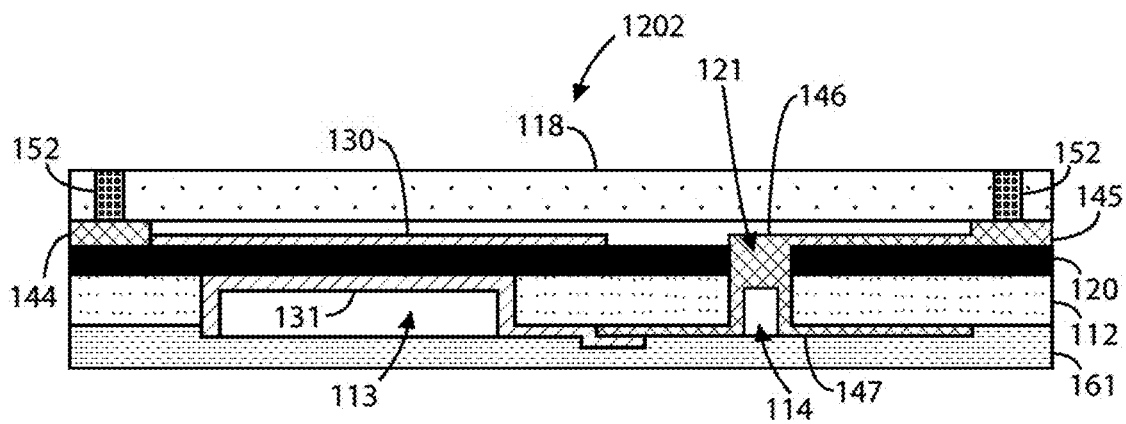
Figure 12C:
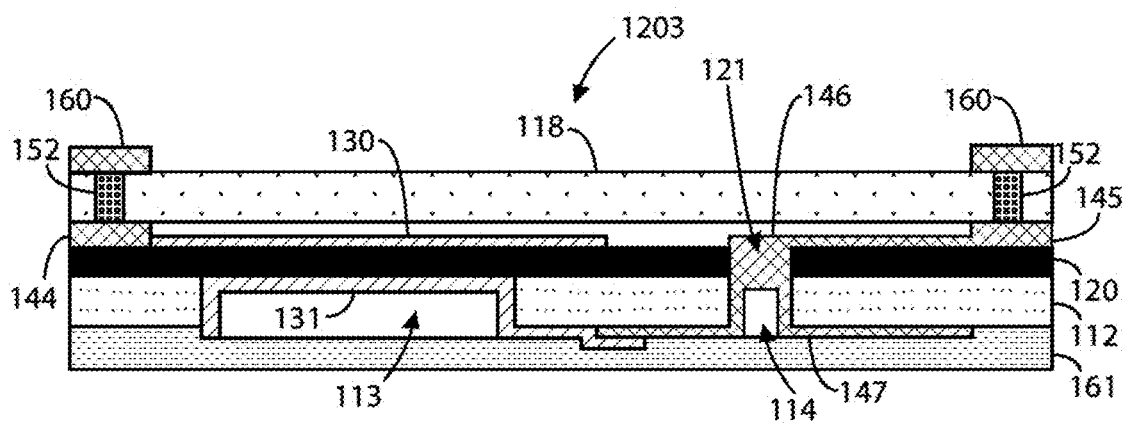
Figure 12D:
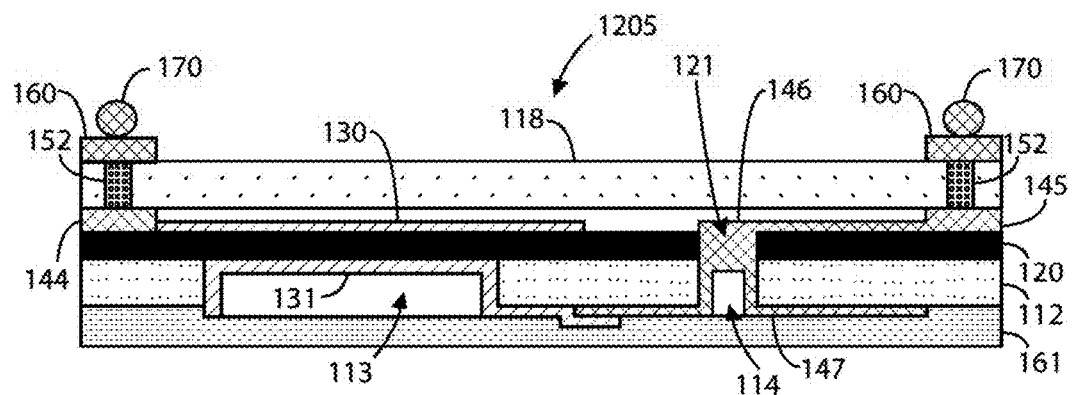
Figure 12E:
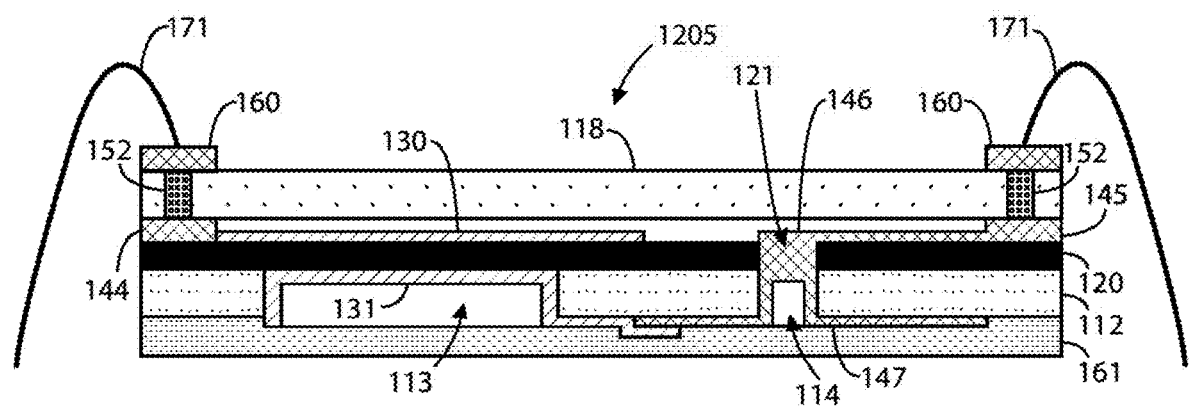

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
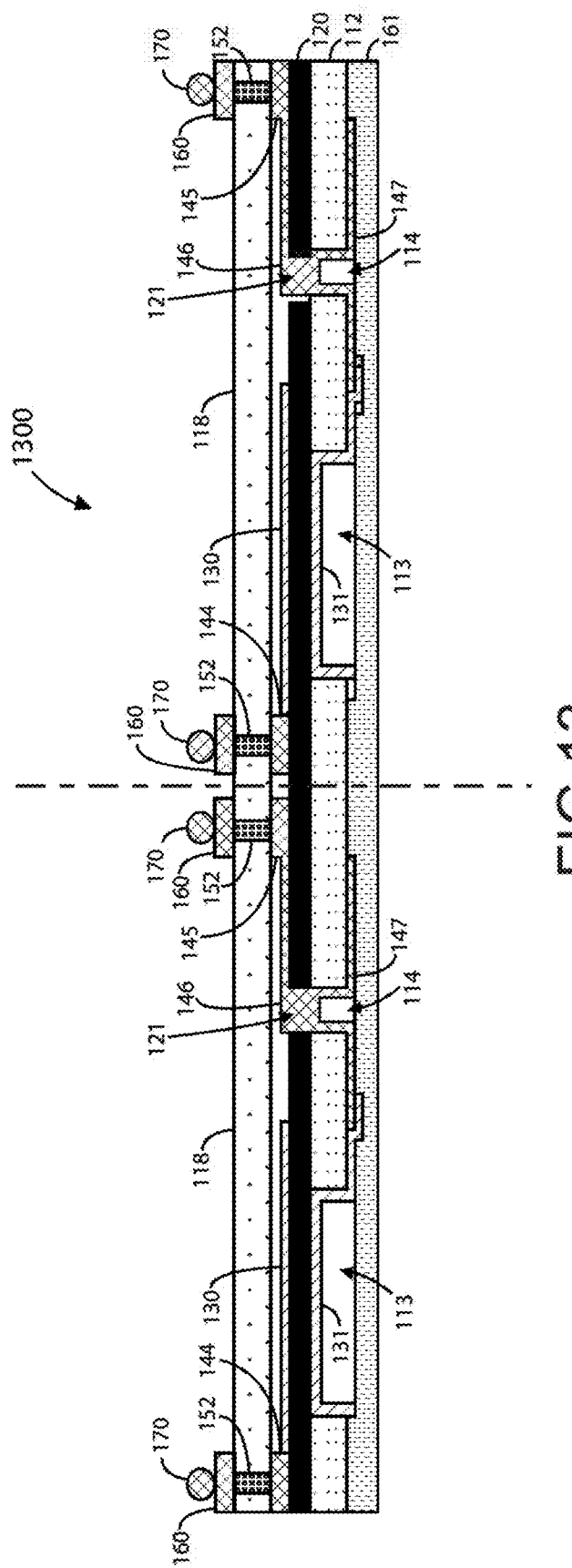
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
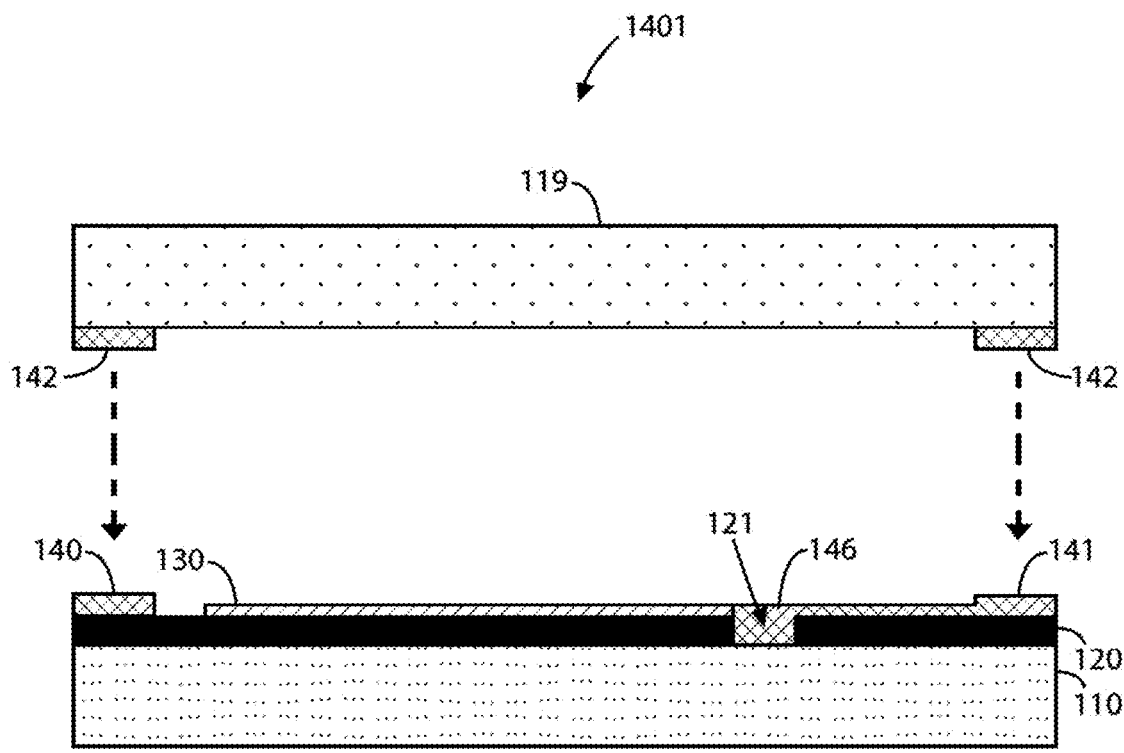
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
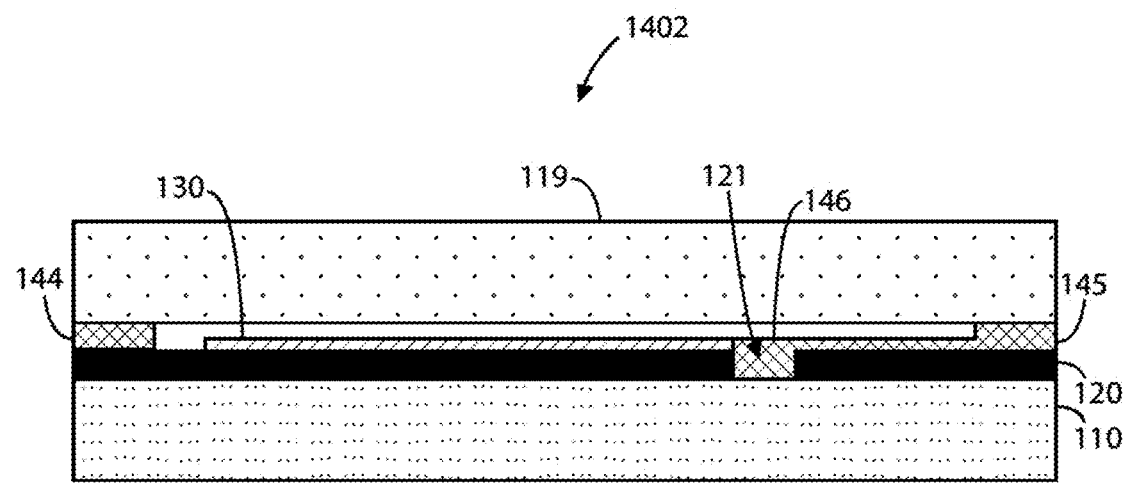
Figure 14C:
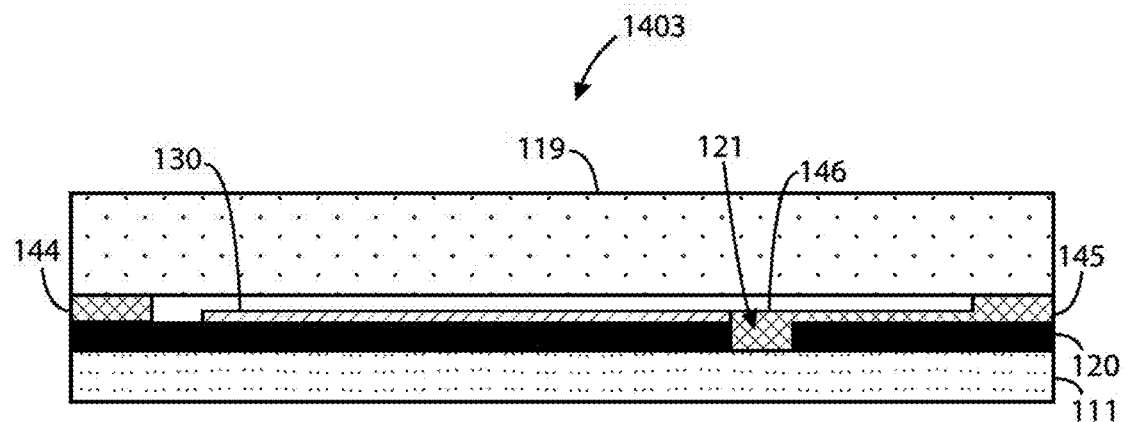
Figure 14D:
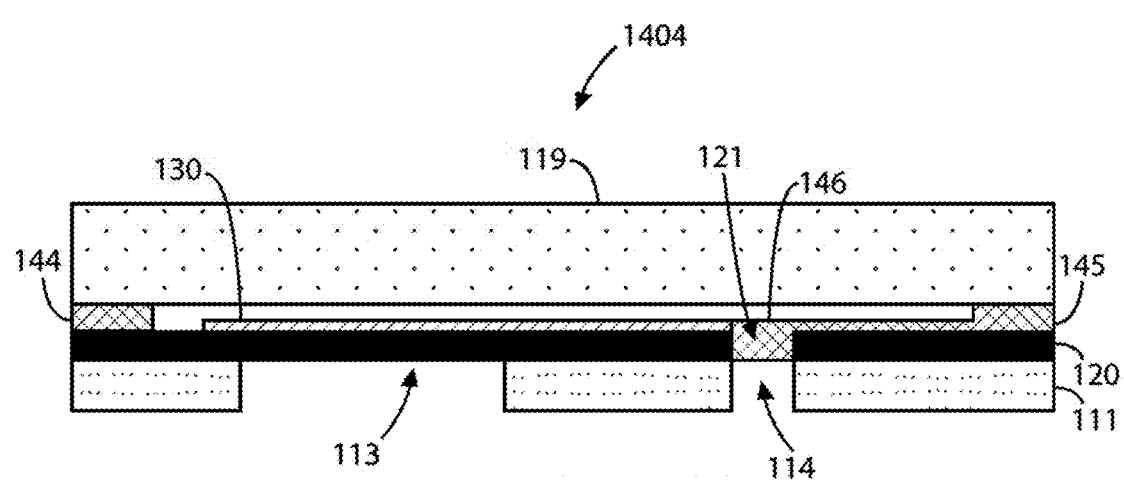
Figure 14E:
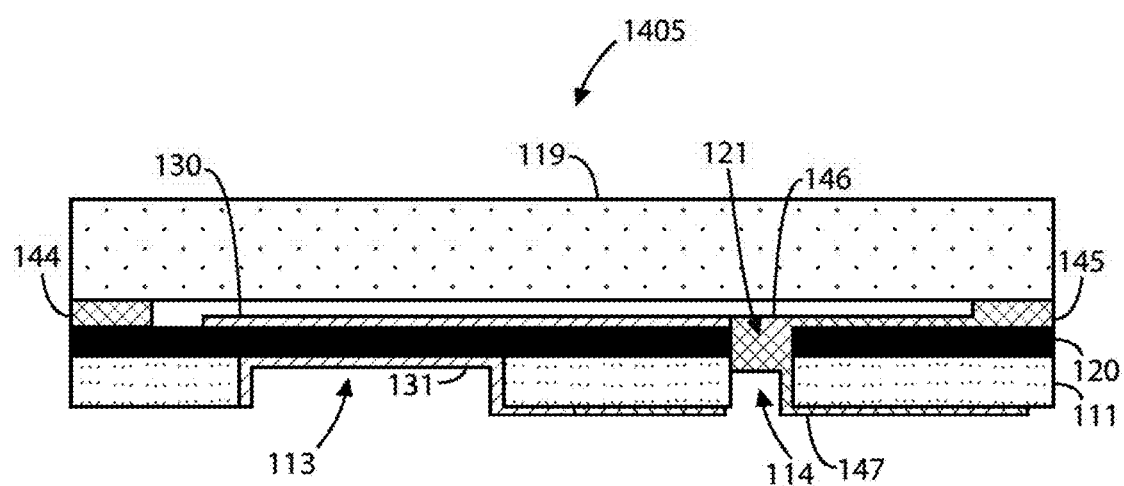
Figure 14F:
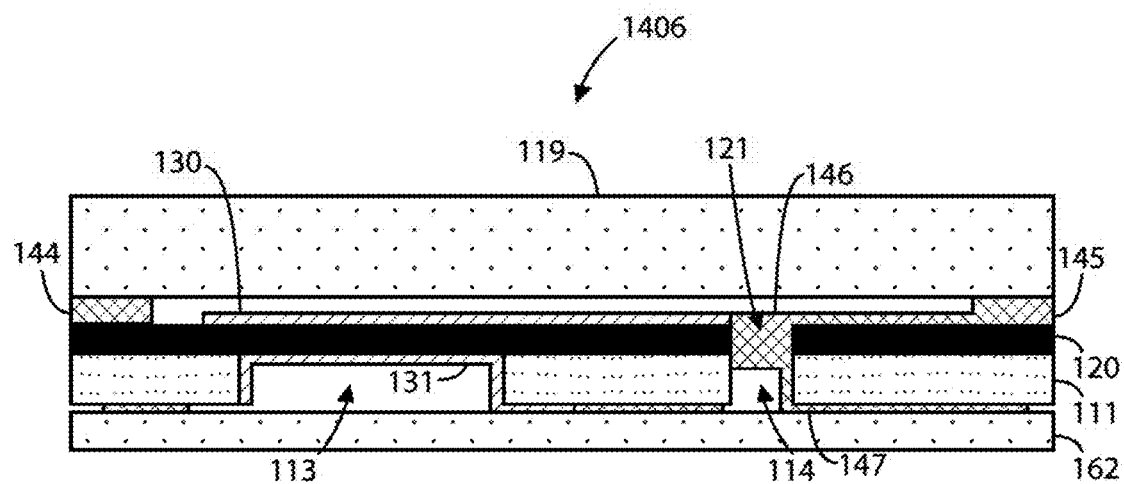

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
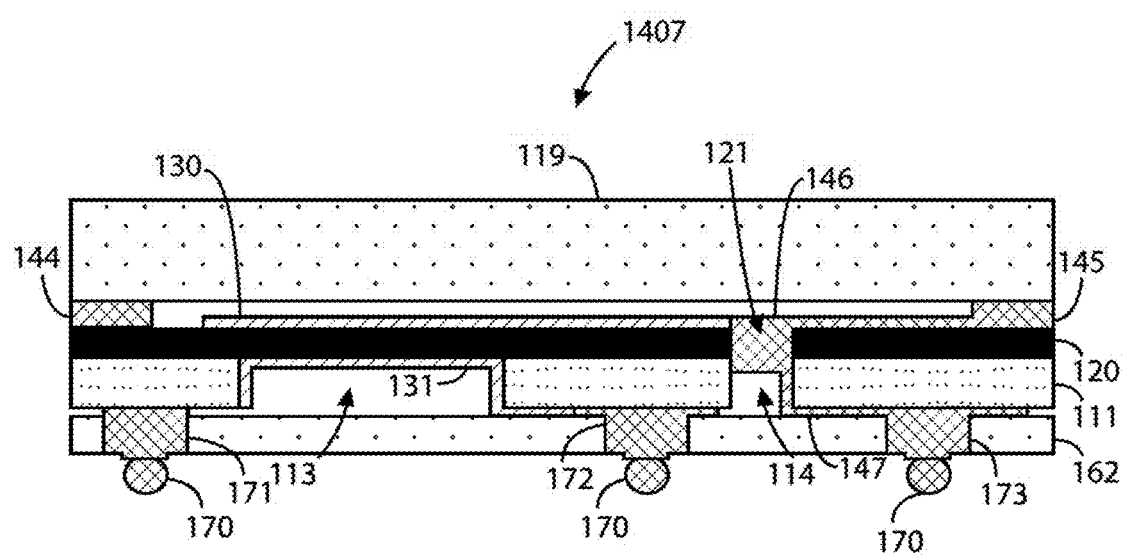

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
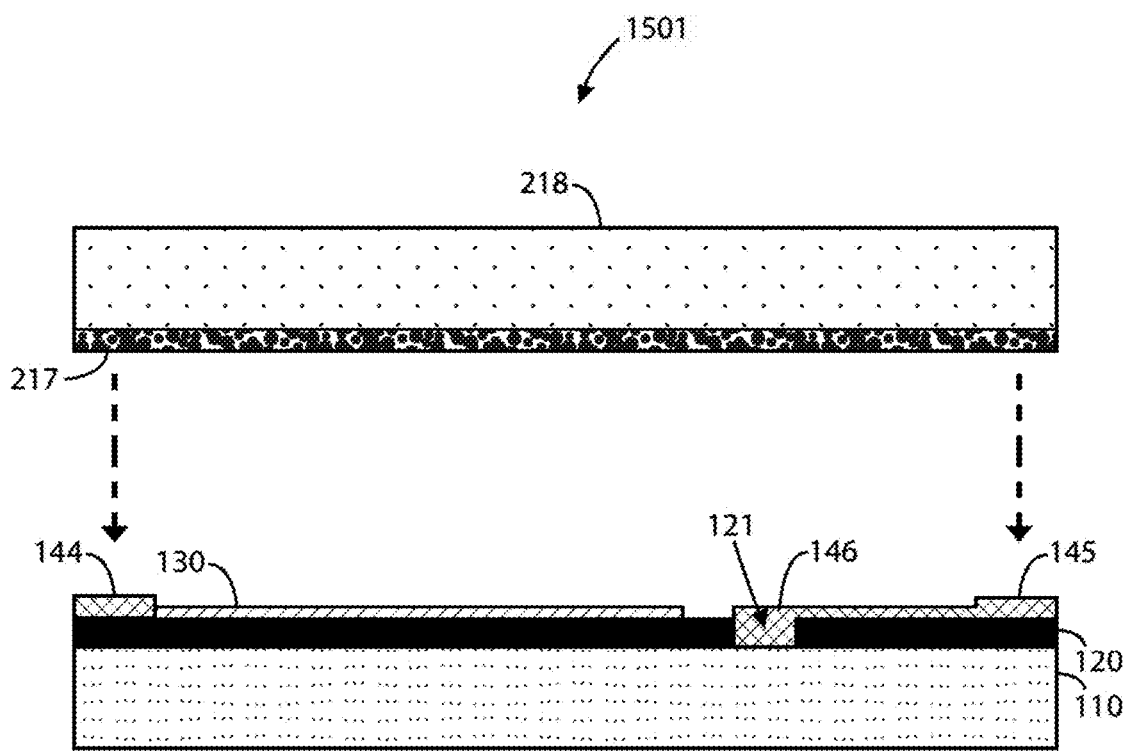
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
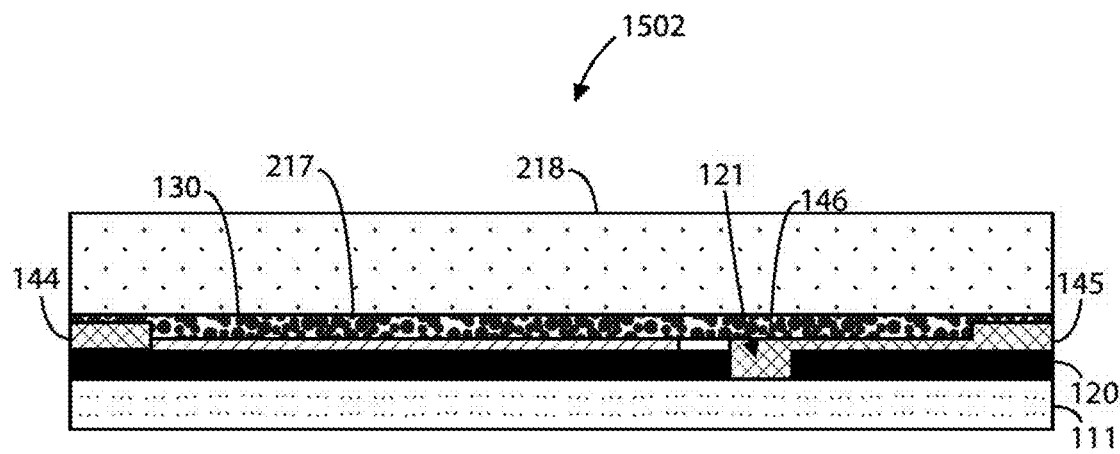

FIGS. 15B to 15F depict method steps similar to those described in the first process flow. FIG. 15B can represent a method step of thinning the seed substrate 110, which forms a thinned substrate 111, similar to that described in FIG. 8.

In a specific example, the thinning of the seed substrate 110 can include a back side grinding process followed by a stress removal process. The stress removal process can include a dry etch, a Chemical Mechanical Planarization (CMP), and annealing processes.

Figure 15C:
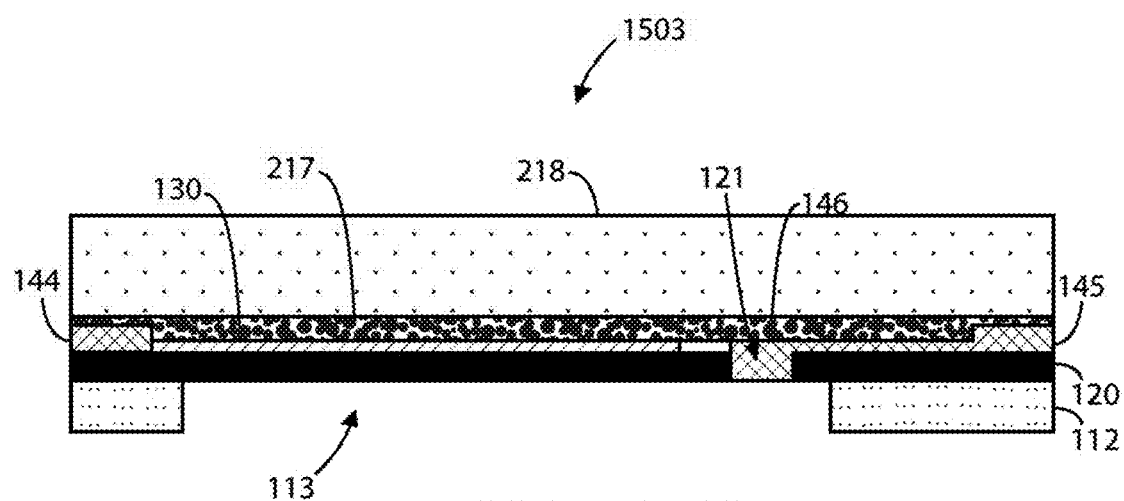

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
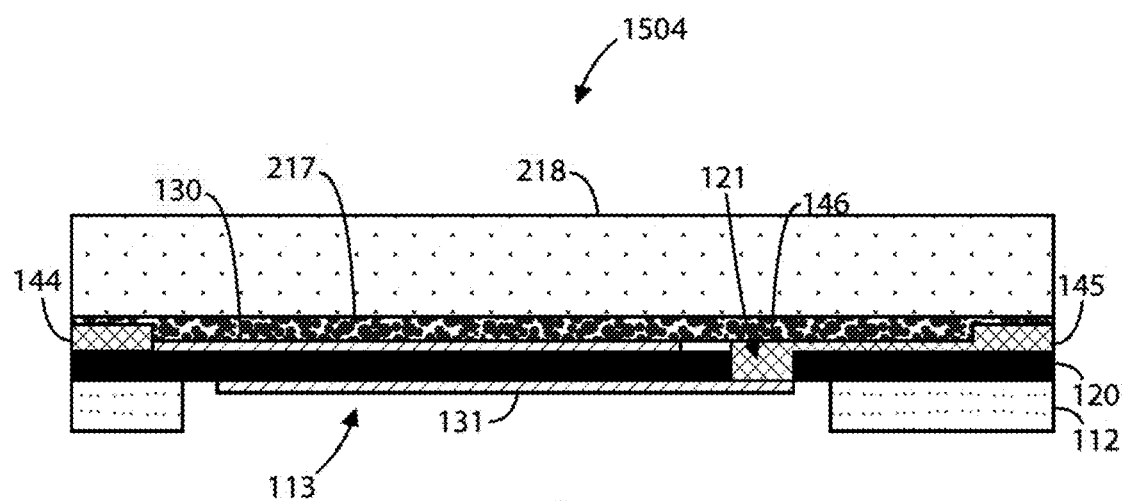

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
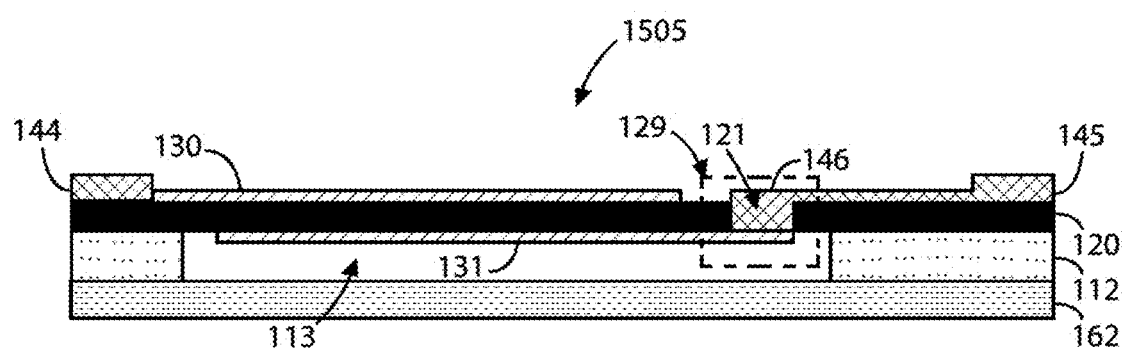

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave resonators (BAWR), widely used in such filters operating at frequencies around 3 GHz and lower, are leading candidates for meeting such demands. Current bulk acoustic wave resonators use polycrystalline piezoelectric AlN thin films where each grain's c-axis is aligned perpendicular to the film's surface to allow high piezoelectric performance whereas the grains' a- or b-axis are randomly distributed. This peculiar grain distribution works well when the piezoelectric film's thickness is around 1 um and above, which is the perfect thickness for bulk acoustic wave (BAW) filters operating at frequencies ranging from 1 to 3 GHz. However, the quality of the polycrystalline piezoelectric films degrades quickly as the thicknesses decrease below around 0.5 um, which is required for resonators and filters operating at frequencies around 5 GHz and above.

Single crystalline or epitaxial piezoelectric thin films grown on compatible crystalline substrates exhibit good crystalline quality and high piezoelectric performance even down to very thin thicknesses, e.g., 0.4 um. The present invention provides manufacturing processes and structures for high quality bulk acoustic wave resonators with single crystalline or epitaxial piezoelectric thn films for high frequency BAW filter applications.

BAWRs require a piezoelectric material, e.g., AlN, in crystalline form, i.e., polycrystalline or single crystalline. The quality of the film heavy depends on the chemical, crystalline, or topographical quality of the layer on which the film is grown. In conventional BAWR processes (including film bulk acoustic resonator (FBAR) or solidly mounted resonator (SMR) geometry), the piezoelectric film is grown on a patterned bottom electrode, which is usually made of molybdenum (Mo), tungsten (W), or ruthenium (Ru). The surface geometry of the patterned bottom electrode significantly influences the crystalline orientation and crystalline quality of the piezoelectric film, requiring complicated modification of the structure.

Thus, the present invention uses single crystalline piezoelectric films and thin film transfer processes to produce a BAWR with enhanced ultimate quality factor and electromechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers limit Q in high frequency. Also, growing epitaxial piezoelectric layers on patterned electrodes affects the crystalline orientation of the piezoelectric layer, which limits the ability to have tight boundary control of the resulting resonators. Embodiments of the present invention, as further described below, can overcome these limitations and exhibit improved performance and cost-efficiency.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 16C:
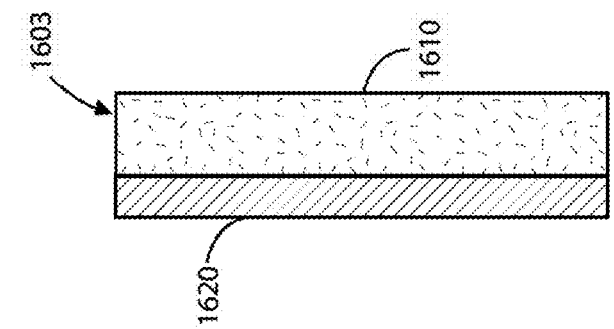
Figure 16A:
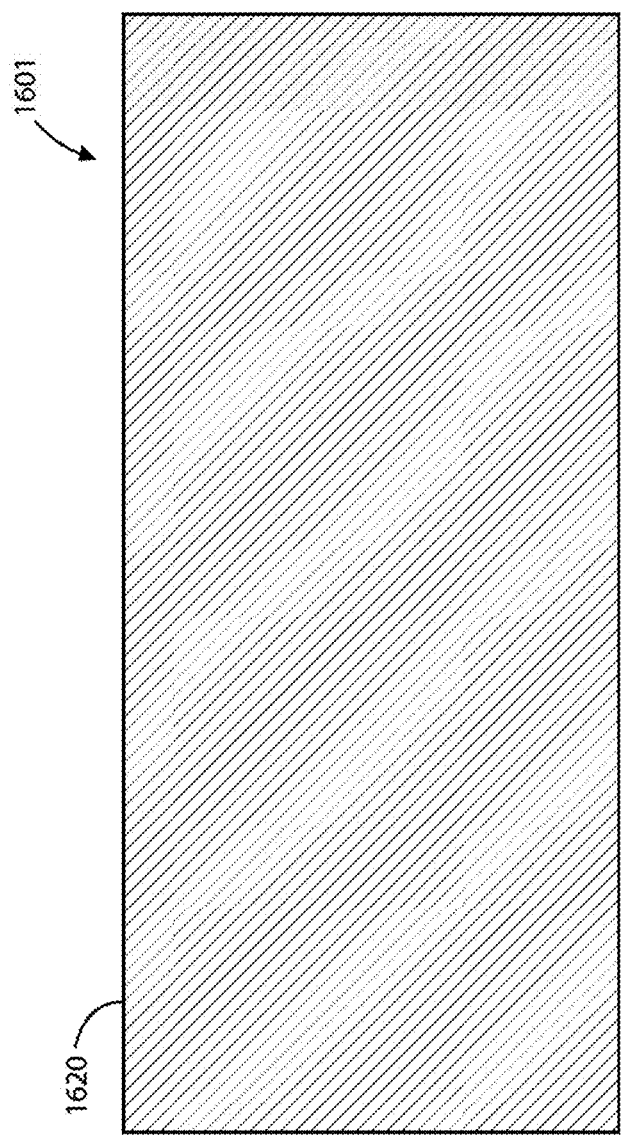
Figure 16B:
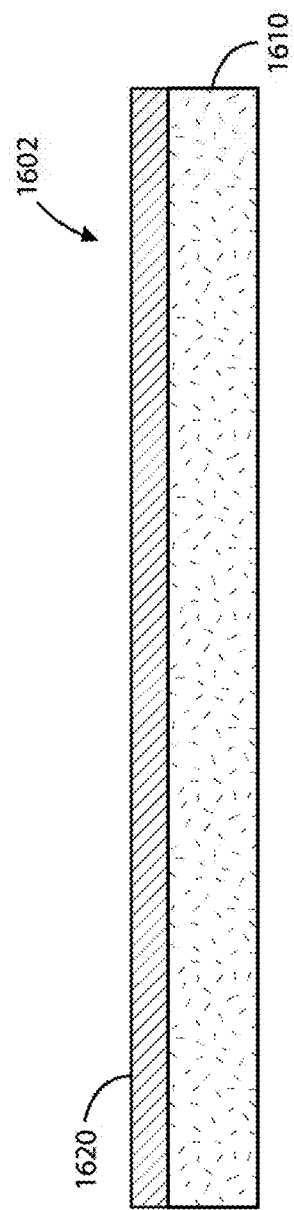

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric film 1620 overlying a growth substrate 1610. In an example, the growth substrate 1610 can include silicon (S), silicon carbide (SiC), or other like materials. The piezoelectric film 1620 can be an epitaxial film including aluminum nitride (AlN), gallium nitride (GaN), or other like materials. Additionally, this piezoelectric substrate can be subjected to a thickness trim.

Figure 17C:
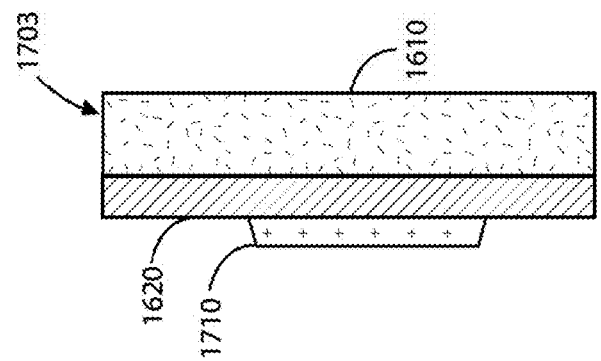
Figure 17A:
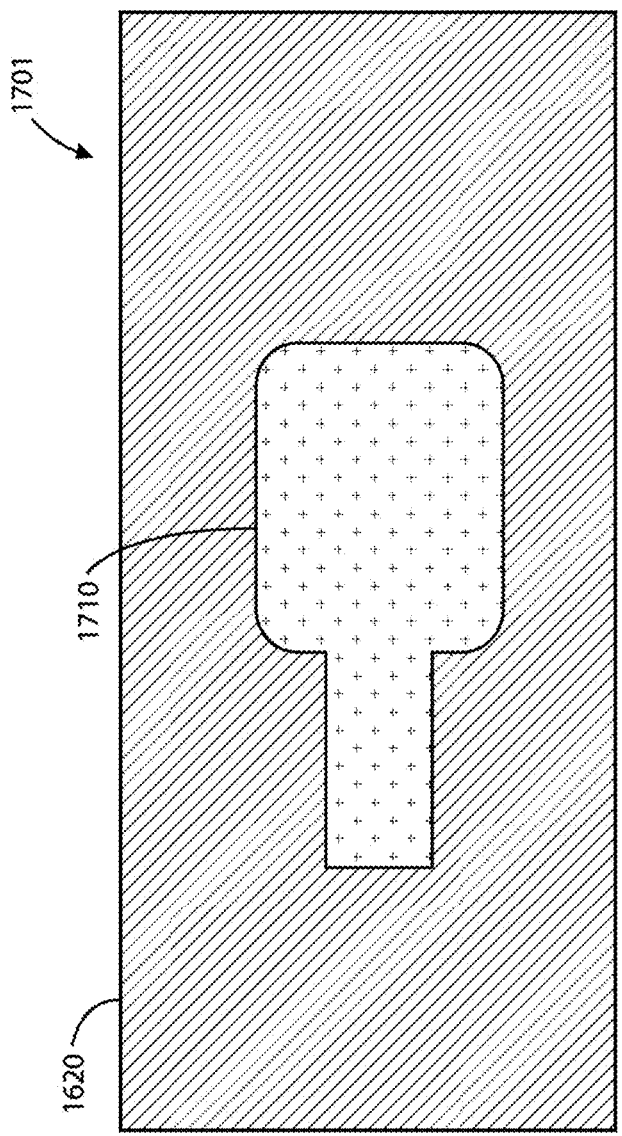
Figure 17B:
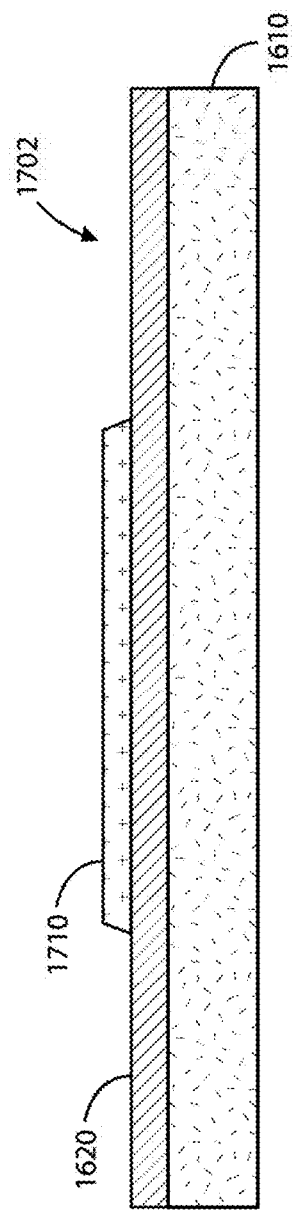

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

Figure 18C:
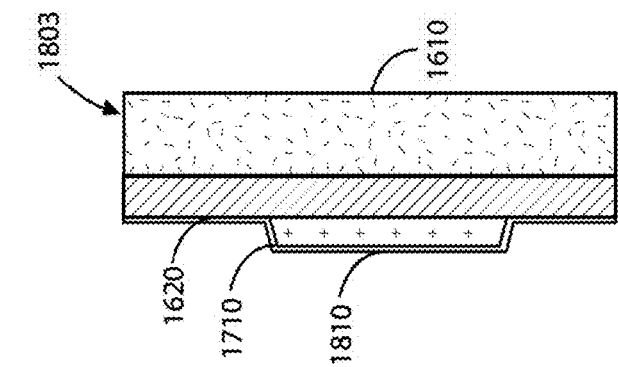
Figure 18A:
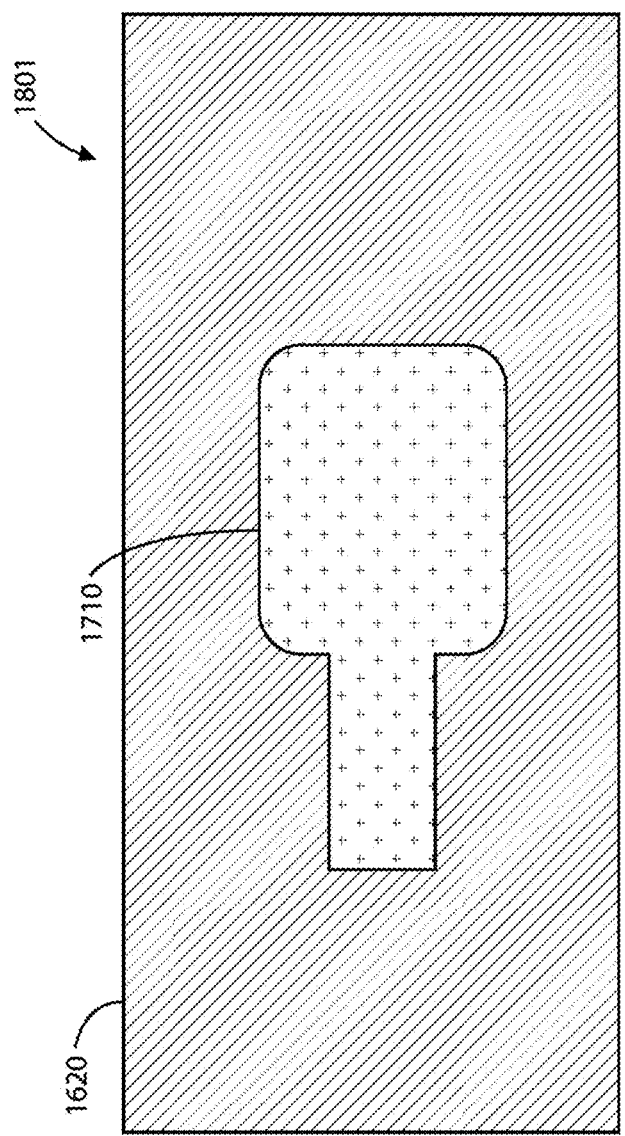
Figure 18B:
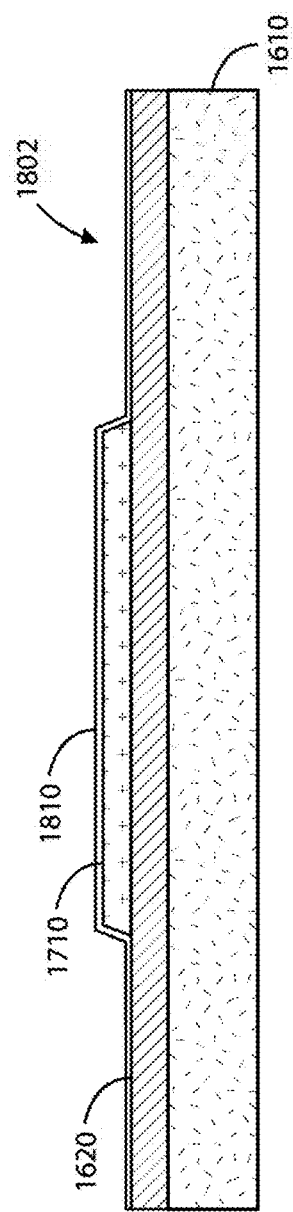

FIGS. 18A-18C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric film 1620. In an example, the first passivation layer 1810 can include silicon nitride (SiN), silicon oxide ($SiO_x$), or other like materials. In a specific example, the first passivation layer 1810 can have a thickness ranging from about 50 nm to about 100 nm.

Figure 19C:
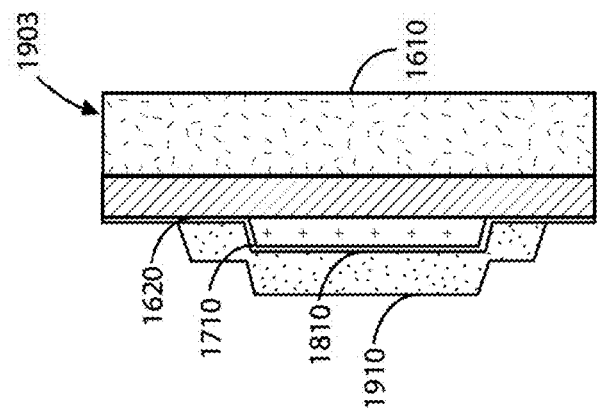
Figure 19A:
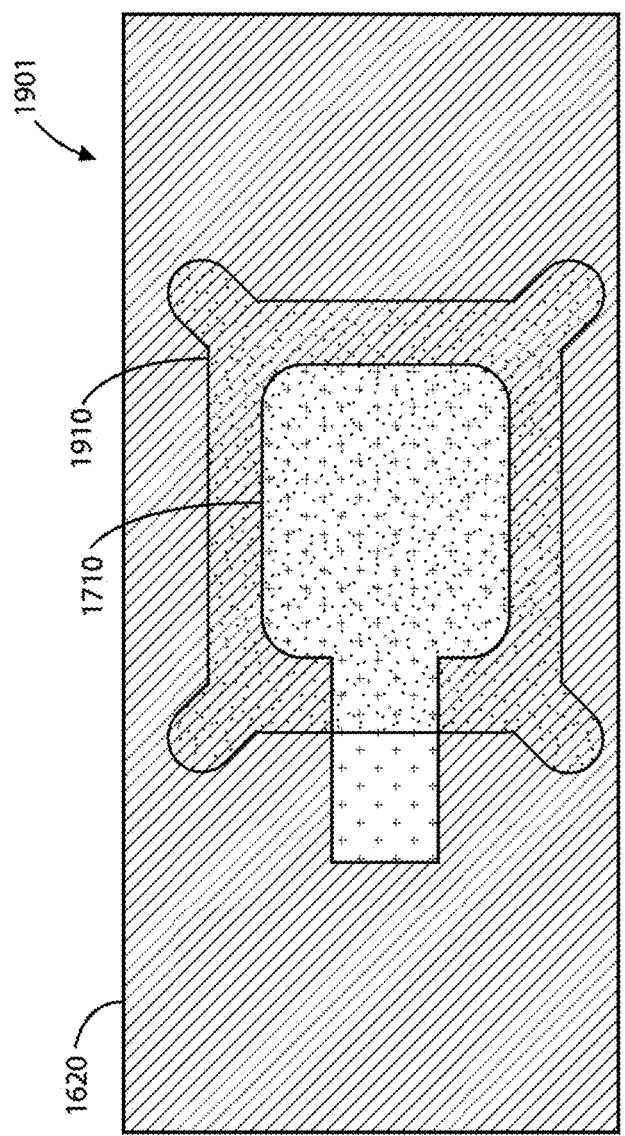
Figure 19B:
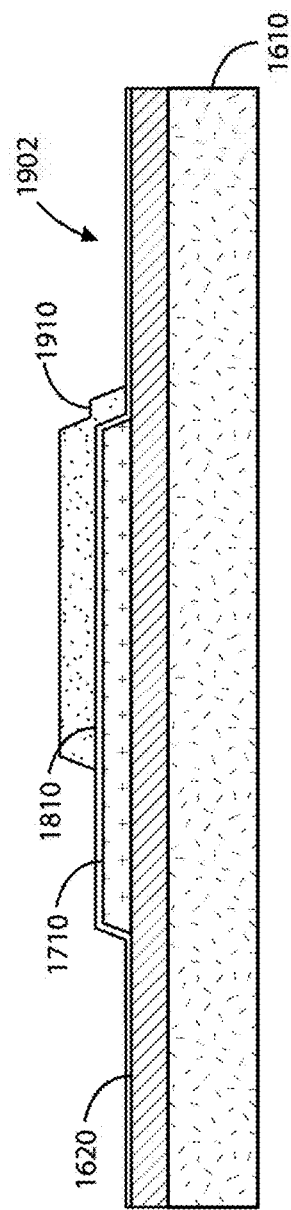

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch with a slope and be deposited with a thickness of about 1 um. Further, phosphorous doped $SiO_2$ (PSG) can be used as the sacrificial layer with different combinations of support layer (e.g., $SiN_x$).

Figure 20C:
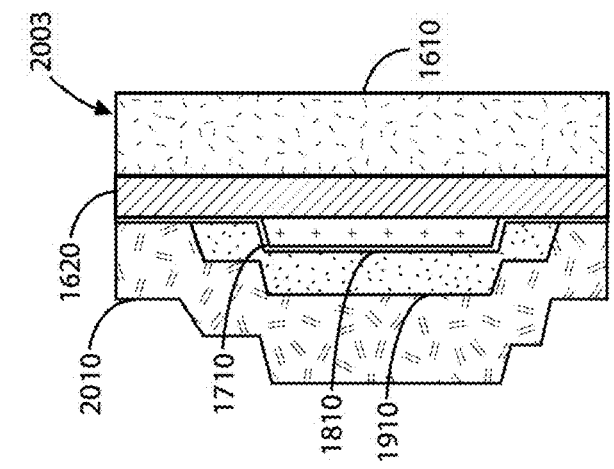
Figure 20A:
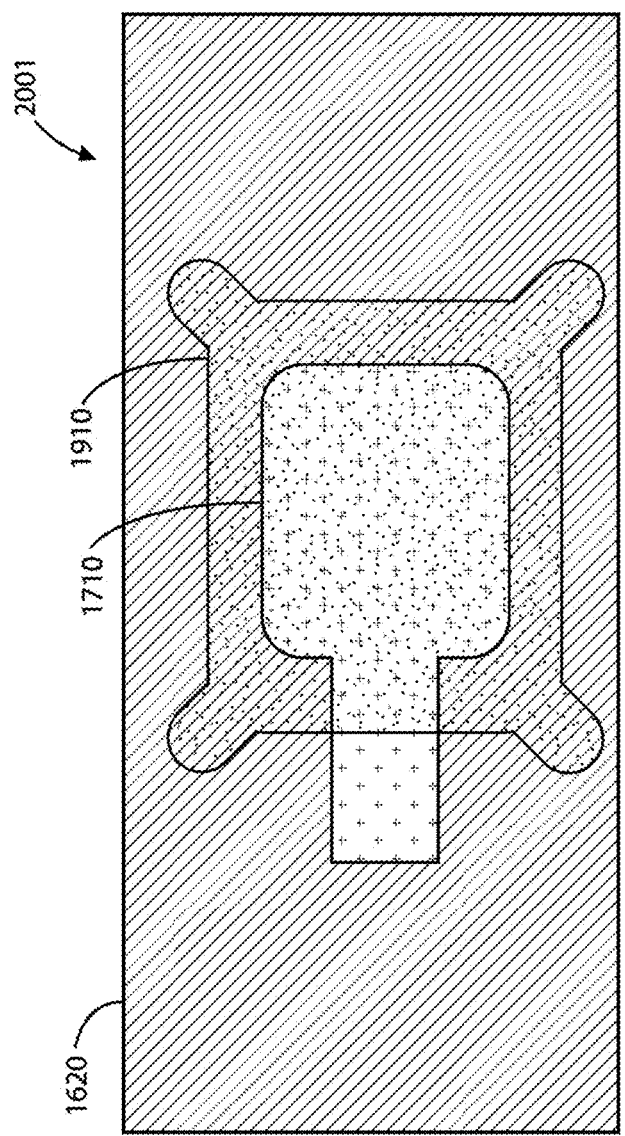
Figure 20B:
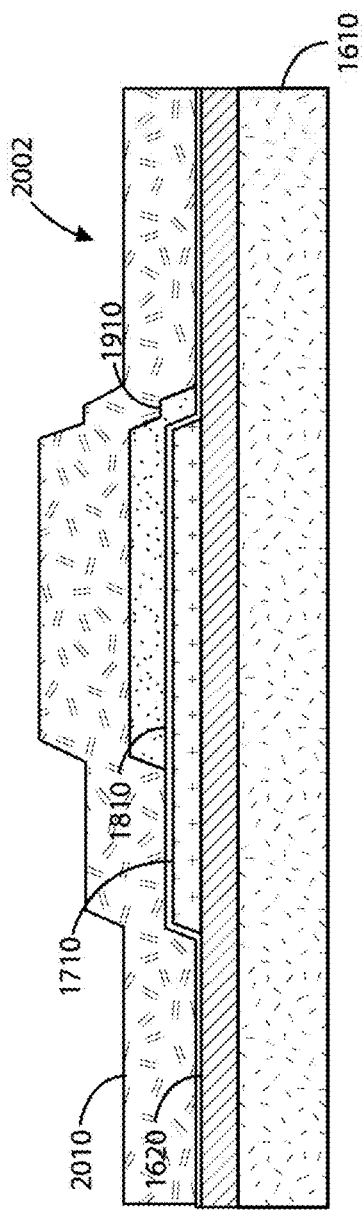

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric film 1620. In an example, the support layer 2010 can include silicon dioxide ($SiO_2$), silicon nitride (SiN), or other like materials. In a specific example, this support layer 2010 can be deposited with a thickness of about 2-3 um. As described above, other support layers (e.g., $SiN_x$) can be used in the case of a PSG sacrificial layer.

Figure 21C:
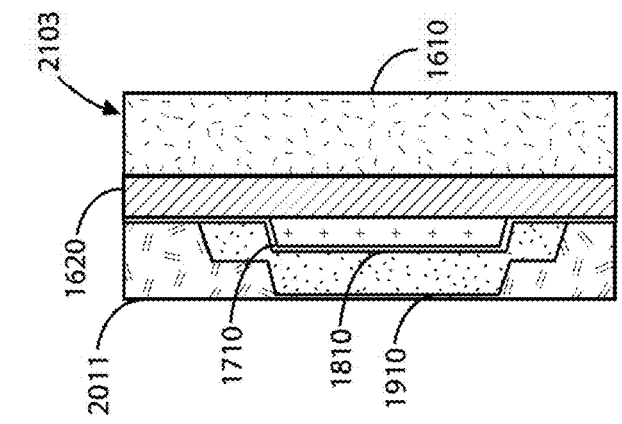
Figure 21A:
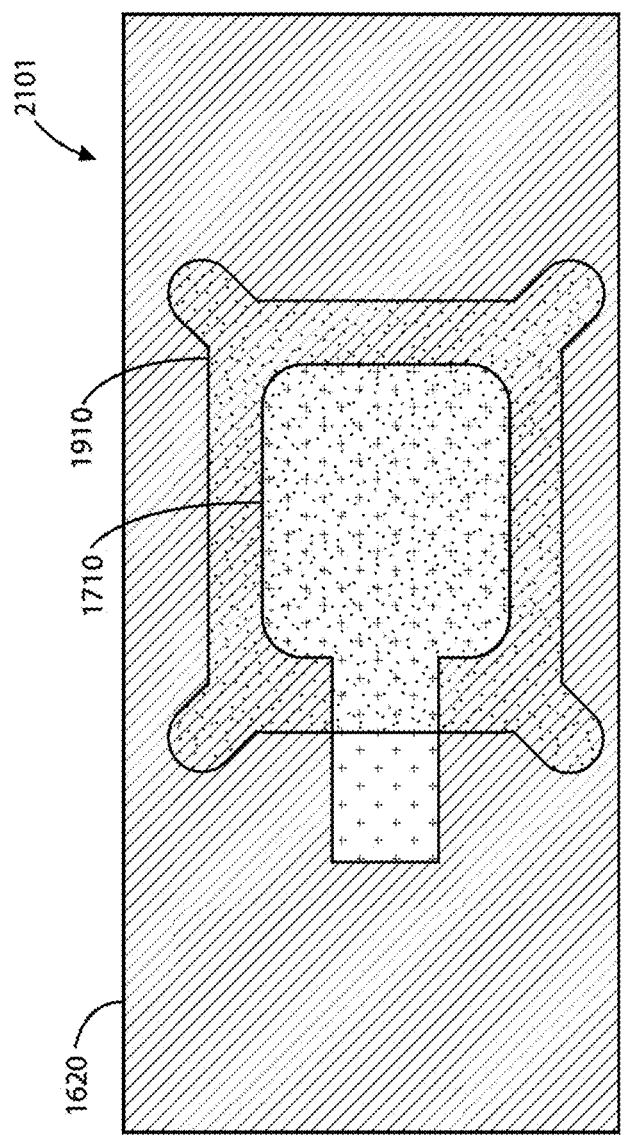
Figure 21B:
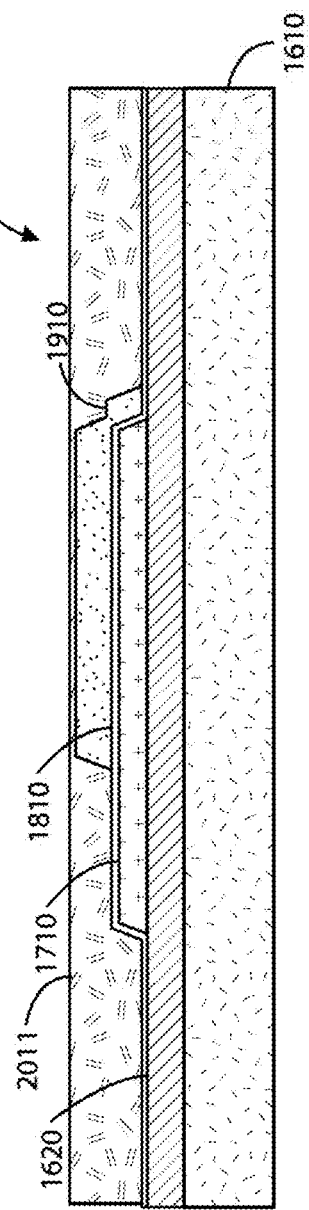

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

FIGS. 22A-22C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 2220 of the bond substrate 2210 is physically coupled to the polished support layer 2011. Further, the physical coupling process can include a room temperature bonding process following by a 300 degree Celsius annealing process.

Figure 23C:
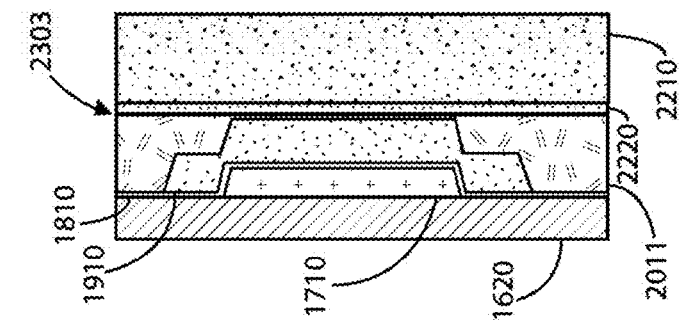
Figure 23A:
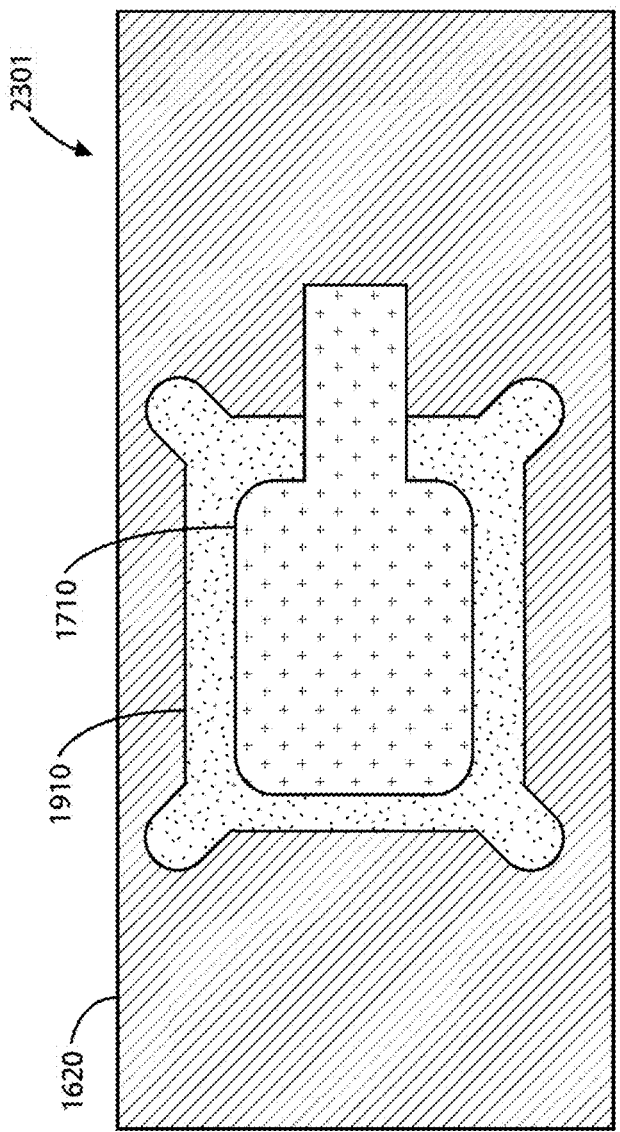
Figure 23B:
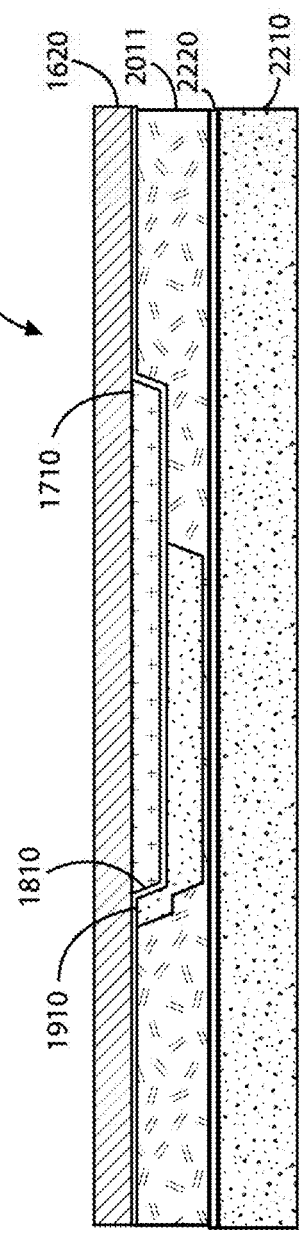

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric film 1620. In an example, the removal process can include a grinding process, a blanket etching process, a film transfer process, an ion implantation transfer process, a laser crack transfer process, or the like and combinations thereof.

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types of etching processes.

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

Figure 26C:
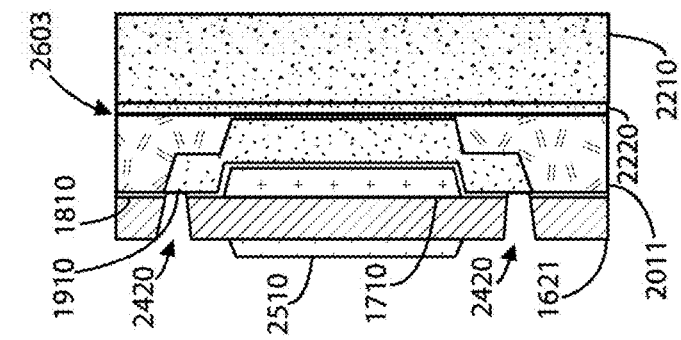
Figure 26A:
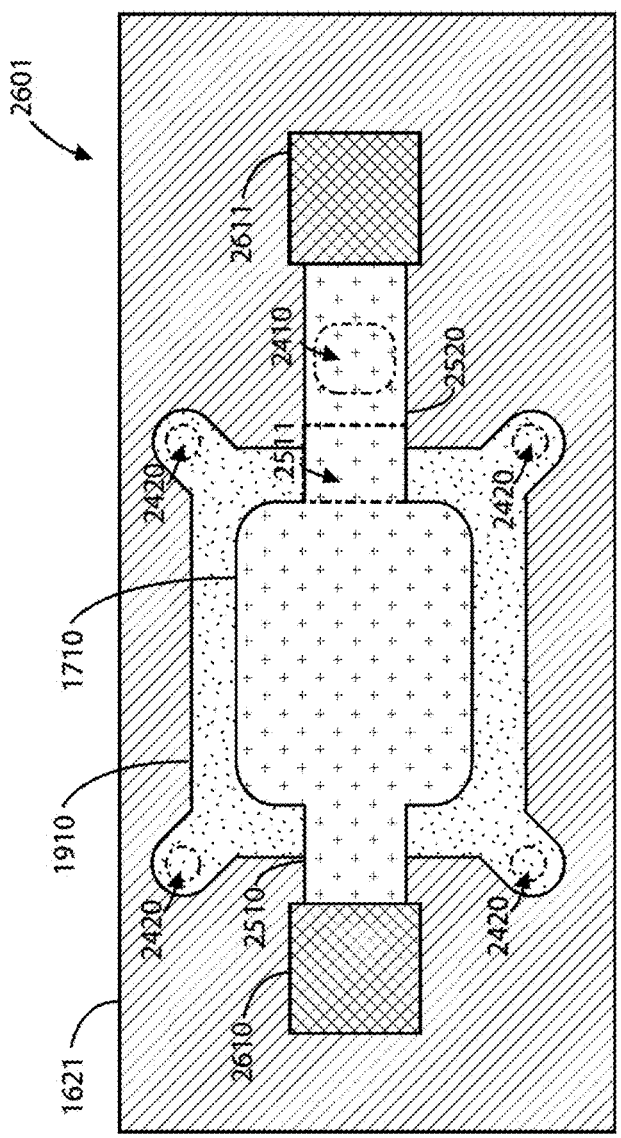
Figure 26B:
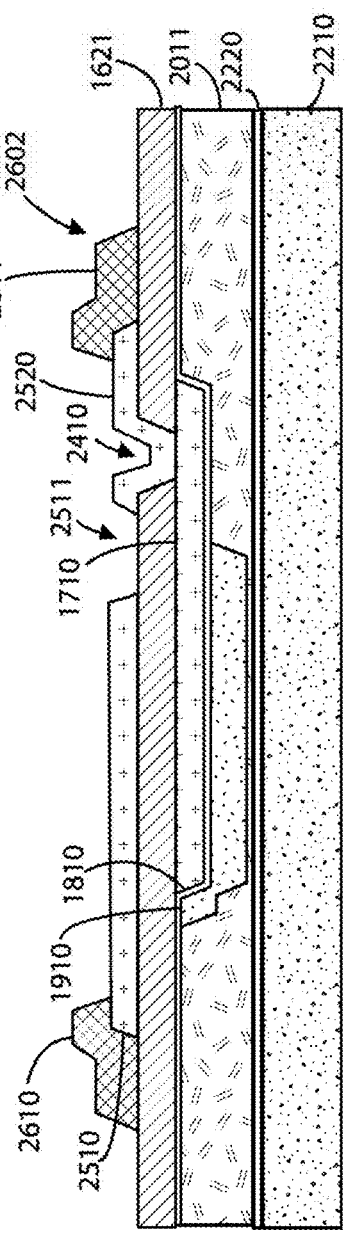

FIGS. 26A-26C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

Figure 27C:
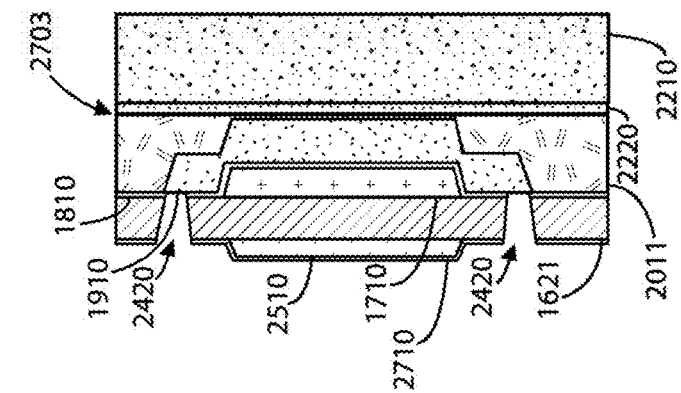
Figure 27A:
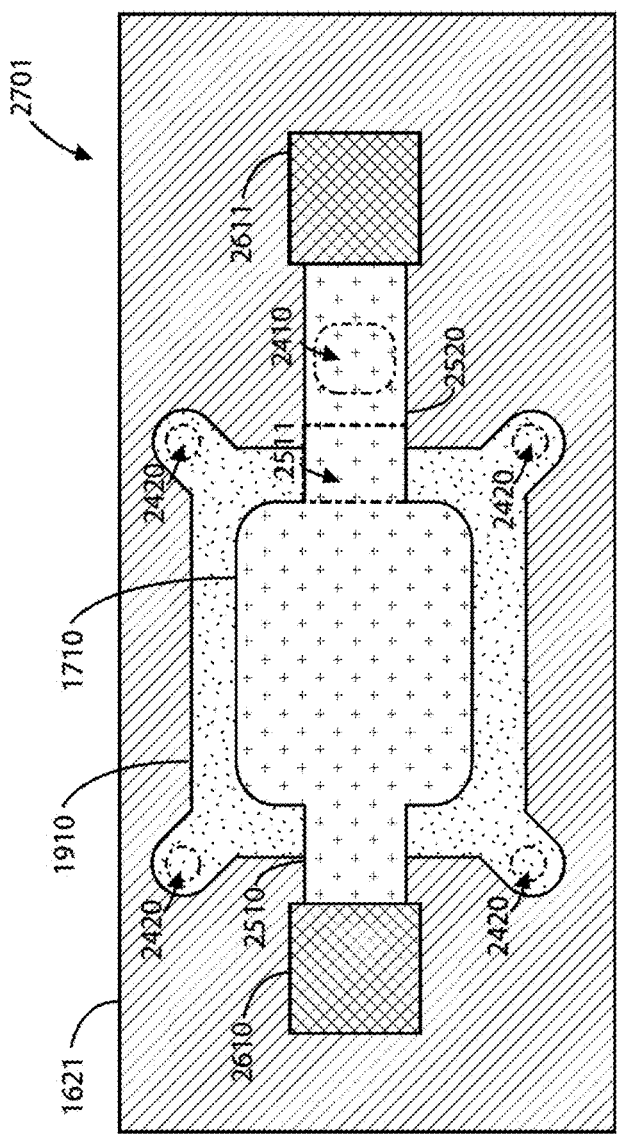
Figure 27B:
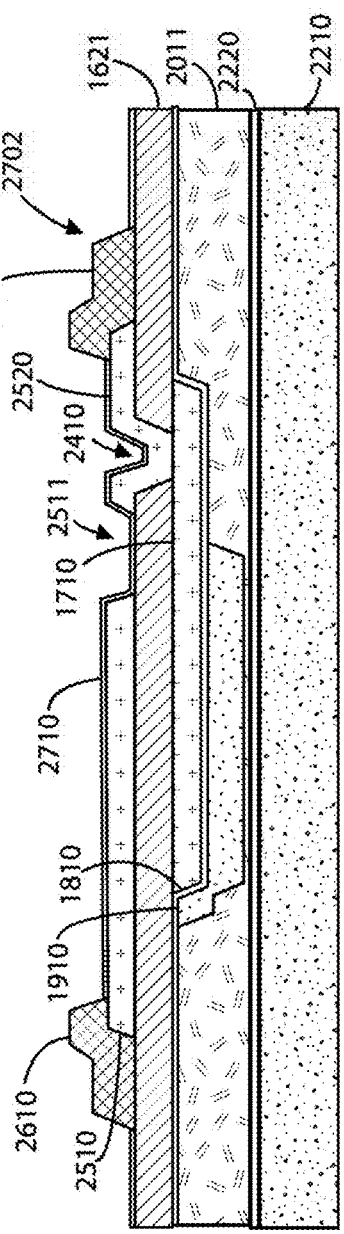

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide ($SiO_x$), or other like materials. In a specific example, the second passivation layer 2710 can have a thickness ranging from about 50 nm to about 100 nm.

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials; and then etching (e.g., dry etch or the like) this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

Figure 30C:
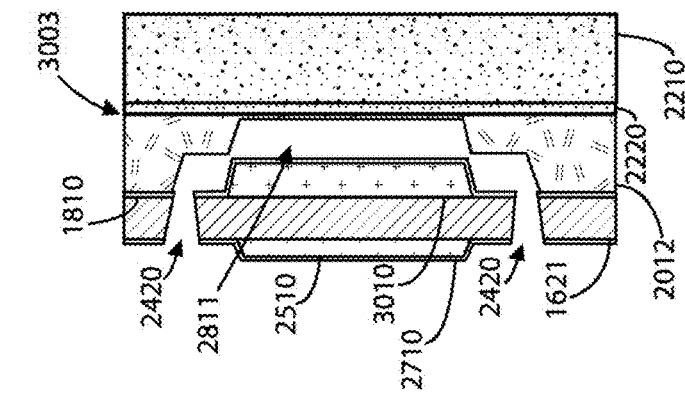
Figure 30A:
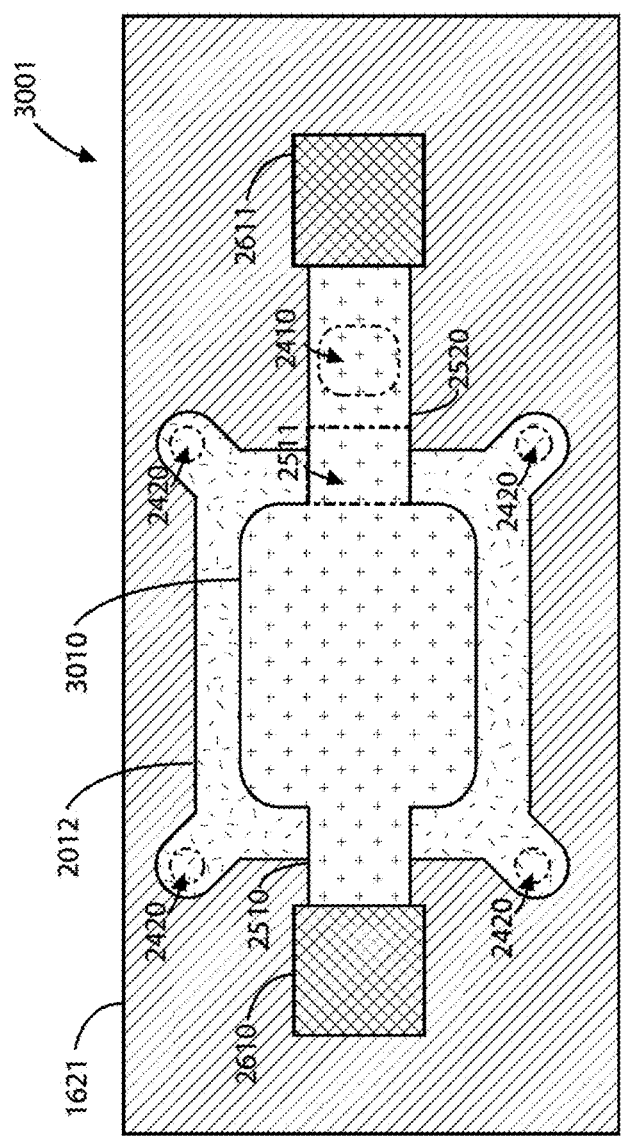
Figure 30B:
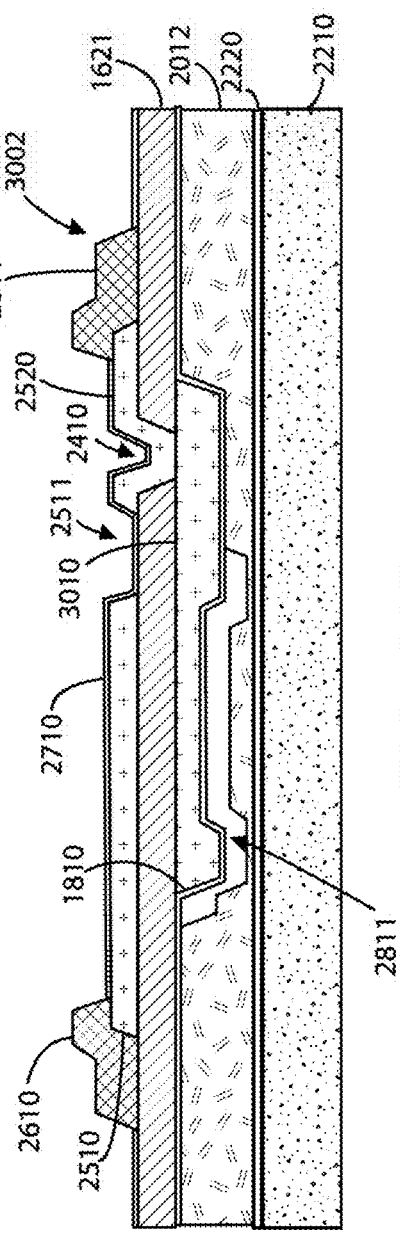

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
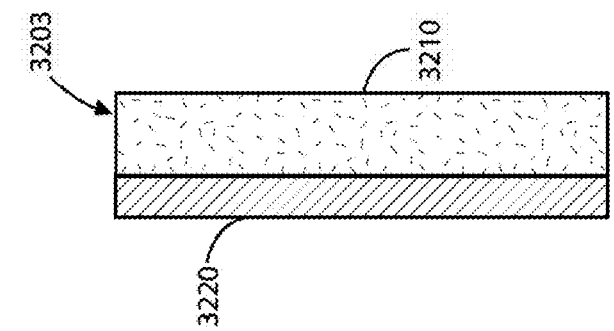
Figure 32A:
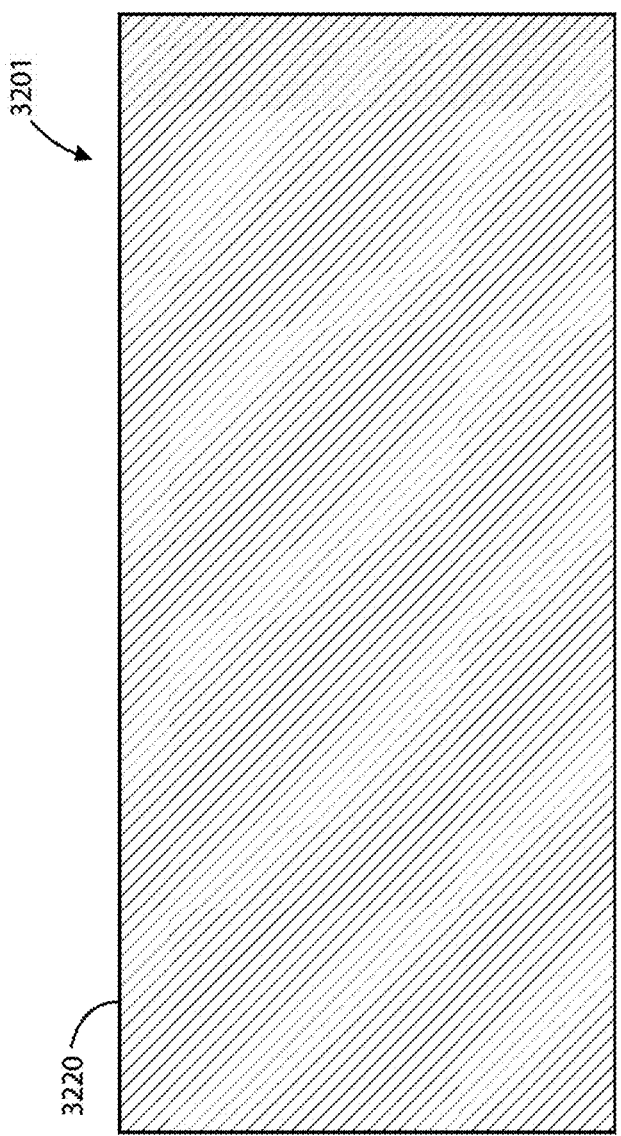
Figure 32B:
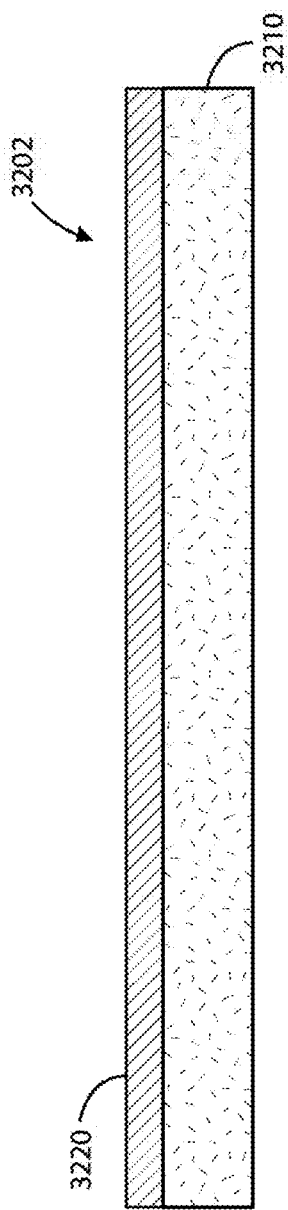

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials. The piezoelectric film 3220 can be an epitaxial film including aluminum nitride (AlN), gallium nitride (GaN), or other like materials. Additionally, this piezoelectric substrate can be subjected to a thickness trim.

Figure 33C:
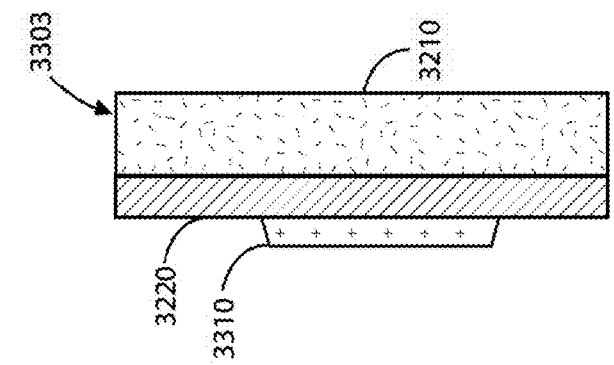
Figure 33A:
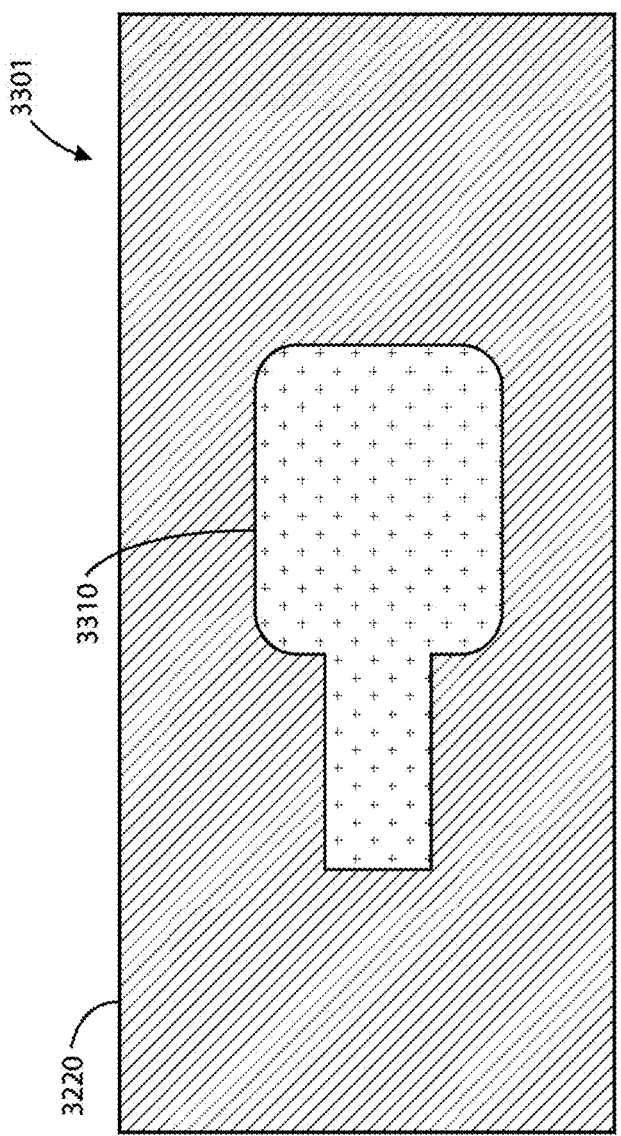
Figure 33B:
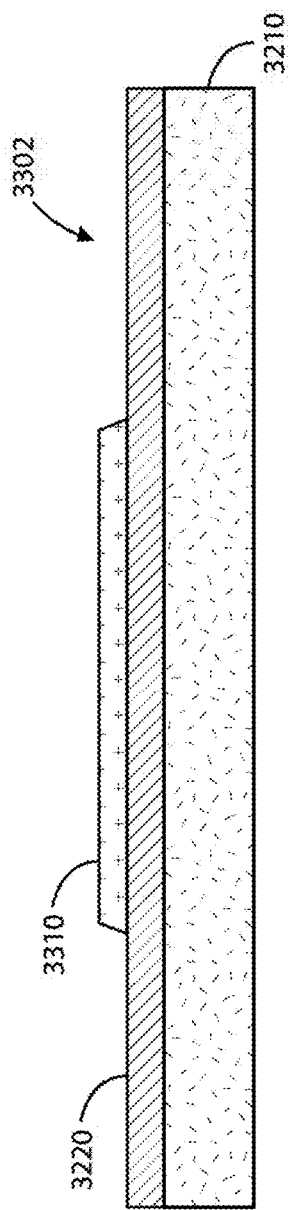

FIGS. 33A-33C are simplified diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide ($SiO_x$), or other like materials. In a specific example, the first passivation layer 3410 can have a thickness ranging from about 50 nm to about 100 nm.

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide ($SiO_2$), silicon nitride (SiN), or other like materials. In a specific example, this support layer 3510 can be deposited with a thickness of about 2-3 um. As described above, other support layers (e.g., $SiN_x$) can be used in the case of a PSG sacrificial layer.

Figure 36C:
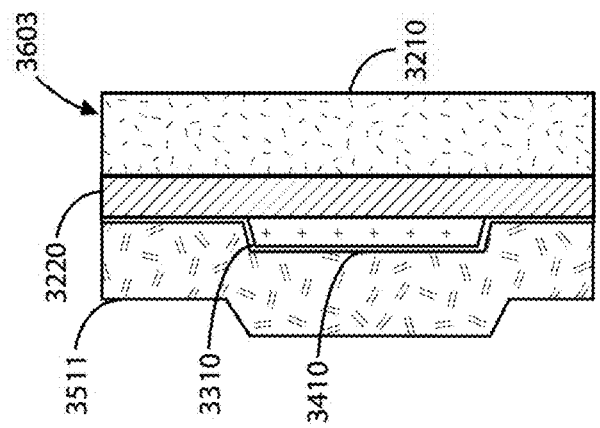
Figure 36A:
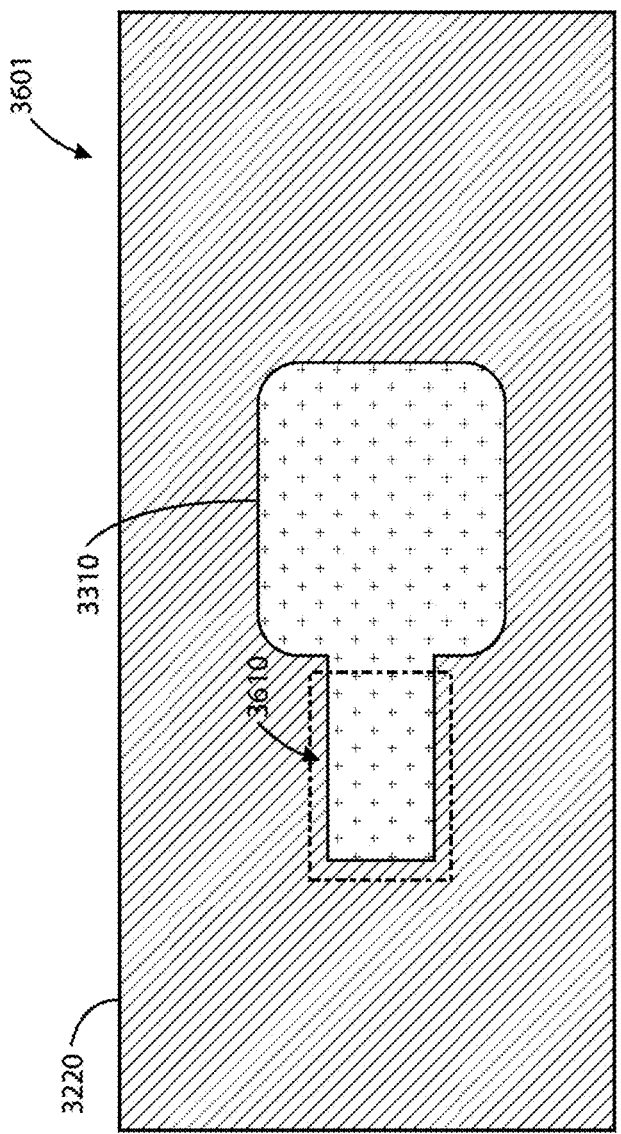
Figure 36B:
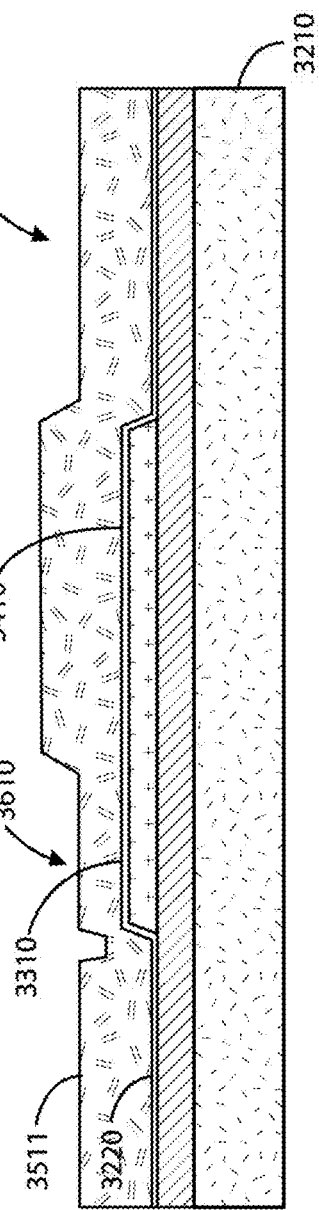

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

Figure 37C:
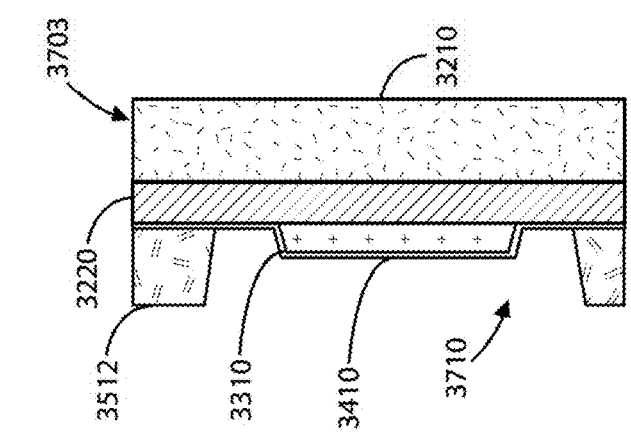
Figure 37A:
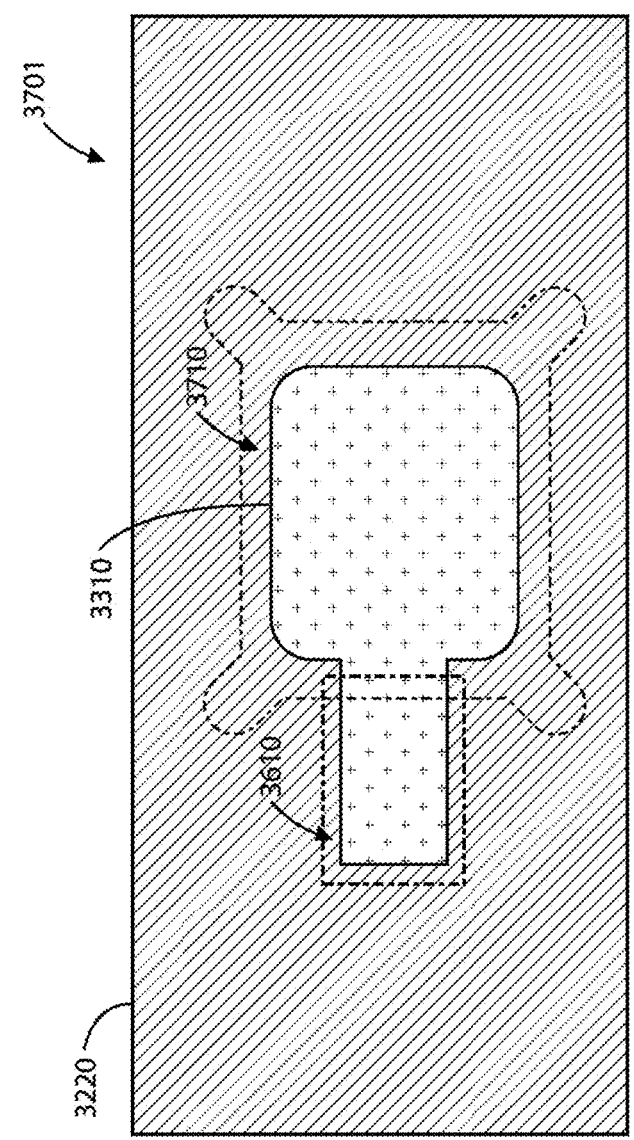
Figure 37B:
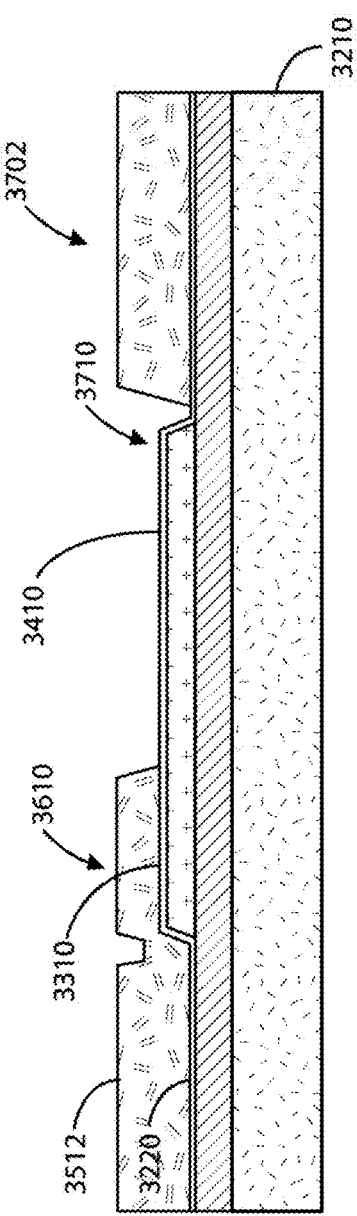

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 3920 of the bond substrate 3910 is physically coupled to the polished support layer 3512. Further, the physical coupling process can include a room temperature bonding process following by a 300 degree Celsius annealing process.

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying a portion of the second electrode 4210 and a portion of the piezoelectric film 3220, and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide ($SiO_x$), or other like materials. In a specific example, the second passivation layer 4320 can have a thickness ranging from about 50 nm to about 100 nm.

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
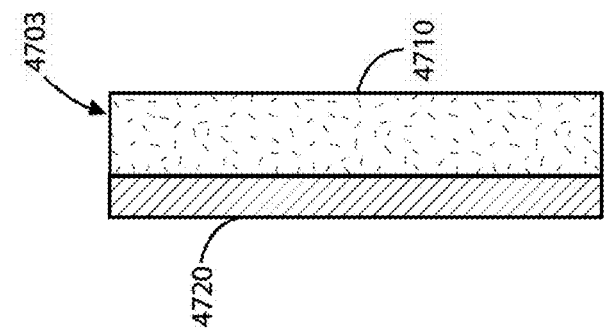
FIGS. 47A-47C though
Figure 47A:
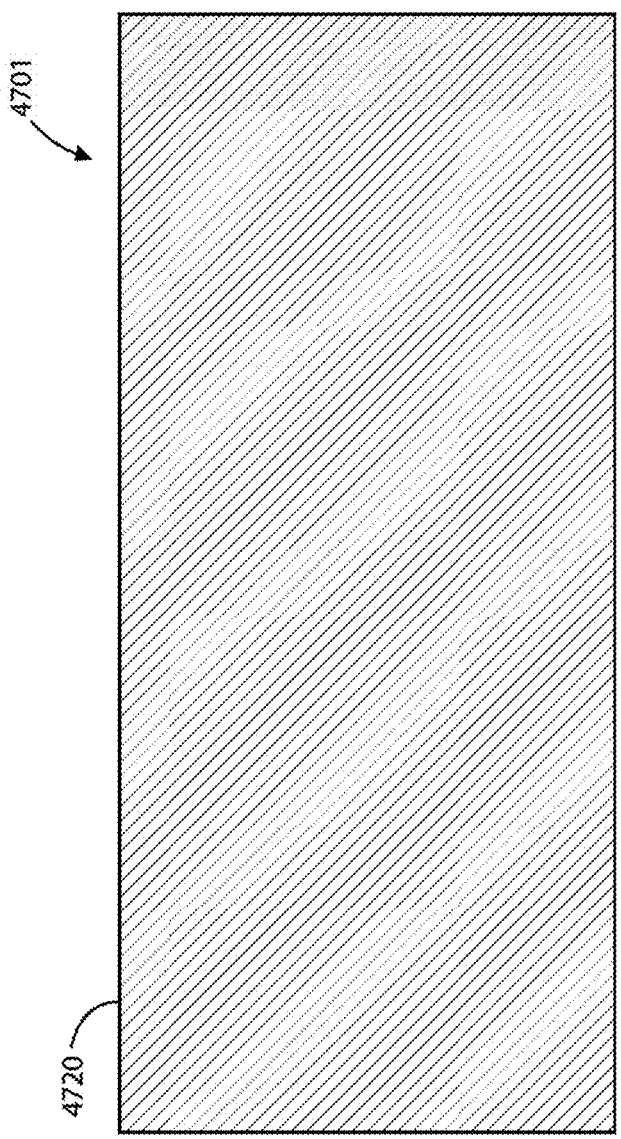
Figure 47B:
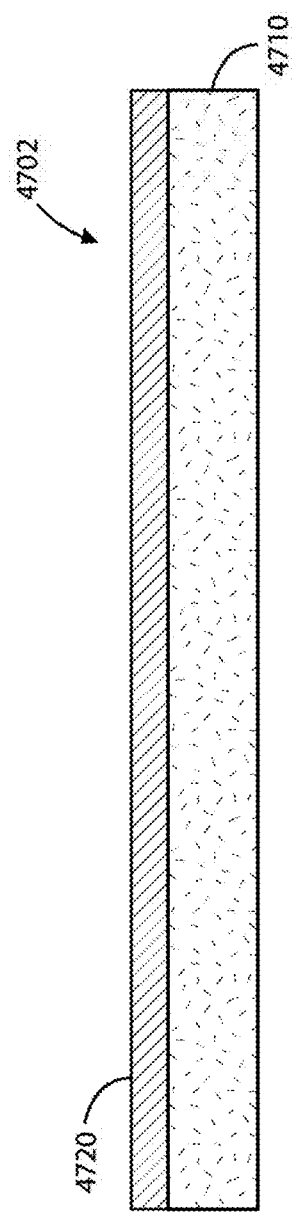

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC), or other like materials. The piezoelectric film 4720 can be an epitaxial film including aluminum nitride (AlN), gallium nitride (GaN), or other like materials. Additionally, this piezoelectric substrate can be subjected to a thickness trim.

Figure 48C:
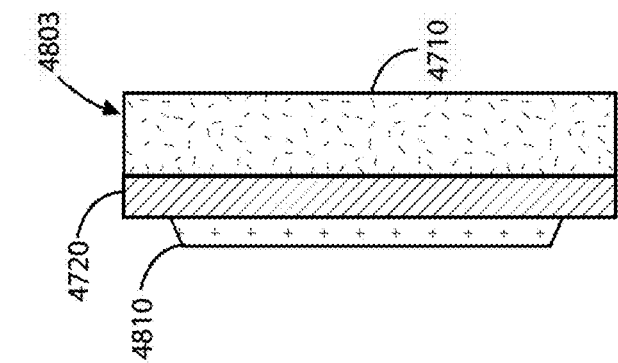
Figure 48A:
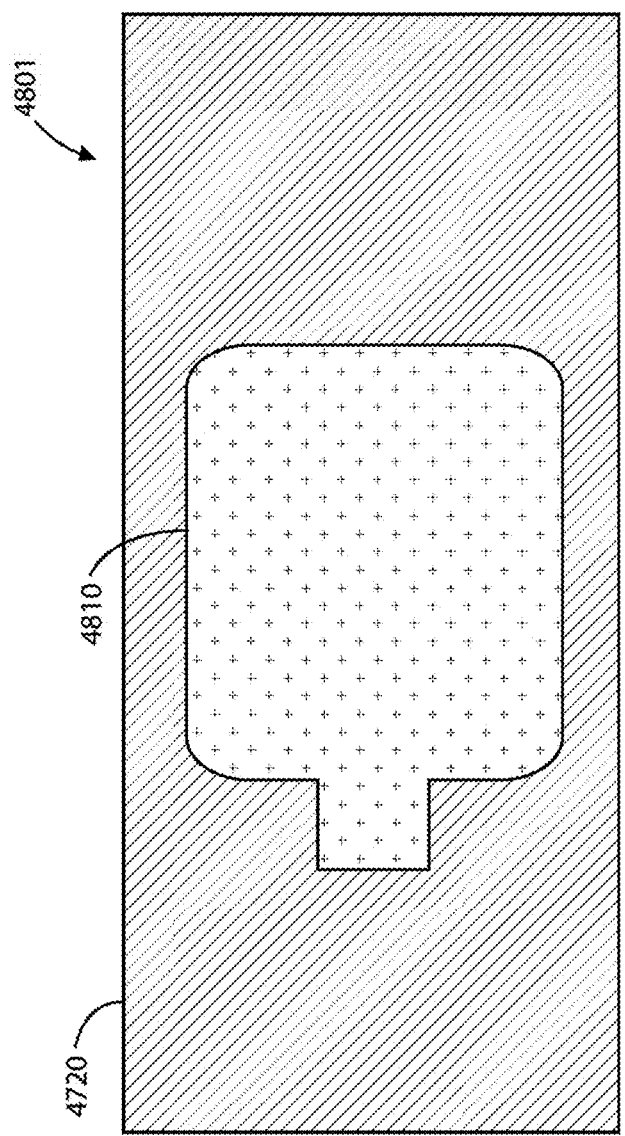
Figure 48B:
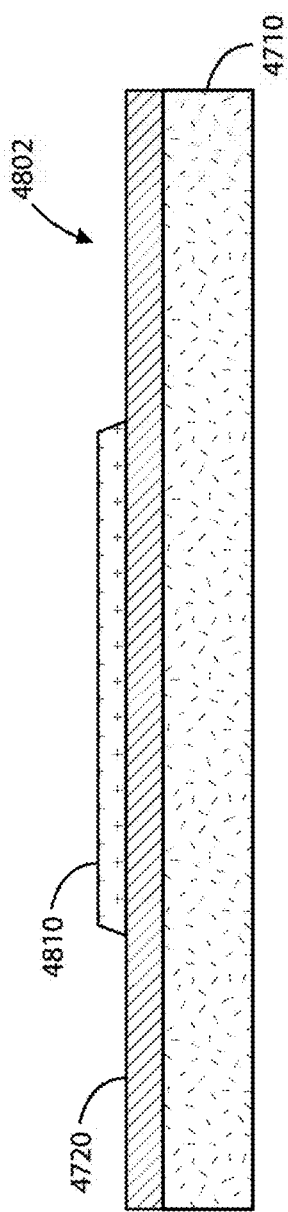

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide ($SiO_2$), silicon nitride (SiN), or other like materials. In a specific example, this support layer 5010 can be deposited with a thickness of about 2-3 um. As described above, other support layers (e.g., $SiN_x$) can be used.

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support layer 5010 to form a polished support layer 5011. In an example, the polishing process can include a chemical-mechanical planarization process or the like.

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 5220 of the bond substrate 5210 is physically coupled to the polished support layer 5011. Further, the physical coupling process can include a room temperature bonding process following by a 300 degree Celsius annealing process.

Figure 53C:
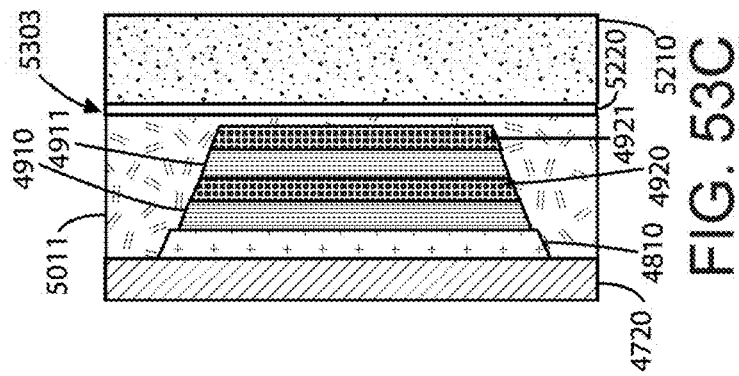
Figure 53A:
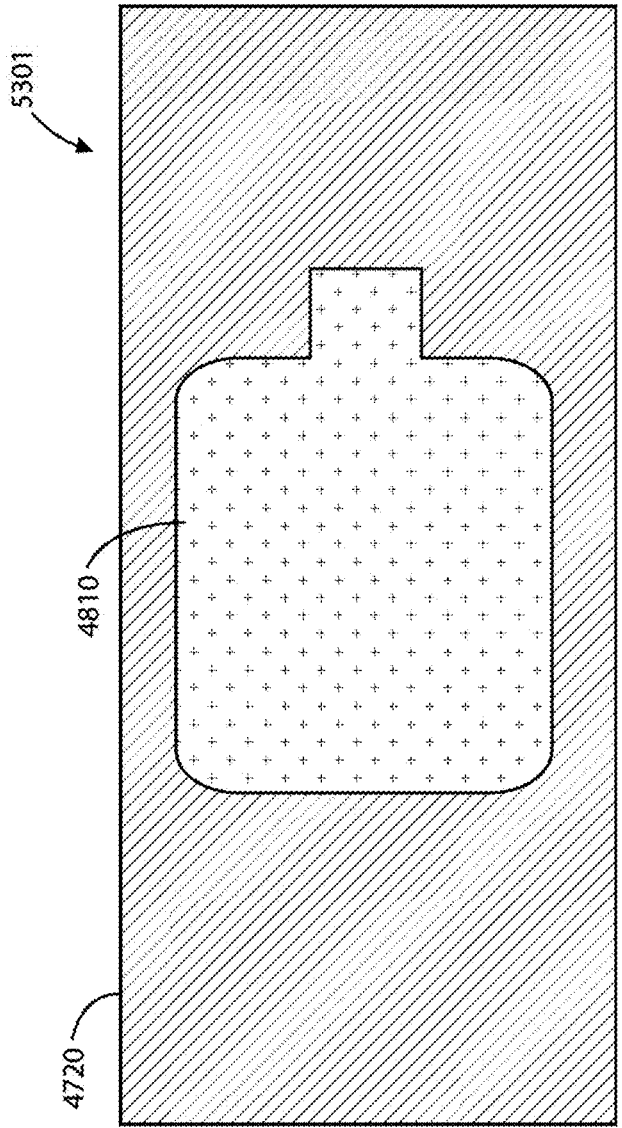
Figure 53B:
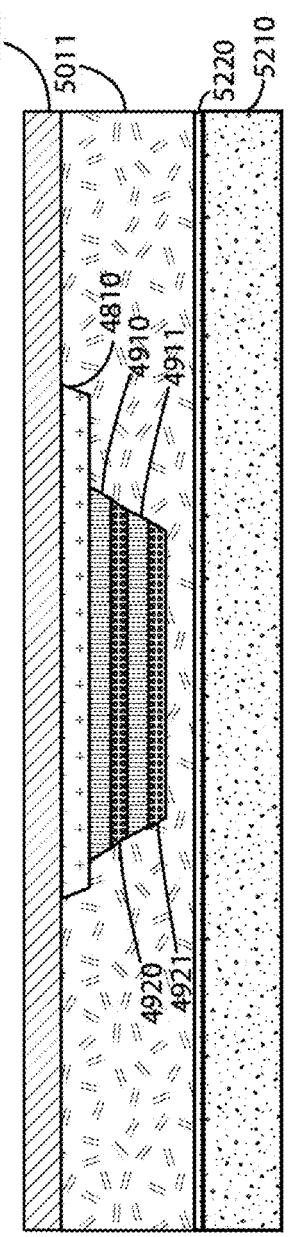

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric film 4720. In an example, the removal process can include a grinding process, a blanket etching process, a film transfer process, an ion implantation transfer process, a laser crack transfer process, or the like and combinations thereof.

FIGS. 54A-54C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

FIGS. 56A-56C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), silicon oxide ($SiO_x$), or other like materials. In a specific example, the second passivation layer 5620 can have a thickness ranging from about 50 nm to about 100 nm.

FIGS. 57A-57C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second electrode 5710 and top metal 5720. In an example, the processing of these two components includes depositing molybdenum (Mo), ruthenium (Ru), tungsten (W), or other like materials; and then etching (e.g., dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

FIGS. 58A-58C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

Figure 59C:
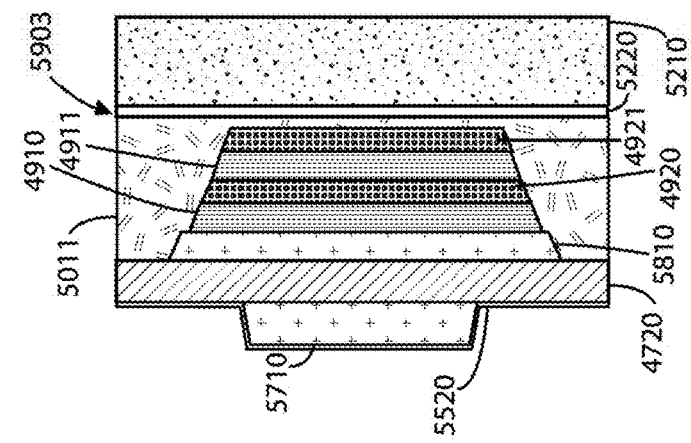
FIGS. 59A-59C are simplified diagrams illustrating various cross-sectional views of a single crystal acoustic resonator device and of method steps for a solidly mounted transfer process for single crystal acoustic resonator devices according to an example of the present invention.
Figure 59A:
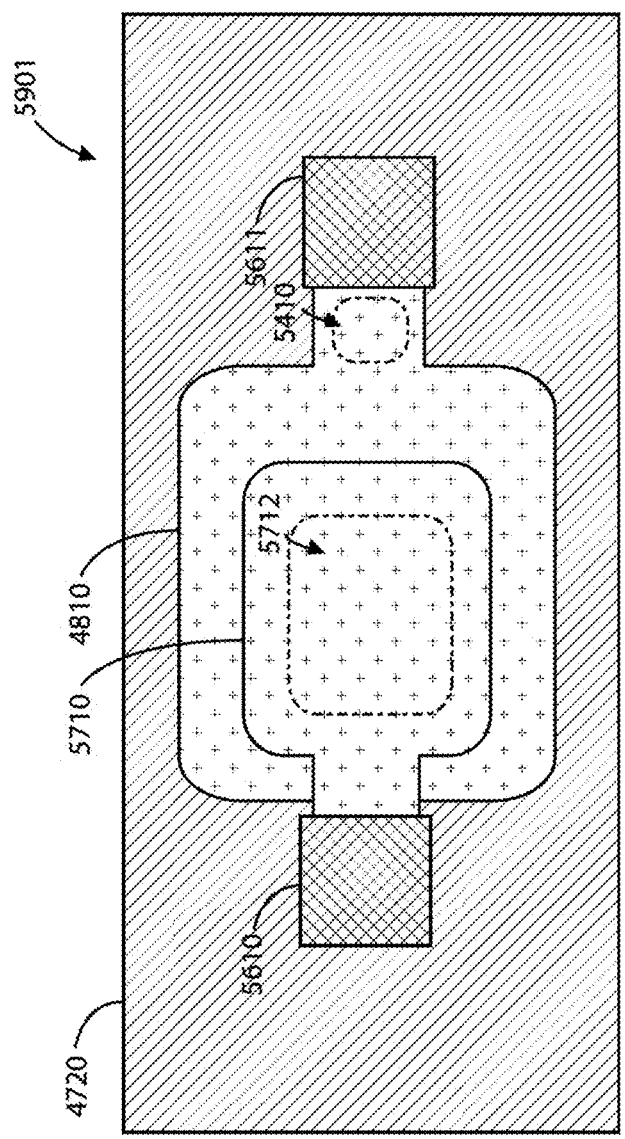
Figure 59B:
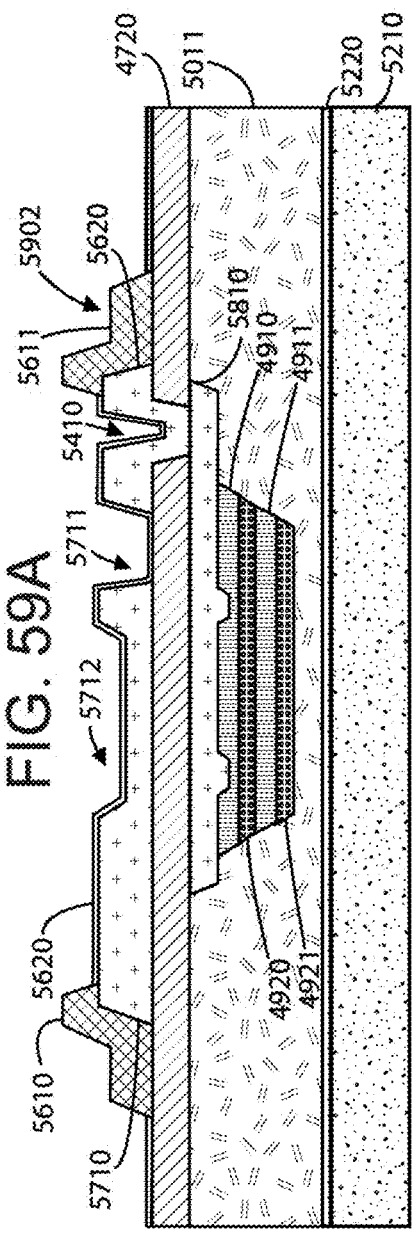

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810, to form a processed first electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during the growth substrate removal process. Of course, there can be other variations, modifications, and alternatives.

In an example, the present invention provides a high-performance, ultra-small pass-band Bulk Acoustic Wave (BAW) Radio Frequency (RF) Filter for use in 5.2 GHz Wi-Fi applications covering U-NII-1 plus U-NII-2A bands.

Figure 60:
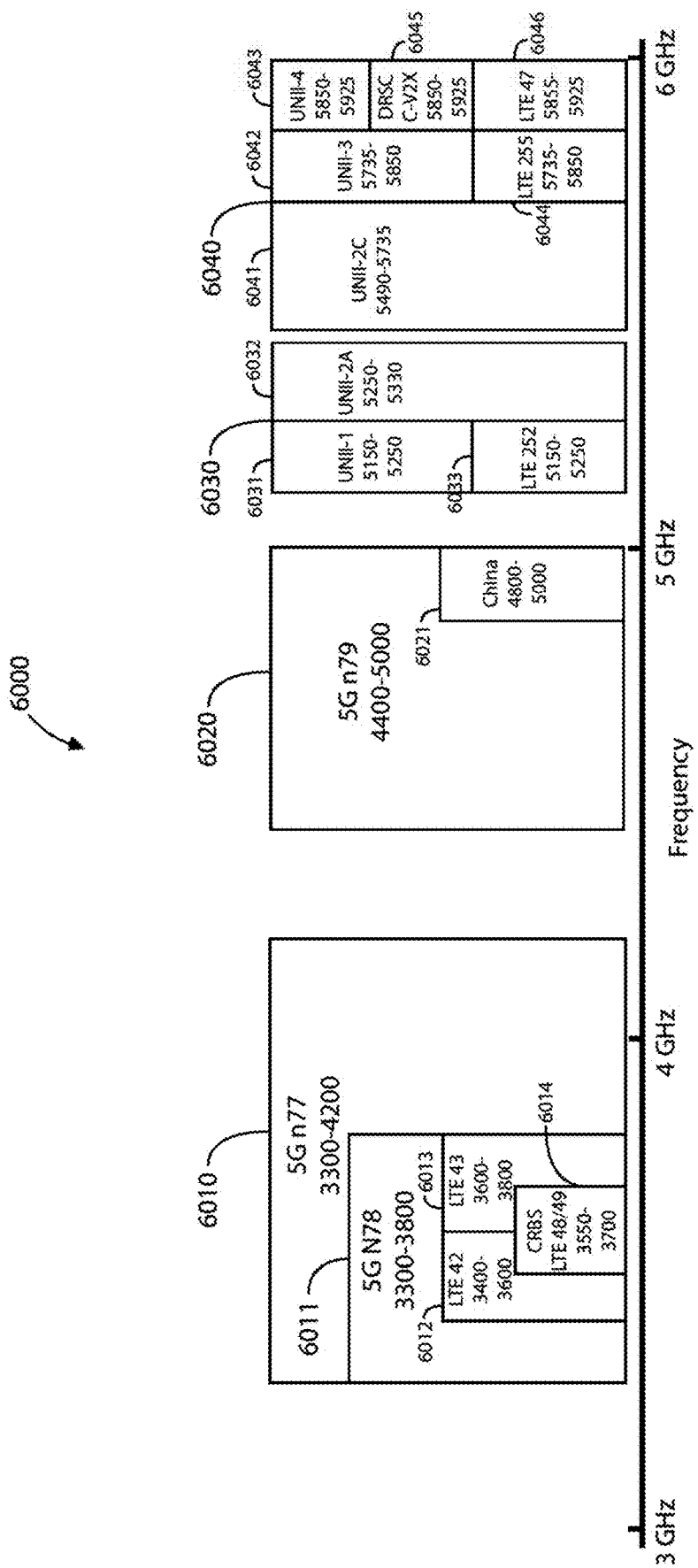
FIG. 60 is a simplified diagram illustrating filter passband requirements in a radio frequency spectrum according to an example of the present invention.

FIG. 60 is a simplified diagram illustrating filter passband requirements in a radio frequency spectrum according to an example of the present invention. As shown, the frequency spectrum 6000 shows a range from 3.0 GHz to 6.0 GHz. Here, a first application band 6010 (3.3 GHz 4.2 GHz) is configured for 5G applications. This band includes a 5G sub-band 6011 (3.3 GHz 3.8 GHz), which includes further LTE sub-bands 6012 (3.4 GHz-3.6 GHz), 6013 (3.6 GHz-3.8 GHz), and 6014 (3.55 GHz-3.7 GHz). A second application band 6020 (4.4 GHz-5.0 GHz) includes a sub-band 6021 for China specific applications. A third application band 6030 includes a UNII-1 band 6031 (5.15 GHz-5.25 GHz) and a UNII-2A band 6032 (5.25 GHz-5.33 GHz). An LTE band 6033 overlaps the same frequency range as the UNII-1 band 6031. Finally, a fourth application band 6040 includes a UNII-2C band 6041 (5.490 GHz-5.735 GHz), a UNII-3 band 6042 (5.735 GHz-5.85 GHz), and a UNII-4 band 6043 (5.85 GHz-5.925 GHz). An LTE band 6044 shares the same frequency range as the UNII-2C band 6041, while a sub-band 6045 for DRSC C-V2X (i.e., the C-V2X channel plan) overlaps the same frequency range as the UNII-4 band 6043 and an LTE band 6046 overlaps a smaller subsection of the same frequency range (5.855 GHz-5.925 GHz). Those of ordinary skill in the art will recognize other variations, modifications, and alternatives.

In an embodiment, the present filter utilizes single crystal BAW technology as described in the previous figures. This filter provides low insertion loss and meets the stringent rejection requirements enabling coexistence with U-NII-2C and U-NII-3 bands. The high-power rating satisfies the demanding power requirements of the latest Wi-Fi standards.

Figure 61:
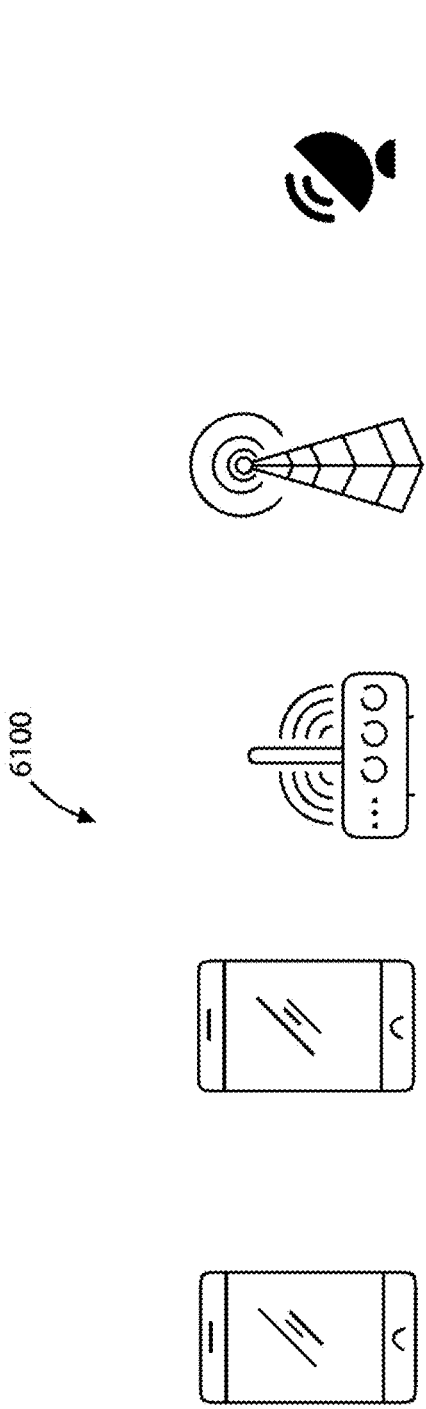
FIG. 61 is a simplified diagram illustrating an overview of key markets that are applications for acoustic wave RF filters according to an example of the present invention.

FIG. 61 is a simplified diagram illustrating an overview of key markets that are applications for acoustic wave RF filters according to an example of the present invention. The application chart 6100 for 5.2 GHz BAW RF filters shows mobile devices, smartphones, automobiles, Wi-Fi tri-band routers, tri-band mobile devices, tri-band smartphones, integrated cable modems, Wi-Fi tri-band access points, LTE/LAA small cells, and the like. A schematic representation of the frequency spectrum used in a tri-band Wi-Fi system is provided in FIG. 62.

Figure 62:
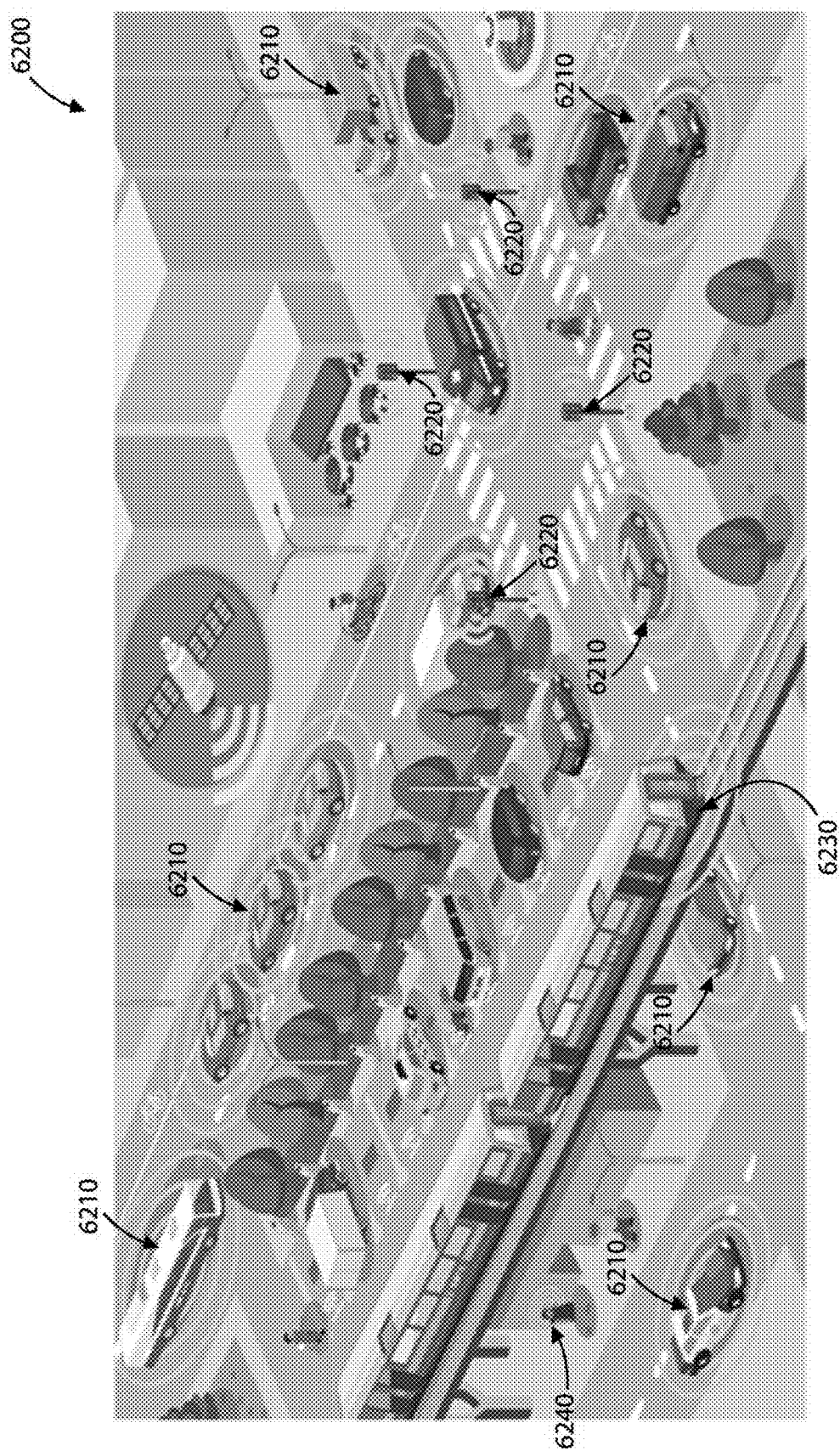
FIG. 62 is a simplified diagram illustrating an environment concept for applications of 5.9 GHz RF filters according to an example of the present invention.

FIG. 62 is a simplified diagram illustrating an environment concept diagram of applications for 5.9 GHz RF filters according to an example of the present invention. The application for 5.9 GHz BAW RF filters includes automobiles, automotive Wi-Fi, Artificial Intelligence (AI), autonomous vehicles, sensors, proximity sensing, object sensing, traffic sensing, Wi-Fi routers, mobile devices, smartphones, integrated cable modems, Wi-Fi access points, and LTE/LAA small cells. As shown, diagram 6200 shows automobiles 6210, traffic lights 6220, a train 6230, and mobile devices 6240, all of which are enabled to communicate via 5.9 GHz RF filters in Tri-Band Wi-Fi radios. Those of ordinary skill in the art will recognize other variations, modifications, and alternatives.

The present invention includes resonator and RF filter devices using both textured polycrystalline piezoelectric materials (deposited using PVD methods) and single crystal piezoelectric materials (grown using CVD technique upon a seed substrate). Various substrates can be used for fabricating the acoustic devices, such silicon substrates of various crystallographic orientations and the like. Additionally, the present method can use sapphire substrates, silicon carbide substrates, gallium nitride (GaN) bulk substrates, or aluminum nitride (AlN) bulk substrates. The present method can also use GaN templates, AlN templates, and AlxGa1-xN templates (where x varies between 0.0 and 1.0). These substrates and templates can have polar, non-polar, or semi-polar crystallographic orientations. Further the piezoelectric materials deposited on the substrate can include allows selected from at least one of the following: AlN, AlN, GaN, InN, InGaN, AlInN, AlInGaN, ScAlN, ScAlGaN, ScGaN, ScN, BAlN, BAlScN, and BN.

The resonator and filter devices may employ process technologies including but not limited to Solidly-Mounted Resonator (SMR), Film Bulk Acoustic Resonator (FBAR), or Single Crystal Bulk Acoustic Resonator (XBAW). Representative cross-sections are shown below in FIGS. 63A-63C. For clarification, the terms "top" and "bottom" used in the present specification are not generally terms in reference of a direction of gravity. Rather, the terms "top" and "bottom" are used in reference to each other in the context of the present device and related circuits. Those of ordinary skill in the art will recognize other variations, modifications, and alternatives.

In an example, the piezoelectric layer ranges between 0.1 and 2.0 um and is optimized to produced optimal combination of resistive and acoustic losses. The thickness of the top and bottom electrodes range between 250 Å and 2500 Å and the metal consists of a refractory metal with high acoustic velocity and low resistivity. The resonators are "passivated" with a dielectric (not shown in FIGS. 63A-63C) consisting of a nitride and or an oxide and whose range is between 100

Å and 2000 Å. The dielectric layer is used to adjust resonator resonance frequency. Extra care is taken to reduce the metal resistivity between adjacent resonators on a metal layer called the interconnect metal. The thickness of the interconnect metal ranges between 500 Å and 5 um. The resonators contain at least one air cavity interface in the case of SMRs and two air cavity interfaces in the case of FBARs and XBAWs. The shape of the resonators selected come from assymetrical shapes including ellipses, rectanges, and polygons. Further, the resonators contain reflecting features near the resonator edge on one or both sides of the resonator.

Figure 63A:
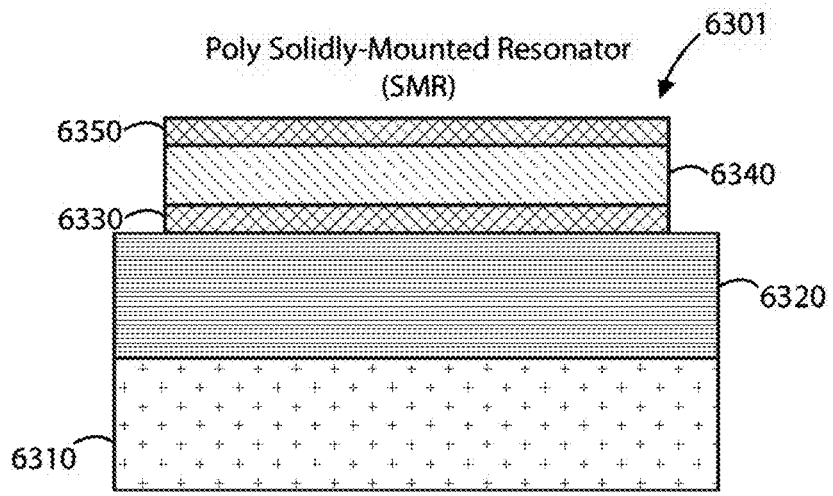
FIGS. 63A-63C are simplified diagrams illustrating cross-sectional views of resonator devices according to various examples of the present invention.
Figure 63B:
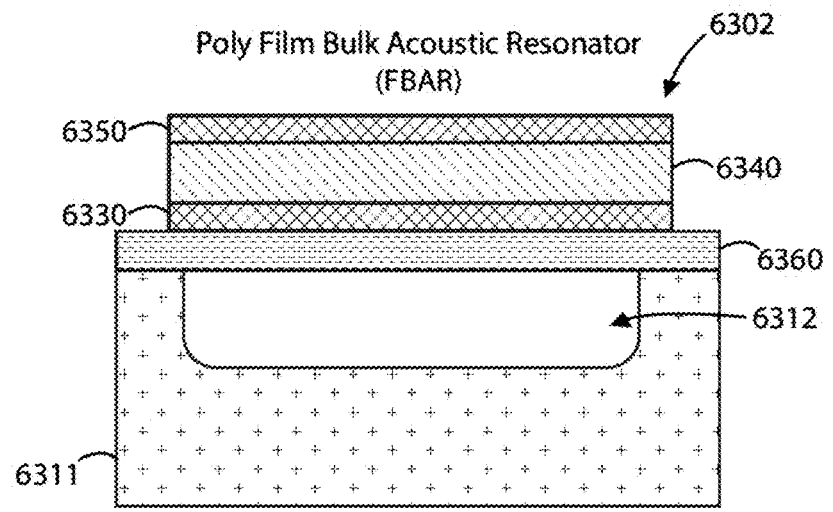
Figure 63C:
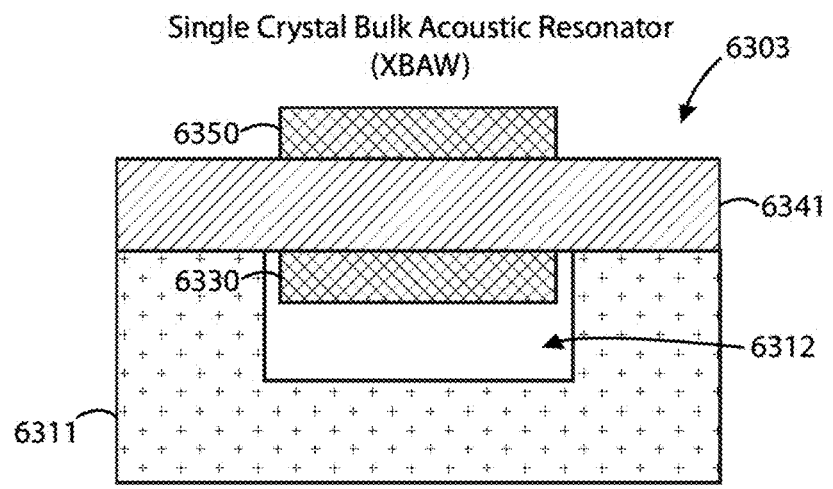

FIGS. 63A-63C are simplified diagrams illustrating cross-sectional views of resonator devices according to various examples of the present invention. More particularly, device 6301 of FIG. 63A shows a BAW resonator device including an SMR, FIG. 63B shows a BAW resonator device including an FBAR, and FIG. 63C shows a BAW resonator device with a single crystal XBAW. As shown in SMR device 6301, a reflector device 6320 is configured overlying a substrate member 6310. The reflector device 6320 can be a Bragg reflector or the like. A bottom electrode 6330 is configured overlying the reflector device 6320. A polycrystalline piezoelectric layer 6340 is configured overlying the bottom electrode 6330. Further, a top electrode 6350 is configured overlying the polycrystalline layer 6340. As shown in the FBAR device 6302, the layered structure including the bottom electrode 6330, the polycrystalline layer 6340, and the top electrode 6350 remains the same. The substrate member 6311 includes an air cavity 6312, and a dielectric layer is formed overlying the substrate member 6311 and covering the air cavity 6312. As shown in XBAW device 6303, the substrate member 6311 also contains an air cavity 6312, but the bottom electrode 6330 is formed within a region of the air cavity 6312. A single crystal piezoelectric layer is formed overlying the substrate member 6311, the air cavity 6312, and the bottom electrode 6341. Further, a top electrode 6350 is formed overlying a portion of the single crystal layer 6341. These resonators can be scaled and configured into circuit configurations shown in FIGS. 64A-64C.

Figure 64A:
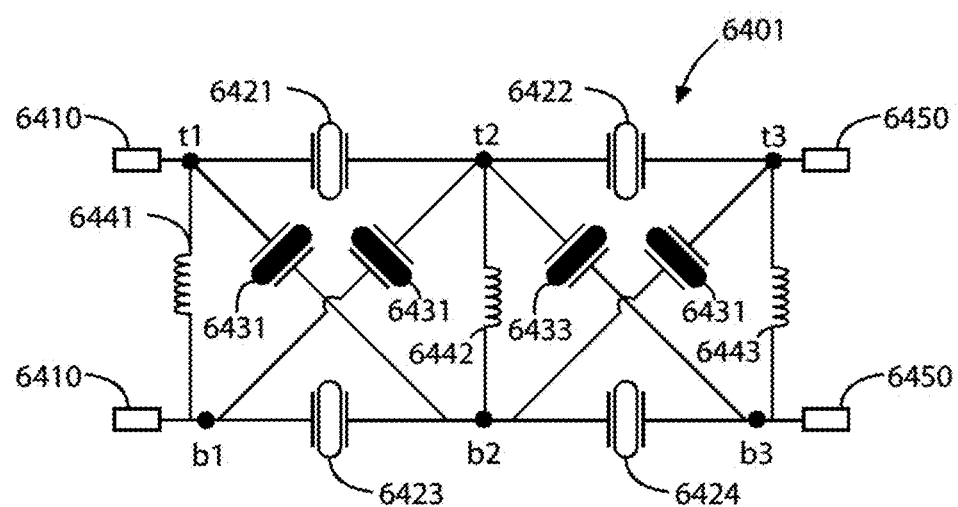
FIGS. 64A-64C are simplified circuit diagrams illustrating representative lattice and ladder configurations for acoustic filter designs according to examples of the present invention.
Figure 64B:
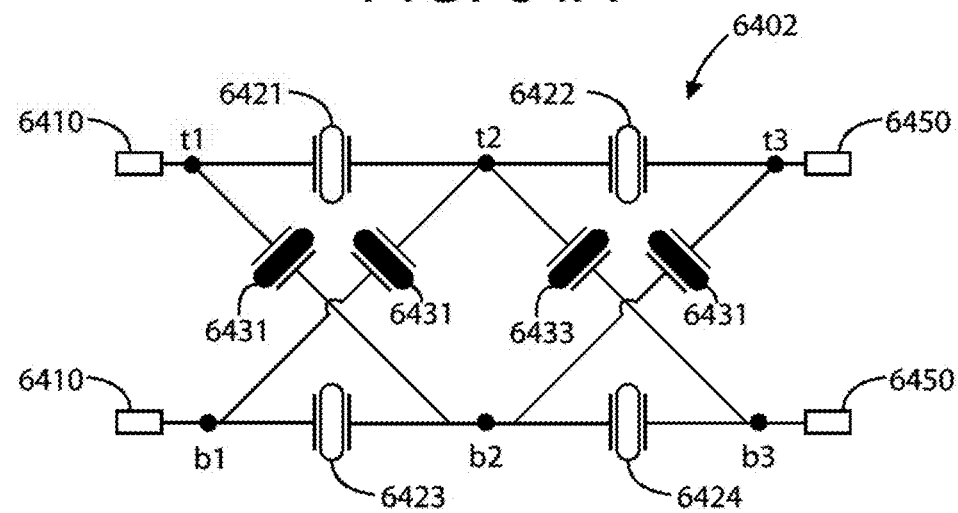
Figure 64C:
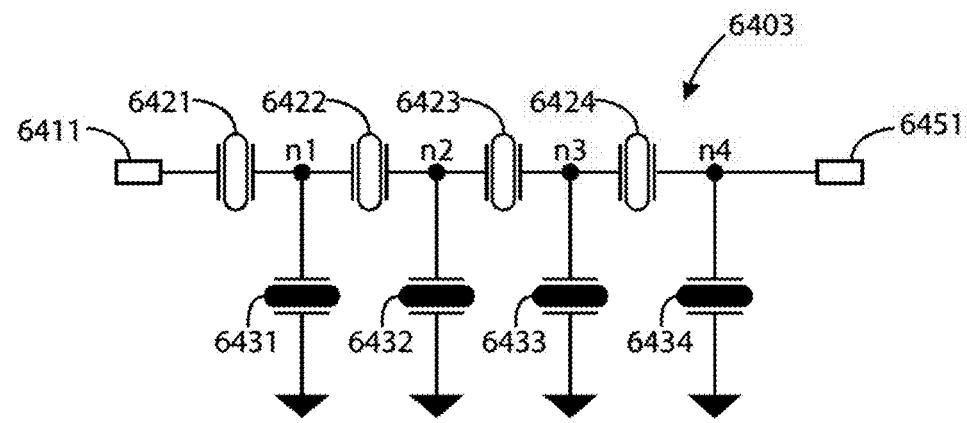

The RF filter circuit can comprise various circuit topologies, including modified lattice ("I") 6401, lattice ("II") 6402, and ladder ("III") 6403 circuit configurations, as shown in FIGS. 64A, 64B, and 64C, respectively. These figures are representative lattice and ladder diagrams for acoustic filter designs including resonators and other passive components. The lattice and modified lattice configurations include differential input ports 6410 and differential output ports 6450, while the ladder configuration includes a single-ended input port 6411 and a single-ended output port 6450. In the lattice configurations, nodes are denoted by top nodes (t1-t3) and bottom nodes (b1-b3), while in the ladder configuration the nodes are denoted as one set of nodes (n1-n4). The series resonator elements (in cases I, II, and III) are shown with white center elements 6421-6424 and the shunt resonator elements have darkened center circuit elements 6431-6434. The series elements resonance frequency is higher than the shunt elements resonance frequency in order to form the filter skirt at the pass-band frequency. The inductors 6441-6443 shown in the modified lattice circuit diagram (FIG. 64A) and any other matching elements can be included either on-chip (in proximity to the resonator elements) or off-chip (nearby to the resonator chip) and can be used to adjust frequency pass-band and/or matching of impedance (to achieve the return loss specification) for the filter circuit. The filter circuit contains resonators with at least two resonance frequencies. The center of the pass-band frequency can be adjusted by a trimming step (using an ion milling technique or other like technique) and the shape the filter skirt can be adjusted by trimming individual resonator elements (to vary the resonance frequency of one or more elements) in the circuit.

In an example, the present invention provides an RF filter circuit device in a ladder configuration. The device can include an input port, a first node coupled to the input port, a first resonator coupled between the first node and the input port. A second node is coupled to the first node and a second resonator is coupled between the first node and the second node. A third node is coupled to the second node and a third resonator is coupled between the second node and the third node. A fourth node is coupled to the third node and a fourth resonator is coupled between the third node and the output port. Further, an output port is coupled to the fourth node. Those of ordinary skill in the art will recognize other variations, modifications, and alternatives.

Each of the first, second, third, and fourth resonators can include a capacitor device. Each such capacitor device can include a substrate member, which has a cavity region and an upper surface region contiguous with an opening in the first cavity region. Each capacitor device can include a bottom electrode within a portion of the cavity region and a piezoelectric material overlying the upper surface region and the bottom electrode. Also, each capacitor device can include a top electrode overlying the single crystal material and the bottom electrode, as well as an insulating material overlying the top electrode and configured with a thickness to tune the resonator.

The device also includes a serial configuration includes the input port, the first node, the first resonator, the second node, the second resonator, the third node, the third resonator, the fourth resonator, the fourth node, and the output port. A separate shunt configuration resonator is coupled to each of the first, second, third, fourth nodes. A parallel configuration includes the first, second, third, and fourth shunt configuration resonators. Further, a circuit response can be configured between the input port and the output port and configured from the serial configuration and the parallel configuration to achieve a transmission loss from a pass-band having a characteristic frequency centered around 5.8875 GHz and having a bandwidth from 5.85 GHz to 5.925 GHz such that the characteristic frequency centered around 5.8875 GHz is tuned from a lower frequency ranging from about 5 GHz to 5.7 GHz.

In a specific example, the first, second, third, and fourth piezoelectric materials are each essentially a single crystal aluminum nitride bearing material or aluminum scandium nitride bearing material, a single crystal gallium nitride bearing material or gallium aluminum bearing material, or the like. In another specific embodiment, these piezoelectric materials each comprise a polycrystalline aluminum nitride bearing material or aluminum scandium bearing material, or a polycrystalline gallium nitride bearing material or gallium aluminum bearing material, or the like.

In a specific example, the serial configuration forms a resonance profile and an anti-resonance profile. The parallel configuration also forms a resonance profile and an anti-resonance profile. These profiles are such that the resonance profile from the serial configuration is off-set with the anti-resonance profile of the parallel configuration to form the pass-band.

In a specific example, the pass-band is characterized by a band edge on each side of the pass-band and having an amplitude difference ranging from 10 dB to 60 dB. The pass-band has a pair of band edges; each of which has a transition region from the pass-band to a stop band such that the transition region is no greater than 250 MHz. In another example, pass-band can include a pair of band edges and each of these band edges can have a transition region from the pass-band to a stop band such that the transition region ranges from 5 MHz to 250 MHz.

In a specific example, each of the first, second, third, and fourth insulating materials comprises a silicon nitride bearing material or an oxide bearing material configured with a silicon nitride material an oxide bearing material.

In a specific example, the present device can further include several features. The device can further include a rejection band at a frequency lower than the pass-band. This rejection band can range from 5.49 GHz to 5.835 GHz. The device can further include an insertion loss in the pass-band of 2.2 dB or less and an amplitude variation characterizing the pass-band of 0.7 dB. Also, the device can include an attenuation of up to 40 dB for a frequency range of 1 GHz to 5.835 GHz or an attenuation of up to 40 dB for a frequency range of 5.95 GHz to 7. The device can further include a return loss characterizing the pass-band ranging from about 10 dB to about 25 dB and the device can be operable from −40 Degrees Celsius to 85 Degrees Celsius. The device can further include a maximum power handling capability within the pass-band of 30 dBm or 1 Watt. Further, the pass-band can be configured for a U-NII-4 band and for a C-V2X channel plan in the 5.850 to 5.925 GHz band.

In a specific example, the present device can be configured as a bulk acoustic wave (BAW) filter device and can be configured for an automotive vehicle. Each of the first, second, third, and fourth resonators can be a BAW resonator. Similarly, each of the first, second, third, and fourth shunt resonators can be BAW resonators. The present device can further include one or more additional resonator devices numbered from N to M, where N is four and M is twenty. Similarly, the present device can further include one or more additional shunt resonator devices numbered from N to M, where N is four and M is twenty.

In an example, the present invention provides an RF circuit device in a lattice configuration. The device can include a differential input port, a top serial configuration, a bottom serial configuration, a first lattice configuration, a second lattice configuration, and a differential output port. The top serial configuration can include a first top node, a second top node, and a third top node. A first top resonator can be coupled between the first top node and the second top node, while a second top resonator can be coupled between the second top node and the third top node. Similarly, the bottom serial configuration can include a first bottom node, a second bottom node, and a third bottom node. A first bottom resonator can be coupled between the first bottom node and the second bottom node, while a second bottom resonator can be coupled between the second bottom node and the third bottom node.

In an example, the first lattice configuration includes a first shunt resonator cross-coupled with a second shunt resonator and coupled between the first top resonator of the top serial configuration and the first bottom resonator of the bottom serial configuration. Similarly, the second lattice configuration can include a first shunt resonator cross-coupled with a second shunt resonator and coupled between the second top resonator of the top serial configuration and the second bottom resonator of the bottom serial configuration. The top serial configuration and the bottom serial configuration can each be coupled to both the differential input port and the differential output port. Further, a circuit response between the differential input port and the differential output port and configured from the top serial configuration and the bottom serial configuration to achieve a transmission loss from a pass band having a characteristic frequency centered around 5.8875 GHz and having a bandwidth from 5.85 GHz to 5.925 GHz such that the characteristic frequency centered around 5.8875 GHz is tuned from a lower frequency ranging from about 5 GHz to 5.7 GHz.

In a specific example, the device further includes a first balun coupled to the differential input port and a second balun coupled to the differential output port. The device can further include an inductor device coupled between the differential input and output ports. In a specific example, the device can further include a first inductor device coupled between the first top node of the top serial configuration and the first bottom node of the bottom serial configuration; a second inductor device coupled between the second top node of the top serial configuration and the second bottom node of the bottom serial configuration; and a third inductor device coupled between the third top node of the top serial configuration and the third bottom node of the bottom serial configuration.

Figure 65:
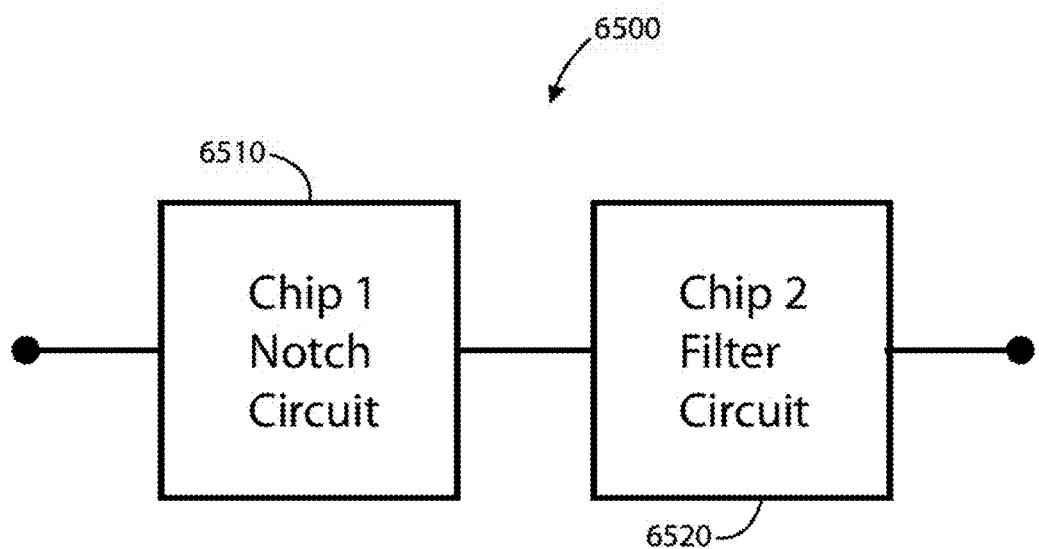
FIG. 65 is a simplified block diagram illustrating a 2-chip configuration according to an example of the present invention.

FIG. 65 is a simplified circuit block diagram illustrating a 2-chip configuration according to an example of the present invention. As shown, diagram 6500 includes a first chip 6510 and a second chip 6520. The first chip 6510 contains a notch circuit and the second chip 6520 includes a filter circuit, such as those in FIGS. 64A-64C. For a typical k-squared ($K^2$ eff) of 6.5% to 7% for AlN, a ladder configuration (1-chip) or notch plus ladder (2-chip) configuration is useful. The notch filter is a useful addition to the ladder in order to achieve appropriate attenuation at the right edge of the U-NII-3 band. The filter pass-band is 75 MHz, which equates to a small 1.7% fractional bandwidth (equal to the pass-band divided by the center frequency) and can be achieved with a smaller $K^2$ eff.

The challenge with such a high $K^2$ eff is that the resonators must either be loaded with parallel capacitance (undesirable size) or the piezoelectric material thickness must be reduced (high capacitance per unit area; manufacturing concerns due to thin piezoelectric) to achieve filter skirt performance. In the case where a notch filter (3-element pi-configuration) is used, the $K^2$ eff of the notch configuration is not sensitive to the pass-band requirement and the piezo thickness does not have to be adjusted to reduce $K^2$ eff. However, the filter pass-band skirt is determined by the ladder configured chip and hence the piezo of the ladder chip must be thinned to achieve lower $K^2$ eff for the small fractional bandwidth filter. In summary, for high $K^2$ eff piezo materials, either a 1-chip ladder can be deployed with a thin piezoelectric or a 2-chip ladder plus notch design can be deployed with one thick and one thin piezo material stack, as shown in Table 1 below.

TABLE 1

Material thicknesses for a 2-chip configuration with an AlN narrow notch band chip.

|  | Narrow Notch Band Chip | Ladder Filter Chip |
|---|---|---|
| FM1 Thickness (A) | 1100 | 1822 |
| FM2 Thickness (A) | 1548 | 1822 |
| FM3 Thickness (A) | 1077 | 95 |
| BM Thickness | 900 | — |
| AlN (A) | 3300 | 1545 |

In another example, the present invention can use a lower e33 material, such as AlGaN, which has approximately 25% lower $K^2$ eff. Because the $K^2$ eff is more optimal for the small bandwidth, a thicker and more manufacturable piezo material can be used to achieve the desired specification. For a typical-squared ($K^2$ eff) of 4.5% to 4.8% for AlGaN, a ladder configuration (1-chip) or notch plus ladder (2-chip) configuration is still useful. By deploying AlGaN, thick piezo materials can be used for both the notch and the filter chip designs, as shown in Table 2 below.

TABLE 2

Material thicknesses for a 2-chip configuration with an AlGaN narrow notch band chip.

|  | Narrow Notch Band Chip | Ladder Filter Chip |
|---|---|---|
| FM1 Thickness (A) | 1100 | 1270 |
| FM2 Thickness (A) | 1260 | 1270 |
| FM3 Thickness (A) | 1100 | 95 |
| BM Thickness | 900 | — |
| AlGaN (A) | 3250 | 3300 |

Figure 66A:
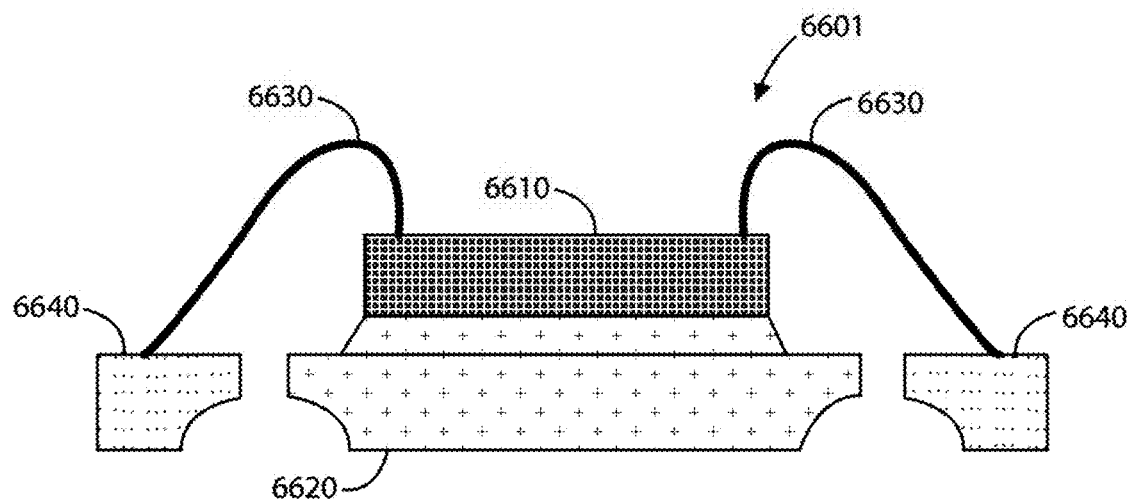
FIGS. 66A-66B are simplified diagrams illustrating packing approaches according to various examples of the present invention.
Figure 66B:
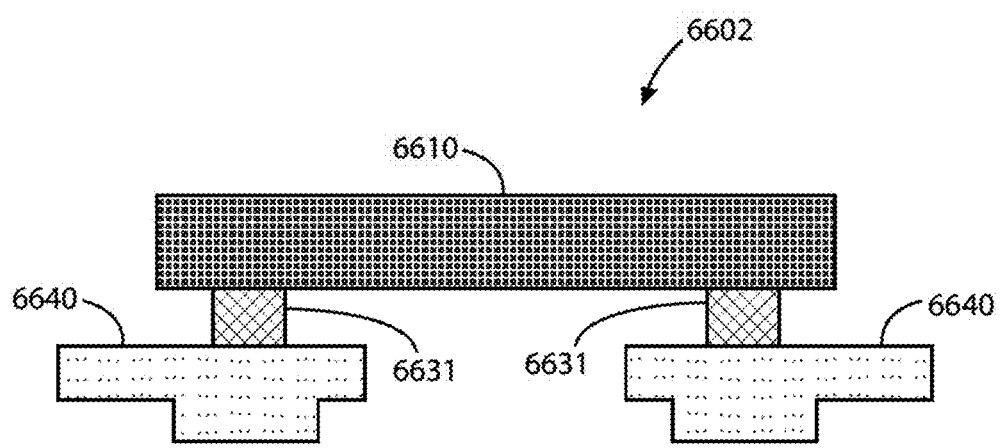
Figure 67:
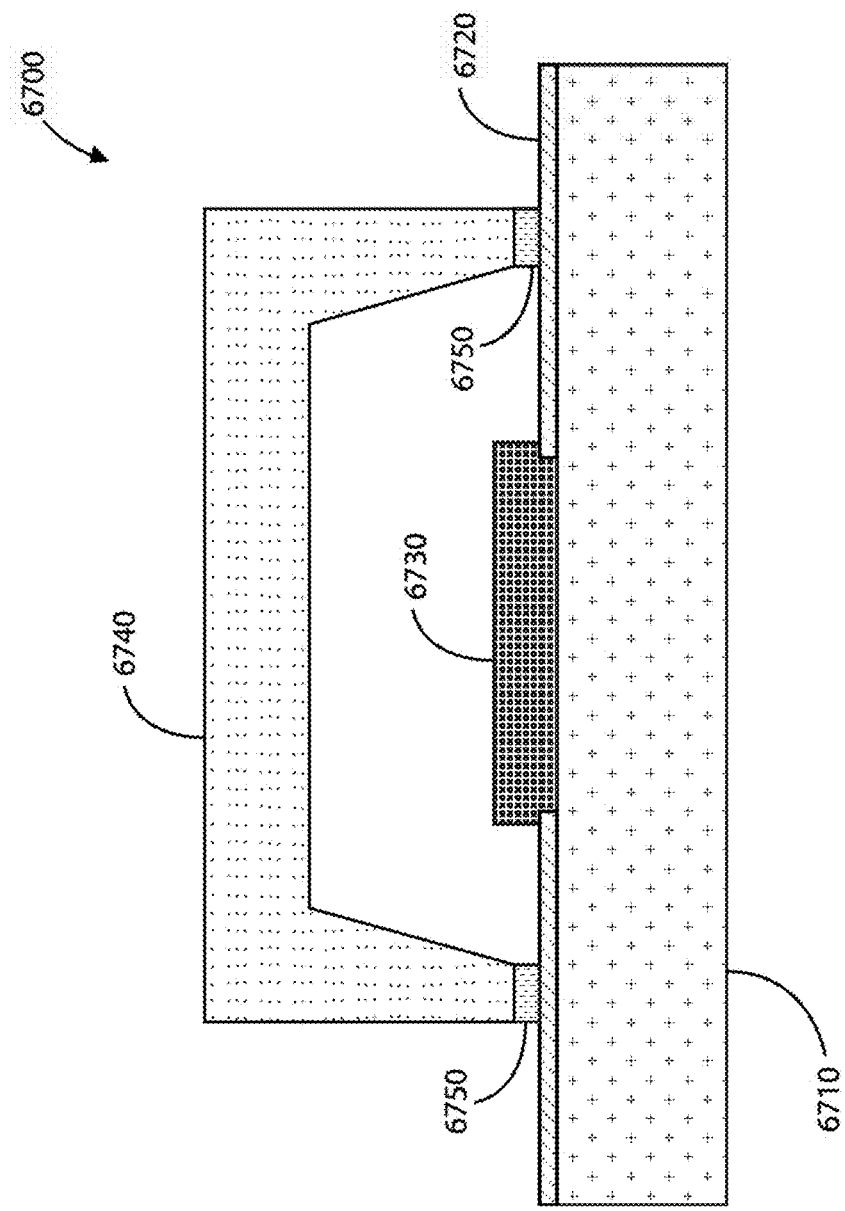
FIG. 67 is a simplified diagram illustrating a packing approach according to an example of the present invention.

The packaging approach includes but is not limited to wafer level packaging (WLP), WLP-plus-cap wafer approach, flip-chip, chip and bond wire, as shown in FIGS. 66A-66B and 67. One or more RF filter chips and one or more filter bands can be packaged within the same housing configuration. Each RF filter band within the package can include one or more resonator filter chips and passive elements (capacitors, inductors) can be used to tailor the bandwidth and frequency spectrum characteristic. For a tri-band Wi-Fi system application, a package configuration including three RF filter bands, including the 2.4 GHz, 5.2 GHz, 5.6 GHz, and 5.9 GHz band-pass solutions is capable using the BAW RF filter technology. The 2.4 GHz filter solution can be either surface acoustic wave (SAW) or BAW, whereas the 5.2 GHz, 5.6 GHz bands, and 5.9 GHz are likely BAW given the high-frequency capability of BAW.

FIG. 66A is a simplified diagram illustrating a packing approach according to an example of the present invention. As shown, device 6601 is packaged using a conventional die bond of an RF filter die 6610 to the base 6620 of a package and metal bond wires 6630 to the RF filter chip from the circuit interface 6640.

FIG. 66B is as simplified diagram illustrating a packing approach according to an example of the present invention. As shown, device 6602 is packaged using a flip-mount wafer level package (WLP) showing the RF filter silicon die 6610 mounted to the circuit interface 6640 using copper pillars 6631 or other high-conductivity interconnects.

FIG. 67 is a simplified diagram illustrating a packing approach according to an example of the present invention. Device 6700 shows an alternate version of a WLP utilizing a BAW RF filter circuit MEMS device 6730 and a substrate 6710 to a cap wafer 6740. In an example, the cap wafer 6740 may include thru-silicon-vias (TSVs) to electrically connect the RF filter MEMS device 6730 to the topside of the cap wafer (not shown in the figure). The cap wafer 6740 can be coupled to a dielectric layer 6720 overlying the substrate 6710 and sealed by sealing material 6750.

In an example, the present filter passes frequencies in the range of 5.85 to 5.925 GHz and rejects frequencies outside of this pass-band. Additional features of the 5.9 GHz acoustic wave filter circuit are provided below. The circuit symbol which is used to reference the RF filter building block is provided in FIG. 68. The electrical performance specifications of the 5.9 GHz filter are provided in FIG. 69 and the pass-band performance of the filter is provided in FIGS. 70 and 71.

In various examples, the present filter can have certain features. The die configuration can be less than 2 mm×2 mm×0.5 mm; in a specific example, the die configuration is typically less than 1 mm×1 mm×0.2 mm. The packaged device has an ultra-small form factor, such as a 2 mm×2.5 mm×0.9 mm using a conventional chip and bond wire approach, shown in FIG. 66. WLP package approaches can provide smaller form factors. In a specific example, the device is configured with a single-ended 50-Ohm antenna, and transmitter/receiver (Tx/Rx) ports. The high rejection of the device enables coexistence with adjacent Wi-Fi UNIT bands. The device is also be characterized by a high power rating (maximum +30 dBm), a low insertion loss pass-band filter with less than 3 dB transmission loss, and performance over a temperature range from −40 degrees Celsius to +85 degrees Celsius. Further, in a specific example, the device is RoHS (Restriction of Hazardous Substances) compliant and uses Pb-free (lead-free) packaging.

Figure 68:
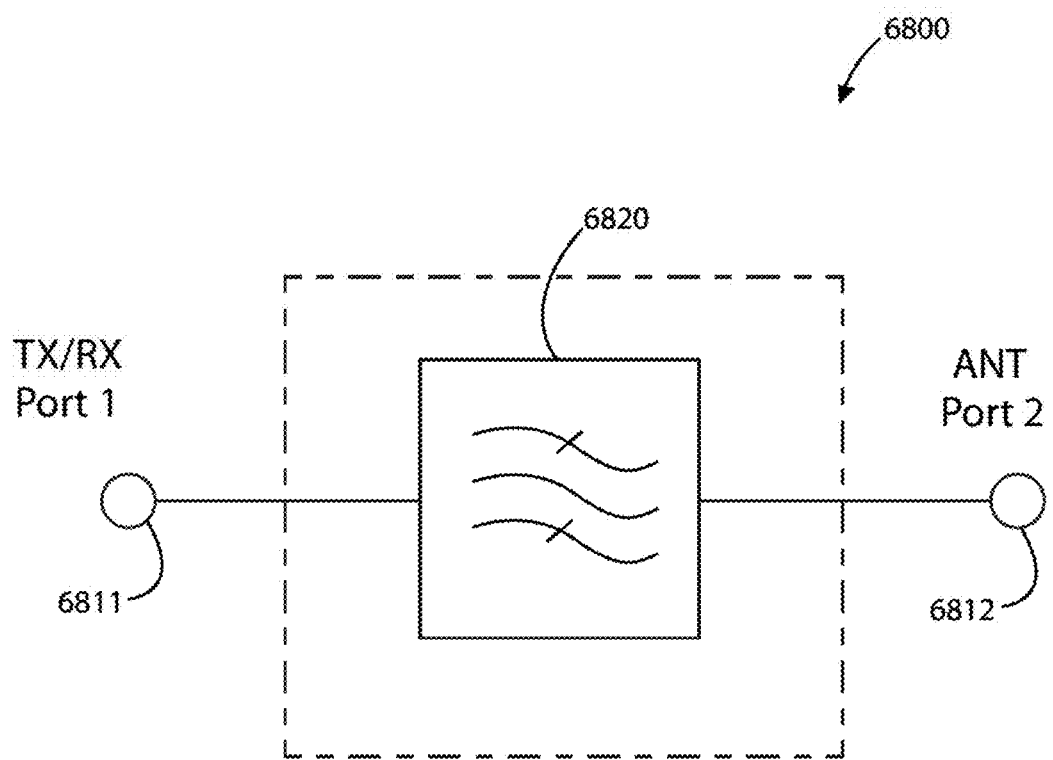
FIG. 68 is a simplified circuit diagram illustrating a 2-port BAW RF filter circuit according to an example of the present invention.

FIG. 68 is a simplified circuit diagram illustrating a 2-port BAW RF filter circuit according to an example of the present invention. As shown, circuit 6800 includes a first port ("Port 1") 6811, a second port ("Port 2") 6812, and a filter 6820. The first port represents a connection from a transmitter (TX) or received (RX) to the filter 6820 and the second port represents a filter connection from the filter 6820 to an antenna (ANT).

FIG. 69 is a simplified table of filter parameters according to an example of the present invention. As shown, table 6900 includes electrical specifications for a 5.9 GHz RF resonator filter circuit. The circuit parameters are provided along with the specification units, minimum, along with typical and maximum specification values.

Figure 70:
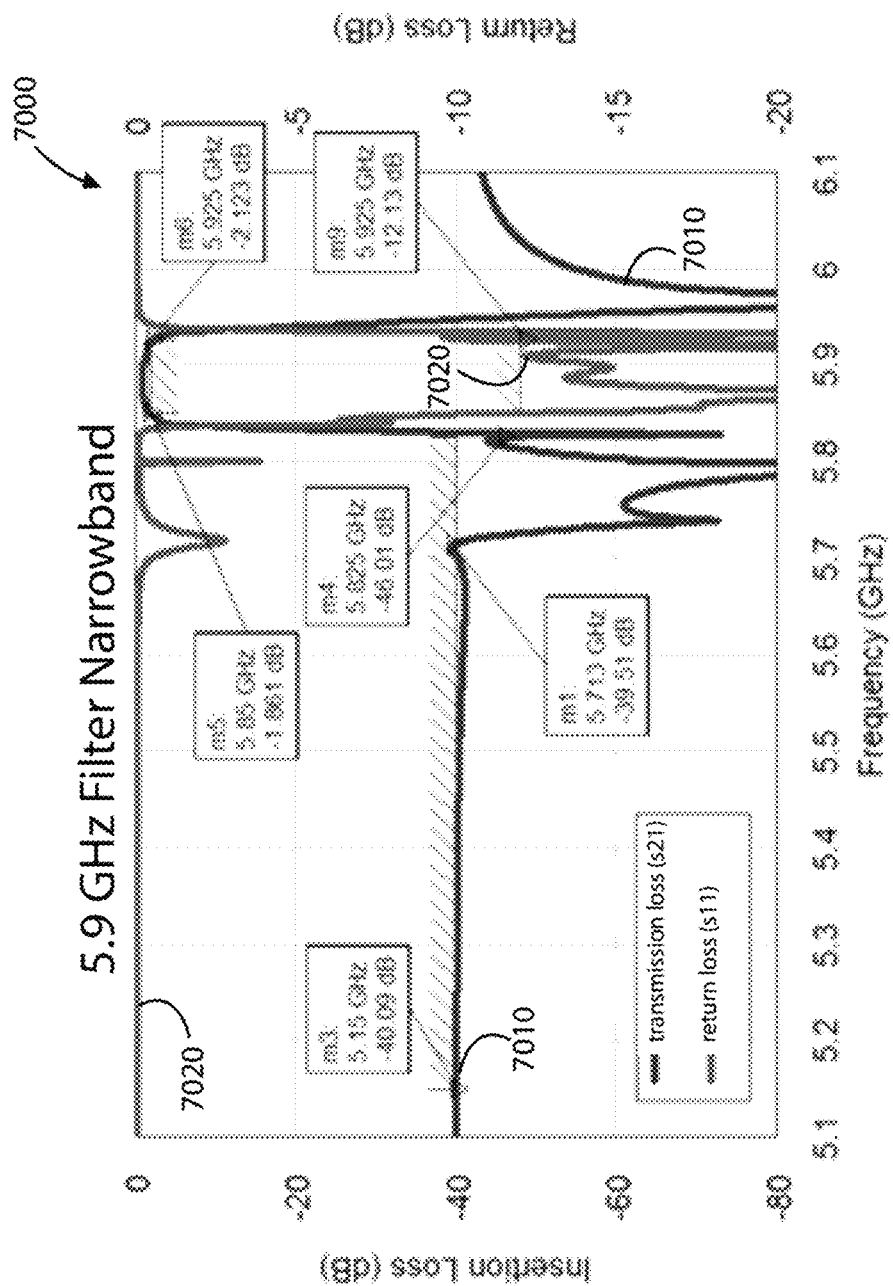
FIG. 70 is a simplified graph representing insertion loss over frequency for a 5.9 GHz filter narrowband according to an example of the present invention.

FIG. 70 is a simplified graph representing insertion loss over frequency for a 5.9 GHz filter narrowband according to an example of the present invention. As shown, graph 7000 represents a narrowband measured vs. modeled response for a 5.9 GHz RF filter using a modified lattice RF filter circuit configuration. The modeled curve 7010 is the transmission loss (s21) and the modeled curve 7020 is the return loss (s11), both of which are predicted from a linear simulation tool incorporating experimental resonator data from the XB1 process.

Figure 71:
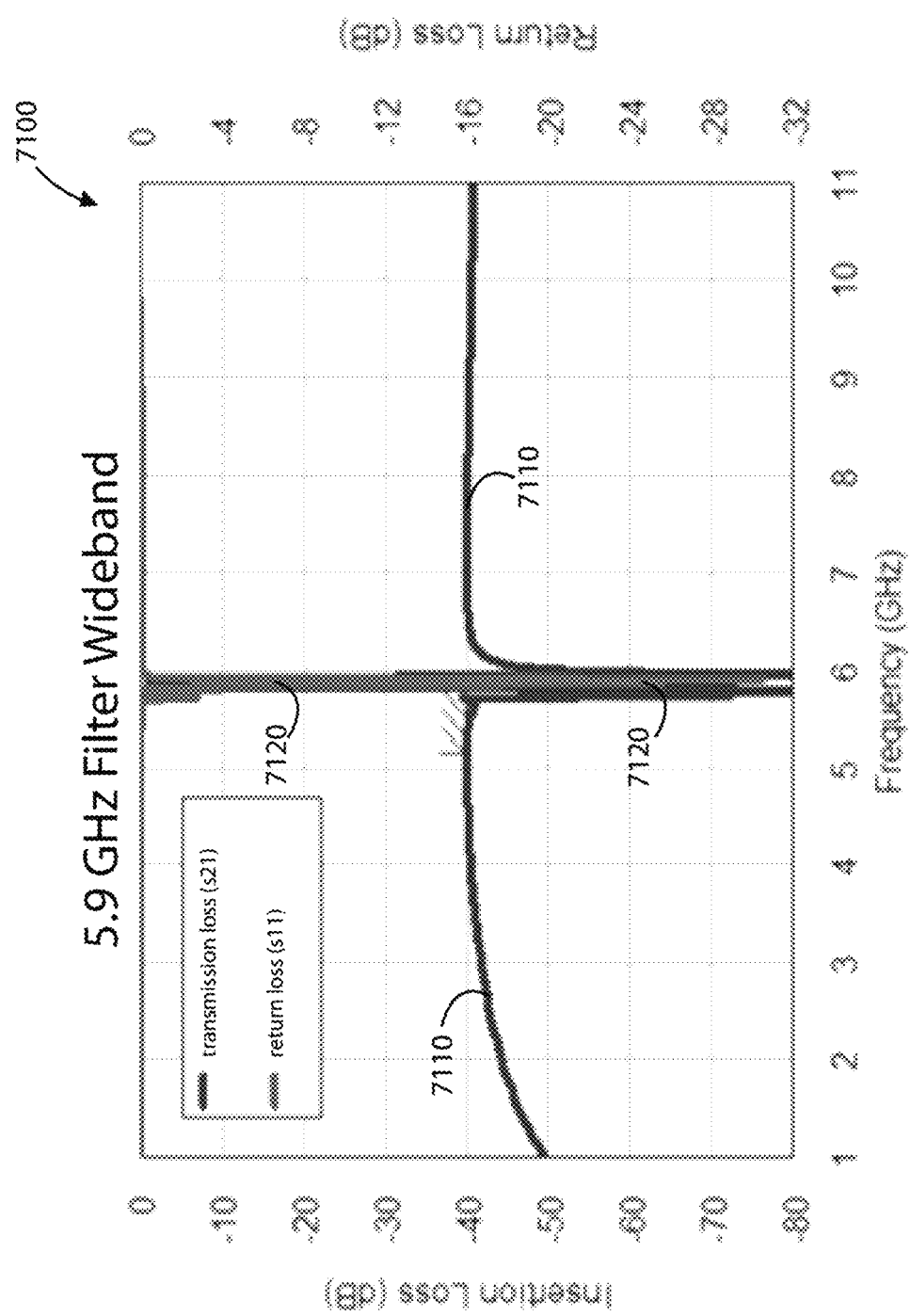
FIG. 71 is a simplified graph representing insertion loss over frequency for a 5.9 GHz filter wideband according to an example of the present invention.

FIG. 71 is a simplified graph representing insertion loss over frequency for a 5.9 GHz filter wideband according to an example of the present invention. As shown, graph 7100 represents a wideband modeled response for a 5.9 GHz RF filter using a modified lattice RF filter circuit configuration. The modeled curve 7110 is the transmission loss (s21) and the modeled curve 7120 is the return loss (s11), both predicted from a linear simulation tool incorporating experimental resonator data from the XB1 process.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. An RF filter circuit device, the device comprising:
an input port;
a first node coupled to the input port;
a first resonator coupled between the first node and the input port, the first resonator comprising
a first capacitor device, the first capacitor device comprising a first substrate member, the first substrate member having a first cavity region and a first upper surface region contiguous with a first opening of the first cavity region,
a first bottom electrode within a portion of the first cavity region,
a first piezoelectric material overlying the first upper surface region and the first bottom electrode, the first piezoelectric material having a first electrode contact via,
a first top electrode overlying the first piezoelectric material and overlying the first bottom electrode,
a first top metal formed overlying the first piezoelectric material, the first top metal being physically coupled to the first bottom electrode through the first electrode contact via, and
a first insulating material overlying the first top electrode and configured with a first thickness to tune the first resonator;
a second node coupled to the first node;
a second resonator coupled between the first node and the second node, the second resonator comprising
a second capacitor device, the second capacitor device comprising a second substrate member, the second substrate member having a second cavity region and a second upper surface region contiguous with a second opening of the second cavity region,
a second bottom electrode within a portion of the second cavity region,
a second piezoelectric material overlying the second upper surface region and the second bottom electrode, the second piezoelectric material having a second electrode contact via,
a second top electrode overlying the second piezoelectric material and overlying the second bottom electrode,
a second top metal formed overlying the second piezoelectric material, the second top metal being physically coupled to the second bottom electrode through the second electrode contact via, and
a second insulating material overlying the second top electrode and configured with a second thickness to tune the second resonator;
a third node coupled to the second node;
a third resonator coupled between the second node and the third node, the third resonator comprising a third capacitor device, the third capacitor device comprising
a third substrate member, the third substrate member having a third cavity region and a third upper surface region contiguous with a third opening of the third cavity region,
a third bottom electrode within a portion of the third cavity region,
a third piezoelectric material overlying the third upper surface region and the third bottom electrode, the third piezoelectric material having a third electrode contact via,
a third top electrode overlying the third piezoelectric material and overlying the third bottom electrode,
a third top metal formed overlying the third piezoelectric material, the third top metal being physically coupled to the third bottom electrode through the third electrode contact via, and
a third insulating material overlying the third top electrode and configured with a third thickness to tune the third resonator;
a fourth node coupled to the third node;
a fourth resonator coupled between the third node and the fourth node, the fourth resonator comprising a fourth capacitor device, the fourth capacitor device comprising
a fourth substrate member, the fourth substrate member having a fourth cavity region and a fourth upper surface region contiguous with a fourth opening of the fourth cavity region,
a fourth bottom electrode within a portion of the fourth cavity region,
a fourth piezoelectric material overlying the fourth upper surface region and the fourth bottom electrode, the fourth piezoelectric material having a fourth electrode contact via,
a fourth top electrode overlying the fourth single crystal material and overlying the fourth bottom electrode,
a fourth top metal formed overlying the fourth piezoelectric material, the fourth top metal being physically coupled to the fourth bottom electrode through the fourth electrode contact via, and
a fourth insulating material overlying the fourth top electrode and configured with a fourth thickness to tune the fourth resonator;
an output port coupled to the fourth node;
a serial configuration comprising the input port, the first node, the first resonator, the second node, the second resonator, the third node, the third resonator, the fourth resonator, the fourth node, and the output port;
a first shunt configuration resonator coupled to the first node;
a second shunt configuration resonator coupled to the second node;
a third shunt configuration resonator coupled to the third node; and
a fourth shunt configuration resonator coupled to the fourth node;
a parallel configuration comprising the first shunt configuration resonator, the second shunt configuration resonator, the third shunt configuration resonator, and the fourth shunt configuration resonator; and
a circuit response between the input port and the output port and configured from the serial configuration and the parallel configuration to achieve a transmission loss from a pass band having a characteristic frequency centered around 5.8875 GHz and having a bandwidth from 5.85 GHz to 5.925 GHz such that the characteristic frequency centered around 5.8875 GHz is tuned from a lower frequency ranging from about 5 GHz to 5.7 GHz.

2. The device of claim 1 wherein the first piezoelectric material, the second piezoelectric material, the third piezoelectric material, and the fourth piezoelectric material each comprise a single crystal aluminum nitride bearing material or a single crystal aluminum scandium nitride bearing material.

3. The device of claim 1 wherein the first piezoelectric material, the second piezoelectric material, the third piezoelectric material, and the fourth piezoelectric material each comprise a polycrystalline aluminum nitride bearing material or a polycrystalline aluminum scandium nitride bearing material.

4. The device of claim 1 wherein the first piezoelectric material, the second piezoelectric material, the third piezoelectric material, and the fourth piezoelectric material each comprise a single crystal gallium nitride bearing material or a single crystal gallium aluminum bearing material.

5. The device of claim 1 wherein the first piezoelectric material, the second piezoelectric material, the third piezoelectric material, and the fourth piezoelectric material each comprise a polycrystalline gallium nitride bearing material or a polycrystalline gallium aluminum bearing material.

6. The device of claim 1 wherein the serial configuration forms a resonance profile and an anti-resonance profile; and the parallel configuration forms a resonance profile and an anti-resonance profile such that the resonance profile from the serial configuration is off-set with the anti-resonance profile of the parallel configuration to form the pass-band.

7. The device of claim 1 wherein the pass band is characterized by a band edge on each side of the pass-band having an amplitude difference ranging from 10 dB to 60 dB.

8. The device of claim 1 wherein each of the first insulating material, the second insulating material, the third insulating material, and the fourth insulating material comprises a silicon nitride bearing material or an oxide bearing material.

9. The device of claim 1 wherein the pass-band has a pair of band edges, each of the band edges having a transition region from the pass-band to a stop band such that the transition region is no greater than 250 MHz.

10. The device of claim 1 wherein the pass-band has a pair of band edges, each of the band edges having a transition region from the pass band to a stop band such that the transition region ranges from 5 MHz to 250 MHz.

11. The device of claim 1 further comprising a rejection band at a frequency lower than the pass-band, the rejection band ranging from 5.49 GHz to 5.835 GHz.

12. The device of claim 1 further comprising an insertion loss in the pass-band of 2.2 dB or less.

13. The device of claim 1 further comprising an amplitude variation characterizing the pass-band of 0.7 dB.

14. The device of claim 1 further comprising a typical attenuation of 0 dB for a frequency range of 1 GHz to 5.835 GHz.

15. The device of claim 1 further comprising a typical attenuation of 0 dB for a frequency range of 5.95 GHz to 7 GHz.

16. The device of claim 1 further comprising a return loss characterizing the pass-band ranging from about 10 dB to about 25 dB.

17. The device of claim 1 wherein the device is operable from −40 Degrees Celsius to 85 Degrees Celsius.

18. The device of claim 1 further comprising a microwave characteristic impedance of 50 Ohms.

19. The device of claim 1 further comprising a maximum power handling capability within the pass-band of 30 dBm or 1 Watt.

20. The device of claim 1 is configured for an automotive vehicle.

21. The device of claim 1 is configured as a bulk acoustic wave filter device.

22. The device of claim 1 wherein each of the first resonator, the second resonator, the third resonator, and the fourth resonator is a bulk acoustic wave resonator.

23. The device of claim 1 wherein each of the first shunt resonator, the second shunt resonator, the third shunt resonator, and the fourth shunt resonator is a bulk acoustic wave resonator.

24. The device of claim 1 further comprising one or more additional resonator devices numbered from N to M, where N is four and M is twenty.

25. The device of claim 1 further comprising one or more additional shunt resonator devices numbered from N to M, where N is four and M is twenty.

26. An RF circuit device comprising:
a differential input port;
a top serial configuration comprising a first top node, a second top node, and a third top node;
a first top resonator coupled between the first top node and the second top node;
a second top resonator coupled between the second top node and the third top node;
a bottom serial configuration comprising a first bottom node, a second bottom node, and a third bottom node;
a first bottom resonator coupled between the first bottom node and the second bottom node;
a second bottom resonator coupled between the second bottom node and the third bottom node;
a first lattice configuration comprising:
a first shunt resonator cross-coupled with a second shunt resonator and coupled between the first top resonator of the top serial configuration and the first bottom resonator of the bottom serial configuration;
a second lattice configuration comprising:
a first shunt resonator cross-coupled with a second shunt resonator and coupled between the second top resonator of the top serial configuration and the second bottom resonator of the bottom serial configuration; and
a differential output port;
a circuit response between the differential input port and the differential output port and configured from the top serial configuration and the bottom serial configuration to achieve a transmission loss from a pass band having a characteristic frequency centered around 5.8875 GHz and having a bandwidth from 5.85 GHz to 5.925 GHz such that the characteristic frequency centered around 5.8875 GHz is tuned from a lower frequency ranging from about 5 GHz to 5.7 GHz.
wherein the top serial configuration and the bottom serial configuration are each coupled to both the differential input port and the differential output port;
wherein each of the first top resonator, second top resonator, first bottom resonator, and second bottom resonator comprises
a substrate;
a support layer overlying the substrate, the support layer having an air cavity;
a first electrode overlying the air cavity and a portion of the support layer;
a first passivation layer overlying the support layer and being physically coupled to the first electrode;
a piezoelectric film overlying the support layer, the first electrode, and the air cavity, the piezoelectric film having an electrode contact via;
a second electrode formed overlying the piezoelectric film; and
a top metal formed overlying the piezoelectric film, the top metal being physically coupled to the first electrode through the electrode contact via.

27. The device of claim 26 further comprising a first balun coupled to the differential input port and a second balun coupled to the differential output port.

28. The device of claim 26 further comprising a first inductor device coupled between the first top node and the first bottom node and a second inductor device coupled between the third top node and the third bottom node.

29. The device of claim 26 further comprising a first inductor device coupled between the first top node of the top serial configuration and the first bottom node of the bottom serial configuration; a second inductor device coupled between the second top node of the top serial configuration and the second bottom node of the bottom serial configuration; and a third inductor device coupled between the third top node of the top serial configuration and the third bottom node of the bottom serial configuration.

* * * * *